US012159887B2

(12) United States Patent
Webster

(10) Patent No.: US 12,159,887 B2
(45) Date of Patent: Dec. 3, 2024

(54) BACKSIDE ILLUMINATED STRUCTURES WITH PARALLEL CHARGE TRANSFER

(71) Applicant: Quantum-Si Incorporated, Branford, CT (US)

(72) Inventor: Eric A. G. Webster, Santa Clara, CA (US)

(73) Assignee: Quantum-Si Incorporated, Branford, CT (US)

( * ) Notice: Subject to any disclaimer, the term of this patent is extended or adjusted under 35 U.S.C. 154(b) by 0 days.

(21) Appl. No.: 18/452,235

(22) Filed: Aug. 18, 2023

(65) Prior Publication Data

US 2024/0088178 A1 Mar. 14, 2024

Related U.S. Application Data

(60) Provisional application No. 63/399,503, filed on Aug. 19, 2022.

(51) Int. Cl.
*H01L 27/146* (2006.01)
*G01N 21/64* (2006.01)

(52) U.S. Cl.
CPC ... *H01L 27/14612* (2013.01); *G01N 21/6486* (2013.01)

(58) Field of Classification Search
CPC ............. H01L 27/146; H01L 27/14601; H01L 27/14603; H01L 27/14605;
(Continued)

(56) References Cited

U.S. PATENT DOCUMENTS 5,961,924 A 10/1999 Reichert et al.
6,787,308 B2 9/2004 Balasubramanian et al.
(Continued)

FOREIGN PATENT DOCUMENTS

WO WO 2011/153962 A1 12/2011

OTHER PUBLICATIONS

Invitation to Pay Additional Fees for International Application No. PCT/US2023/030586 mailed Nov. 13, 2023.
(Continued)

*Primary Examiner* — John R Lee
(74) *Attorney, Agent, or Firm* — Wolf, Greenfield & Sacks, P.C.

(57) ABSTRACT

In some embodiments, an integrated circuit includes multiple charge storage regions configured to receive charge carriers from a photodetection region in response to a single excitation of a sample. In some embodiments, an integrated circuit includes first and second charge transfer paths configured to electrically couple a photodetection region to first and second charge storage regions, with the second charge transfer path bypassing the first charge storage region. In some embodiments, an integrated circuit includes a photodetection region configured to induce an intrinsic electric field having a vector component in at least three substantially perpendicular directions. In some embodiments, an integrated circuit includes multiple transfer gates configured to control charge carrier transfer out of a photodetection region in different directions. In some embodiments, an integrated circuit includes a photodetection region and multiple transfer gates configured to control charge carrier transfer from the photodetection region to one or more drain regions.

20 Claims, 39 Drawing Sheets

(58) Field of Classification Search
CPC ......... H01L 27/14607; H01L 27/14609; H01L 27/1461; H01L 27/14612; H01L 27/14614; H01L 27/14616; H01L 29/76; H01L 29/762; H01L 29/765; H04N 25/47; H04N 25/50; H04N 25/70; H04N 25/713; G01J 1/44; G01J 2001/4473; G01N 21/64; G01N 21/6486; G06T 7/00
See application file for complete search history.

(56) References Cited

U.S. PATENT DOCUMENTS 6,917,726 B2 7/2005 Levene et al.
7,175,811 B2 2/2007 Bach et al.
7,426,322 B2 9/2008 Hyde
7,738,086 B2 6/2010 Shepard et al.
7,820,983 B2 10/2010 Lundquist et al.
7,834,329 B2 11/2010 Lundquist et al.
7,838,847 B2 11/2010 Lundquist et al.
8,053,742 B2 11/2011 Lundquist et al.
8,207,509 B2 6/2012 Lundquist et al.
8,274,040 B2 9/2012 Zhong et al.
8,278,728 B2 10/2012 Murshid
8,465,699 B2 6/2013 Fehr et al.
8,471,219 B2 6/2013 Lundquist et al.
8,471,230 B2 6/2013 Zhong et al.
8,502,169 B2 8/2013 Rigneault et al.
8,618,507 B1 12/2013 Lundquist et al.
9,029,802 B2 5/2015 Lundquist et al.
9,157,864 B2 10/2015 Fehr et al.
9,222,123 B2 12/2015 Zhong et al.
9,222,133 B2 12/2015 Lundquist et al.
9,223,084 B2 12/2015 Grot et al.
9,372,308 B1 6/2016 Saxena et al.
9,587,276 B2 3/2017 Lundquist et al.
9,606,060 B2 3/2017 Chen et al.
9,658,161 B2 5/2017 Saxena et al.
9,666,748 B2 5/2017 Leobandung
9,719,138 B2 8/2017 Zhong et al.
9,765,395 B2 9/2017 Goldsmith
9,946,017 B2 4/2018 Saxena et al.
10,018,764 B2 7/2018 Grot et al.
10,090,429 B2 10/2018 Leobandung
10,138,515 B2 11/2018 Fehr et al.
10,280,457 B2 5/2019 Zhong et al.
10,310,178 B2 6/2019 Saxena et al.
10,487,356 B2 11/2019 Lundquist et al.
10,578,788 B2 3/2020 Grot et al.
10,655,172 B2 5/2020 Rank et al.
10,724,090 B2 7/2020 McCaffrey et al.
11,573,180 B2 * 2/2023 Webster ............ H01L 27/14616
11,714,001 B2 * 8/2023 Webster ............... H04N 25/771 250/206
11,869,917 B2 * 1/2024 Webster ............ H01L 27/14609
2002/0182716 A1 12/2002 Weisbuch et al.
2003/0174992 A1 9/2003 Levene et al.
2010/0065726 A1 3/2010 Zhong et al.
2010/0073541 A1 3/2010 Kawahito
2011/0187908 A1 8/2011 Kawahito et al.
2011/0298079 A1 12/2011 Kawahito
2013/0070131 A1 3/2013 Ohkubo et al.
2013/0116153 A1 5/2013 Bowen et al.
2016/0133668 A1 5/2016 Rothberg et al.
2017/0146479 A1 5/2017 Levine et al.
2018/0180546 A1 6/2018 Rothberg et al.
2019/0252428 A1 8/2019 Ma et al.
2019/0292590 A1 9/2019 Zhong et al.
2019/0391010 A1 12/2019 Thurston et al.
2021/0025823 A1 1/2021 Rothberg et al.
2021/0025993 A1 1/2021 Choi et al.
2021/0028209 A1 1/2021 Choi
2021/0202550 A1 7/2021 Ma et al.
2021/0215605 A1 7/2021 Schmid et al.
2021/0217800 A1 7/2021 Webster et al.
2022/0128402 A1 4/2022 Webster et al.
2022/0186305 A1 6/2022 Webster
2024/0044703 A1 * 2/2024 Webster ............ G01N 21/6408
2024/0088178 A1 * 3/2024 Webster .................. H04N 5/00

OTHER PUBLICATIONS

Hale, Fibre Optic Sensors using Adiabatically Tapered Single Mode Fibres. Dissertation submitted to the University of Cambridge. Feb. 1994. 209 pages.
Mogensen et al., A Microfluidic Device with an Integrated Waveguide Beam Splitter for Velocity Measurements of Flowing Particles by Fourier Transformation. Analytical Chemistry. Sep. 15, 2003;75(18):4931-4936.
Taitt et al., Evanescent wave fluorescence biosensors. Biosens Bioelectron. Jun. 2005;20(12):2470-87. Epub Dec. 8, 2004.
International Search Report and Written Opinion for International Application No. PCT/US2023/030586 mailed Jan. 5, 2024.

* cited by examiner

BACKSIDE ILLUMINATED STRUCTURES WITH PARALLEL CHARGE TRANSFER

RELATED APPLICATIONS

This application claims the benefit under 35 U.S.C. § 119(e) of U.S. Provisional Application Ser. No. 63/399,503, filed Aug. 19, 2022, and entitled, "BACKSIDE ILLUMINATED STRUCTURES WITH PARALLEL CHARGE TRANSFER," which is hereby incorporated herein by reference in its entirety.

FIELD OF THE DISCLOSURE

The present disclosure relates to integrated devices and related instruments that can perform massively-parallel analyses of samples by providing short optical pulses to tens of thousands of sample wells or more simultaneously and receiving fluorescent signals from the sample wells for sample analyses. The instruments may be useful for point-of-care genetic sequencing and for personalized medicine.

BACKGROUND

Photodetectors are used to detect light in a variety of applications. Integrated photodetectors have been developed that produce an electrical signal indicative of the intensity of incident light. Integrated photodetectors for imaging applications include an array of pixels to detect the intensity of light received from across a scene. Examples of integrated photodetectors include charge coupled devices (CCDs) and Complementary Metal Oxide Semiconductor (CMOS) image sensors.

Instruments that are capable of massively-parallel analyses of biological or chemical samples are typically limited to laboratory settings because of several factors that can include their large size, lack of portability, requirement of a skilled technician to operate the instrument, power need, need for a controlled operating environment, and cost. When a sample is to be analyzed using such equipment, a common paradigm is to extract a sample at a point of care or in the field, send the sample to the lab and wait for results of the analysis. The wait time for results can range from hours to days.

BRIEF SUMMARY

Some aspects of the present disclosure relate to an integrated circuit comprising a photodetection region configured to receive, in a first direction, at a first face of the photodetection region, incident photons and generate, in response to receiving the incident photons, charge carriers, a first charge storage region positioned proximate a second face of the photodetection region that is opposite the first face in the first direction, a first charge transfer path configured to electrically couple the photodetection region to the first charge storage region, a second charge storage region positioned proximate the second face of the photodetection region, a second charge transfer path configured to electrically couple the photodetection region to the second charge storage region, and the second charge transfer path bypassing the first charge storage region.

Some aspects of the present disclosure relate to a method comprising receiving, in a first direction, at a first face of a photodetection region, incident photons, generating, in the photodetection region, in response to receiving the incident photons, first and second charge carriers, transferring, along a first charge transfer path, from the photodetection region to a first charge storage region, the first charge carriers, the first charge storage region positioned proximate a second face of the photodetection region that is opposite, in the first direction, from the first face, and transferring, along a second charge transfer path that bypasses the first charge storage region, from the photodetection region to a second charge storage region, the second charge carriers, the second charge storage region positioned proximate the second face of the photodetection region.

Some aspects of the present disclosure relate to an integrated circuit comprising a photodetection region configured to receive, at a first face of the photodetection region, incident photons and generate, in response to receiving the incident photons, charge carriers, a first transfer gate positioned proximate a second face of the photodetection region and configured to control charge carrier transfer, in a first direction, out of the photodetection region, a second transfer gate positioned proximate the second face of the photodetection region and configured to control charge carrier transfer, in a second direction different from the first direction, out of the photodetection region, and a third transfer gate positioned proximate the second face of the photodetection region and configured to control charge carrier transfer, in a third direction different from the first and second directions, out of the photodetection region.

Some aspects of the present disclosure relate to a method comprising receiving, at a first face of a photodetection region, incident photons, generating, in the photodetection region, in response to receiving the incident photons, charge carriers, using a first transfer gate positioned proximate a second face of the photodetection region opposite the first face, controlling charge carrier transfer, in a first direction, out of the photodetection region, using a second transfer gate positioned proximate the second face of the photodetection region, controlling charge carrier transfer, in a second direction different from the first direction, out of the photodetection region, and using a third transfer gate positioned proximate the second face of the photodetection region, controlling charge carrier transfer, in a third direction different from the first and second directions, out of the photodetection region.

Some aspects of the present disclosure relate to an integrated circuit comprising a photodetection region configured to receive, in a first direction, incident photons, generate, in response to receiving the incident photons, charge carriers, and induce an intrinsic electric field having a vector component in each of the first direction, a second direction substantially perpendicular to the first direction, and a third direction substantially perpendicular to each of the first and second directions.

Some aspects of the present disclosure relate to a method comprising receiving, in a first direction, at a photodetection region of an integrated circuit, incident photons, generating, in the photodetection region, in response to receiving the incident photons, charge carriers, and inducing, in the photodetection region, an intrinsic electric field in each of the first direction, a second direction substantially perpendicular to the first direction, and a third direction substantially perpendicular to each of the first and second directions.

Some aspects of the present disclosure relate to a method of manufacturing an integrated circuit, the method comprising forming a photodetection region of the integrated circuit to receive incident photons in a first direction, generate, in response to receiving the incident photons, charge carriers, and induce an intrinsic electric field having vector components in each of the first direction, a second direction substantially perpendicular to the first direction, and a third direction substantially perpendicular to each of the first and second directions.

Some aspects of the present disclosure relate to an integrated circuit, comprising a photodetection region configured to receive incident photons and generate, in response to receiving the incident photons, charge carriers, one or more drain regions, a first transfer gate configured to control charge carrier transfer, in a first direction, from the photodetection region to the one or more drain regions, and a second transfer gate configured to control charge carrier transfer, in a second direction different from the first direction, from the photodetection region to the one or more drain regions.

Some aspects of the present disclosure relate to a method comprising receiving, at a photodetection region, incident photons, generating, in response to receiving the incident photons, charge carriers, using a first transfer gate, controlling charge carrier transfer, in a first direction, from the photodetection region to one or more drain regions, and using a second transfer gate, controlling charge carrier transfer, in a second direction different from the first direction, from the photodetection region to the one or more drain regions.

Some aspects of the present disclosure relate to a system comprising an integrated circuit comprising a photodetection region configured to receive, at a first side of the integrated circuit, incident photons, and generate, in response to receiving the incident photons, first and second charge carriers, a first charge storage region configured to receive, from the photodetection region, the first charge carriers, and a second charge storage region configured to receive, from the photodetection region, the second charge carriers, and a control circuit electrically coupled to a second side of the integrated circuit, the control circuit configured to, in response to a single excitation of a sample, control a first charge carrier transfer from the photodetection region to the first charge storage region and control a second charge carrier transfer from the photodetection region to the second charge storage region.

Some aspects of the present disclosure relate to a method comprising receiving, in a photodetection region at a first side of an integrated circuit, in response to a single excitation of a sample, incident photons, generating, in the photodetection region in response to receiving the incident photons, first and second charge carriers, and using a control circuit electrically coupled to a second side of the integrated circuit, controlling, from the photodetection region to a first charge storage region, a first charge carrier transfer of the first charge carriers and controlling, from the photodetection region to a second charge storage region, a second charge carrier transfer of the second charge carriers.

The foregoing summary is not intended to be limiting. Moreover, in accordance with various embodiments, aspects of the present disclosure may be implemented alone or in combination with other aspects.

Figure 1:
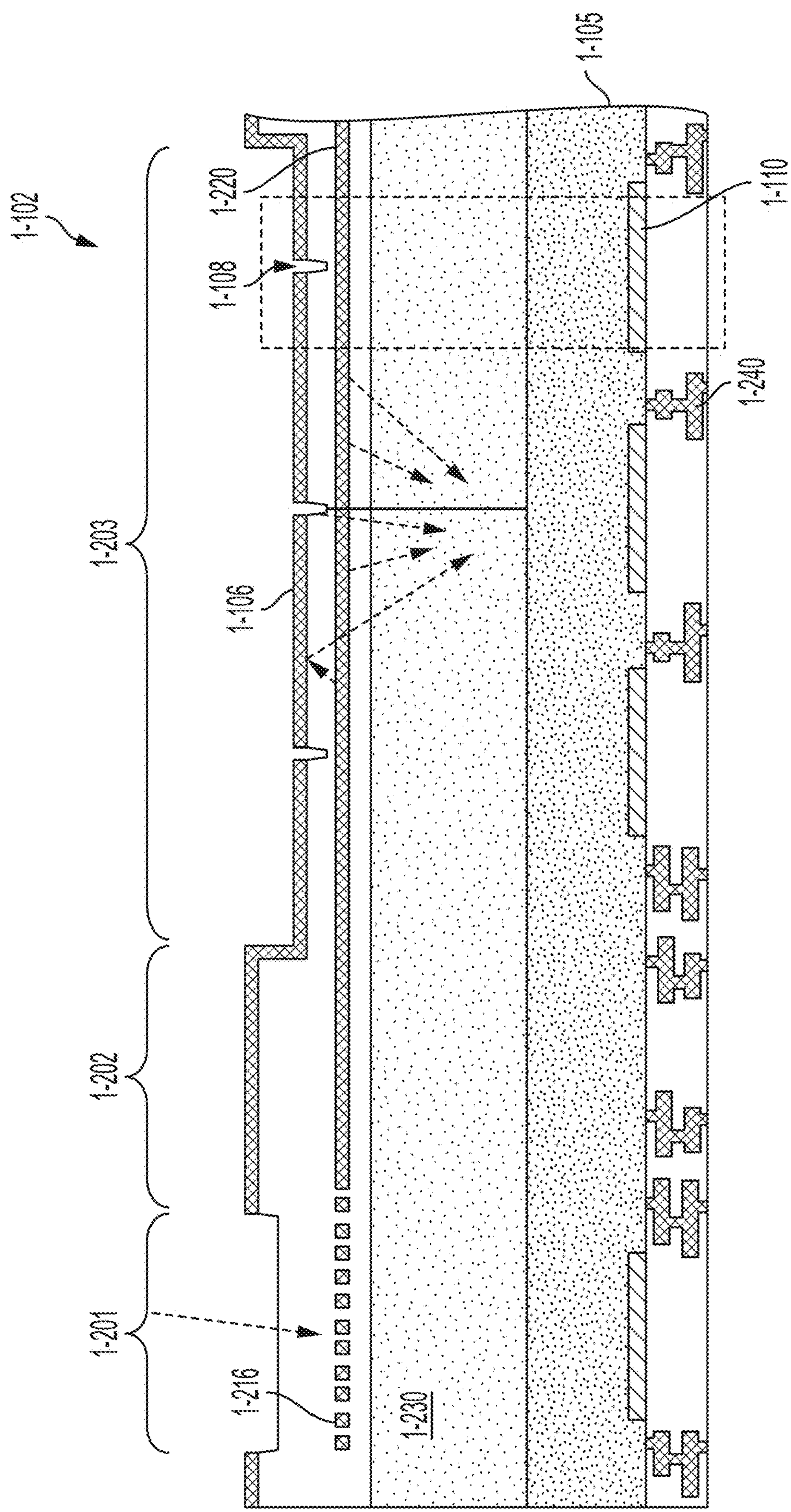
FIG. 1 is a cross-sectional schematic of an example integrated device illustrating a row of pixels, according to some embodiments.

The features and advantages of the present disclosure will become more apparent from the detailed description set forth below when taken in conjunction with the drawings. When describing embodiments in reference to the drawings, directional references ("above," "below," "top," "bottom," "left," "right," "horizontal," "vertical," etc.) may be used. Such references are intended merely as an aid to the reader viewing the drawings in a normal orientation. These directional references are not intended to describe a preferred or only orientation of features of an embodied device. A device may be embodied using other orientations.

DETAILED DESCRIPTION

I. Introduction

Aspects of the present disclosure relate to integrated devices, instruments and related systems capable of analyzing samples in parallel, including identification of single molecules, nucleic acid sequencing, and/or protein sequencing. Such an instrument may be compact, easy to carry, and easy to operate, allowing a physician or other provider to readily use the instrument and transport the instrument to a desired location where care may be needed. Analysis of a sample may include labeling the sample with one or more fluorescent markers, which may be used to detect the sample and/or identify single molecules of the sample (e.g., individual nucleotide identification as part of nucleic acid sequencing). A fluorescent marker may become excited in response to illuminating the fluorescent marker with excitation light (e.g., light having a characteristic wavelength that may excite the fluorescent marker to an excited state) and, if the fluorescent marker becomes excited, emit emission light (e.g., light having a characteristic wavelength emitted by the fluorescent marker by returning to a ground state from an excited state). Detection of the emission light may allow for identification of the fluorescent marker, and thus, the sample or a molecule of the sample labeled by the fluorescent marker. According to some embodiments, the instrument may be capable of massively-parallel sample analyses and may be configured to handle tens of thousands of samples or more simultaneously.

The inventors have recognized and appreciated that an integrated device having sample wells configured to receive the sample and integrated optics formed on the integrated device and an instrument configured to interface with the integrated device may be used to achieve analysis of this number of samples. The instrument may include one or more excitation light sources, and the integrated device may interface with the instrument such that the excitation light is delivered to the sample wells using integrated optical components (e.g., waveguides, optical couplers, optical splitters) formed on the integrated device. The optical components may improve the uniformity of illumination across the sample wells of the integrated device and may reduce a large number of external optical components that might otherwise be needed. Furthermore, the inventors have recognized and appreciated that integrating photodetection regions (e.g., photodiodes) on the integrated device may improve detection efficiency of fluorescent emissions from the sample wells and reduce the number of light-collection components that might otherwise be needed.

In some embodiments, the integrated device may receive fluorescence emission photons from a sample, generate charge carriers in a photodetection region, and collect the charge carriers in one or more charge storage regions to detect the fluorescence emission photons. For example, a photodetection region may be positioned on the integrated device to receive the fluorescent emission photons in an optical direction, and the photodetection region also may be coupled to one or more charge storage regions (e.g., storage diodes) of the integrated device, such that the charge storage region(s) may collect charge carriers generated in the photodetection region in response to the fluorescent emission photons. A number of charge carriers accumulated in the charge storage region(s) may be read out to obtain information about the sample from which the fluorescence emission photons were received. In some embodiments, the integrated device may be further configured to discard charge carriers generated during certain time periods. For instance, prior to arrival of fluorescence emission photons at the photodetection region, excitation light may reach the photodetection region and generate charge carriers, which the integrated device may be configured to discard by transferring the charge carriers to a drain region.

The inventors recognized challenges that arise in obtaining luminance measurements quickly and accurately using an integrated device. For example, it is desirable to obtain a large amount of information from exciting a sample, but the measurements needed to obtain such information can take a long time to perform. For instance, after each excitation of the sample, charge carriers corresponding to received fluorescence photons may be collected in a charge storage region during a particular period of time following the excitation, and the particular time period for collection may vary from excitation to excitation. In some applications, charge carriers collected at time periods that vary from excitation to excitation can indicate a fluorescence intensity decay curve of the sample. At the same time, it can take many excitations of the sample to accumulate a sufficient number of charge carriers in the charge storage region to obtain a readable measurement of the number of collected charge carriers. When the time period of collection varies from excitation to excitation, a first set of excitations may be needed for a first time period and a second set of excitations may be needed for a second time period, making the total duration of the measurement undesirably long for some applications.

To address these challenges, the inventors developed techniques to obtain a large amount of information from a single excitation of a sample. In some embodiments, an integrated circuit can include a photodetection region and multiple charge storage regions, each configured to receive charge carriers from the photodetection region in response to a single excitation of a sample. For example, a control circuit electrically coupled to the integrated circuit may be configured to, in response to the single excitation of the sample, control a first charge carrier transfer from the photodetection region to a first charge storage region and control a second charge carrier transfer from the photodetection region to the second charge storage region. In some embodiments, such techniques can be used to collect charge carriers during different time periods following the single excitation of the sample. For example, collecting charge carriers during different time periods following the single excitation of the sample may produce more information from the single excitation than if charge carriers were only collected during a single time period following the single excitation, though embodiments are not so limited.

In some embodiments, the photodetection region may be configured to receive incident photons at a first side of the integrated circuit and the control circuit may be electrically coupled to a second side of the integrated circuit. For instance, the integrated circuit may have a backside-illuminated (BSI) configuration. The inventors recognized that receiving incident photons at the first side and having the control circuit electrically coupled to the second side allows flexibility in positioning the components of the integrated circuit that control and/or perform charge collection. For example, when the control circuit is electrically coupled to the second side, incident photons may reach the photodetection region from the first side substantially unimpeded by any or each of the control circuit, connections to the control circuit, the charge storage region(s), and/or transfer gate(s) configured to control charge carrier transfer to the charge storage region(s) using control signals from the control circuit, as such components may be proximate the second side.

The inventors have also developed techniques to facilitate collecting charge carriers from a photodetection region in multiple charge storage regions. In some embodiments, an integrated circuit may include a photodetection region, a first charge transfer path (e.g., semiconductor channel) configured to electrically couple the photodetection region to a first charge storage region, and a second charge transfer path (e.g., semiconductor channel) configured to electrically couple the photodetection region to a second charge storage region, with the second charge transfer path bypassing the first charge storage region. For example, charge carriers may travel along the second charge transfer path to the second charge storage region without reaching or passing through the first charge storage region. In some cases, the first and second charge transfer paths may bypass one another, such that charge carriers traveling along the first charge transfer path to the first charge storage region do not reach or pass through the second charge storage region. The inventors recognized that having the charge transfer path(s) bypass the charge storage region(s) may be advantageous for collecting charge carriers in multiple charge storage regions in response to a single excitation of a sample, though embodiments are not so limited.

In some embodiments, the photodetection region may be configured to receive incident photons at a first face of the photodetection region and the first and second charge storage regions may be positioned proximate a second face of the photodetection region (e.g., closer to the second face than to the first face, and/or positioned at and/or substantially at the second face). In some embodiments, the second face may be opposite the first face in the direction in which the photodetection region is configured to receive incident photons. For instance, the integrated circuit may have a BSI configuration.

The inventors have also recognized additional challenges in that, when charge carriers travel slowly and/or unevenly in the integrated device, resulting measurements can be inaccurate. As one example, slow charge transfer in an integrated device can result in charge carriers not being discarded and/or collected at the appropriate time, resulting in collection of noise charge carriers (e.g., due to excitation light) and/or missed collection of desired charge carriers (e.g., due to fluorescent light). As another example, uneven charge transfer in an integrated device can result in different charge transfer efficiencies when transferring charge carriers to different parts of the device (e.g., drain regions and charge storage regions), resulting in at least one charge transfer path being slower than is desired. As yet another example, uneven charge transfer in an integrated device can make the integrated device unsuitable for certain applications, such as when it is desirable for substantially uniform charge transfer among multiple charge storage regions (e.g., for subsequently calculating a ratio of charge collected in each charge storage region). Moreover, the inventors further recognized that these challenges can be caused and/or exacerbated by insufficient control over charge transfer paths within the integrated device.

To address these challenges, the inventors developed techniques that provide faster and/or more uniform charge transfer paths within an integrated device. In some embodiments, such techniques may include inducing, in a photodetection region of an integrated device, an intrinsic electric field having a vector component in each of at least three substantially perpendicular directions. For example, the photodetection region may be configured to receive incident photons in a first direction, and the intrinsic electric field may have vector components in each of the first direction, a second direction substantially perpendicular to the first direction, and a third direction substantially perpendicular to the first and second directions. The inventors recognized that inducing an intrinsic electric field having a vector component in each of at least three substantially perpendicular directions provides improved control over charge transfer paths within an integrated device. For instance, each vector component of the electric field may be used to control the quick flow of charge carriers in a desired direction in three dimensional (3D) space, such as through the photodetection region (e.g., using a vector component in the first direction) and toward one or more charge storage and/or drain regions (e.g., using vector component(s) in the second and/or third direction).

In some embodiments, such as described further herein, an intrinsic electric field having a vector component in each of at least three substantially perpendicular directions may be induced using a photodetection region having multiple sub-regions with different intrinsic electric potential levels. For example, the sub-regions may have different dopant concentrations. In some embodiments, the sub-regions may at least partially surround one another sub-region. For example, each sub-region may be nested within at least one other sub-region. In some cases, dopant concentration may increase from the outermost nested sub-region to the innermost nested sub-region, which may include a focal volume toward which the intrinsic electric field is oriented.

Further techniques developed by the inventors to provide improved control over charge transfer paths within an integrated device include using transfer gates configured to control charge carrier transfer in three or more different directions. In some embodiments, an integrated circuit may include a photodetection region and multiple transfer gates configured to control charge carrier transfer out of the photodetection region in multiple respective directions. For example, a first transfer gate may be configured to control charge carrier transfer out of the photodetection region in a first direction (e.g., to a first drain region), a second transfer gate may be configured to control charge carrier transfer out of the photodetection region in a second direction different from the first direction (e.g., to a first charge storage region), and a third transfer gate may be configured to control charge carrier transfer out of the photodetection region in a third direction (e.g., to a second drain and/or charge storage region) different from the first and second directions. In some embodiments, using transfer gates configured to control charge carrier transfer in three or more different directions may be advantageous for quickly and/or uniformly transferring charge carriers to regions of the integrated device. In some embodiments, multiple transfer gates may be configured to control charge carrier transfer out of a focal volume of an intrinsic electric field induced in the photodetection region, though embodiments described herein are not so limited.

Further techniques developed by the inventors to provide improved control over charge transfer paths within an integrated device include using multiple transfer gates configured to control charge carrier transfer to one or more drain regions in different directions. In some embodiments, an integrated circuit may include a photodetection region, one or more drain regions, and first and second transfer gates configured to control charge carrier transfer in first and second directions, respectively, from the photodetection region to the drain region(s). The inventors recognized that multiple transfer gates configured to control charge carrier transfer to the drain region(s) may advantageously account for manufacturing imprecision in positioning of the transfer gate(s). As one example, even when the same manufacturing process is used to form the integrated devices, some integrated devices may have a drain transfer gate positioned close to a focal volume of a photodetection region's intrinsic electric field while others may have a drain transfer gate positioned far from the focal volume. While acceptable for some applications, this inconsistency can impact the uniformity of charge transfer desired for other applications. In this example, using multiple transfer gates configured to control charge carrier transfer to one or more drain regions in different directions allows at least one of the multiple transfer gates to be positioned close to the focal volume even if another of the transfer gates is positioned far from the focal volume, which provides improved overall uniformity in charge transfer to different regions of the integrated device.

In some embodiments, the first and second transfer gates may be positioned on opposing first and second sides of the photodetection region and configured to control charge carrier transfer in at least partially opposite directions. For instance, using the above example, the first and second transfer gates may be positioned on opposite sides of a focal volume of the photodetection region's intrinsic electric field, such that when manufacturing imprecision causes one of the first and second transfer gates to be far from the focal volume, the other of the first and second transfer gates may be close to the focal volume. In some embodiments, the integrated device may further include third and fourth transfer gates configured to control charge carrier transfer in third and fourth directions, respectively (e.g., to first and second charge storage regions), that are different from the first and second directions (e.g., substantially perpendicular to the first and second directions). For example, the third and fourth transfer gates may be positioned opposite one another and each, at least in part, between the first and second transfer gates. In some embodiments, the first, second, third, and fourth transfer gates may substantially encircle a focal volume of the photodetection region's intrinsic electric field, so as to provide substantially uniform charge transfer to the drain and/or charge storage regions of the integrated device.

It should be appreciated that each of the techniques described herein may be used independently of the others, and/or may be implemented in combination with some or all other techniques described herein.

As one example that may use some or all techniques described herein, an integrated device may include a photodetection region configured to induce an intrinsic electric field having a vector component in at least three substantially perpendicular directions. In some embodiments, the photodetection region may be configured to receive incident photons at a first face, and the intrinsic electric field may have a focal volume proximate a second face of the photodetection region opposite the first face (e.g., in BSI configuration). In some embodiments, the integrated device may have first and second charge transfer paths coupling the photodetection region to first and second respective charge storage regions, with the second charge transfer path bypassing the first charge storage region (e.g., and/or the first charge transfer path bypassing the second charge storage region). In some embodiments, at least three transfer gates may be positioned proximate the second face of the photodetection region (e.g., proximate the focal volume) and configured to control charge carrier transfer in at least three different directions, respectively. In some embodiments, a control circuit may be electrically coupled to the second face of the photodetection region (e.g., to the transfer gates) and configured to control, in response to a single excitation of a sample, a first charge carrier transfer to the first charge storage region and a second charge carrier transfer to the second charge storage region. In some embodiments, the integrated device may have first and second drain transfer gates configured to control charge carrier transfer in different respective directions to one or more drain regions.

II. Integrated Device Overview

A cross-sectional schematic of integrated device 1-102 illustrating a row of pixels 1-112 is shown in FIG. 1, according to some embodiments. Integrated device 1-102 may include coupling region 1-201, routing region 1-202, and pixel region 1-203. Coupling region 1-201 may be configured to receive incident excitation light from an excitation light source. Routing region 1-202 may be configured to deliver the excitation light from coupling region 1-201 to pixel region 1-203. Pixel region 1-203 may include a plurality of sample wells 1-108 positioned on a surface at a location separate from coupling region 1-201. For example, coupling region 1-201 may include one or more grating couplers 1-216 and routing region 1-202 may include one or more waveguides 1-220 configured to propagate light from grating coupler(s) 1-216 under sample well(s) 1-108. For instance, evanescent coupling of excitation light from waveguide(s) 1-220 may excite samples in sample well(s) 1-108 to emit fluorescent light.

As shown in FIG. 1, one or more at least partially opaque (e.g., metal) layers 1-106 can be disposed over the surface to reflect incident excitation light coupled from waveguide(s) 1-220. Sample wells 1-108 may be free of layer(s) 1-106 to allow samples to be placed in sample well(s) 1-108. In some embodiments, the directionality of the emission light from a sample well 1-108 may depend on the positioning of the sample in the sample well 1-108 relative to metal layer(s) 1-106 because metal layer(s) 1-106 may act to reflect emission light. In this manner, a distance between metal layer(s) 1-106 and a fluorescent marker on a sample positioned in a sample well 1-108 may impact the efficiency of photodetector(s) 1-110, that are in the same pixel as the sample well, to detect the light emitted by the fluorescent marker. The distance between metal layer(s) 1-106 and the bottom surface of a sample well 1-106, which is proximate to where a sample may be positioned during operation, may be in the range of 100 nanometers (nm) to 500 nm, or any value or range of values in that range. In some embodiments the distance between metal layer(s) 1-106 and the bottom surface of a sample well 1-106 is approximately 300 nm.

As shown in FIG. 1, pixel region 1-203 can include one or more rows of pixels 1-112. One pixel 1-112, illustrated by the dotted rectangle, is a region of integrated device 1-102 that includes a sample well 1-108 and one or more photodetectors 1-110 (e.g., including a photodetection region) associated with the sample well 1-108. In some embodiments, each photodetector 1-110 can include a photodetection region and one or more charge storage regions configured to receive charge carriers generated in the photodetection region in response to incident light from the sample well 1-108. When excitation light coupled from waveguide(s) 1-220 illuminates a sample located within the sample well 1-108, the sample may reach an excited state and emit emission light. The emission light may be detected by one or more photodetectors 1-110 associated with the sample well 1-108. FIG. 1 schematically illustrates an optical axis of emission light (shown as the solid line) from a sample well 1-108 to photodetector(s) 1-110 of pixel 1-112. The photodetector(s) 1-110 of pixel 1-112 may be configured and positioned to detect emission light from sample well 1-108. For an individual pixel 1-112, a sample well 1-108 and its respective photodetector(s) 1-110 may be aligned along a common optical axis. In this manner, the photodetector(s) 1-110 may overlap with the sample well 1-108 within a pixel 1-112.

Also shown in FIG. 1, integrated device 1-102 can include one or more photonic structures 1-230 positioned between sample wells 1-108 and photodetectors 1-110. For example, photonic structures 1-230 may be configured to increase the amount of emission light that reaches photodetectors 1-110 from sample wells 1-108. Alternatively or additionally, photonic structures 1-230 may be configured to reduce or prevent excitation light from reaching photodetectors 1-110, which may otherwise contribute to signal noise in detecting the emission light. As shown in FIG. 1, photonic structures 1-230 may be positioned between waveguide(s) 1-220 and photodetectors 1-110. According to various embodiments, photonic structures 1-230 may include one or more optical rejection photonic structures including a spectral filter, a polarization filter, and a spatial filter. In some embodiments, photonic structures 1-230 may be positioned to align with individual sample wells 1-108 and their respective photodetector(s) 1-110 along a common axis.

As shown in FIG. 1, metal layers 1-240 may be positioned on an opposite side of photodetectors 1-110 from the side that faces sample wells 1-108. In some embodiments, metal layers 1-240 may be configured to route control signals to and/or from portions of integrated device 1-102. For example, the control signals may be received from a control circuit within and/or coupled to one or more conductive pads (not shown) of integrated device 1-102 and routed to pixels 1-112 via metal layers 1-240.

In some embodiments, the distance between the sample and the photodetector(s) may also impact efficiency in detecting emission light. By decreasing the distance light has to travel between the sample and the photodetector(s) 1-110, detection efficiency of emission light may be improved. In addition, smaller distances between the sample and the photodetector(s) 1-110 may allow for pixels that occupy a smaller area footprint of the integrated device, which can allow for a higher number of pixels to be included in the integrated device. At the same time, the depth of substrate 1-105 at which photodetectors 1-110 are disposed can affect the amount of generated charge carriers that flow through to the side on which metal layers 1-240 are disposed. The distance between the bottom surface of a sample well 1-106 and the photodetector(s) 1-110 may be in the range of 5 μm to 15 μm, or any value or range of values in that range, in some embodiments, but embodiments are not so limited. It should be appreciated that, in some embodiments, emission light may be provided through other means than an excitation light source and a sample well. Accordingly, some embodiments may not include sample well 1-108.

A sample to be analyzed may be introduced into sample well 1-108 of pixel 1-112. The sample may be a biological sample or any other suitable sample, such as a chemical sample. The sample may include multiple molecules and the sample well may be configured to isolate a single molecule. In some instances, the dimensions of the sample well 1-108 may act to confine a single molecule within the sample well 1-108, allowing measurements to be performed on the single molecule. Excitation light may be delivered into the sample well 1-108, so as to excite the sample or at least one fluorescent marker attached to the sample or otherwise associated with the sample while it is within an illumination area within the sample well 1-108.

In operation, parallel analyses of samples within the sample wells 1-108 are carried out by exciting some or all of the samples within the wells using excitation light and detecting signals from sample emission with the photodetectors 1-110. Emission light from a sample may be detected by a corresponding photodetector 1-110 and converted to at least one electrical signal. The electrical signals may be transmitted along conducting lines (e.g., metal layers 1-240) of integrated device 1-102, which may be connected to an instrument and/or control circuit interfaced with the integrated device 1-102. The electrical signals may be subsequently processed and/or analyzed by the instrument and/or control circuit.

Figure 2:
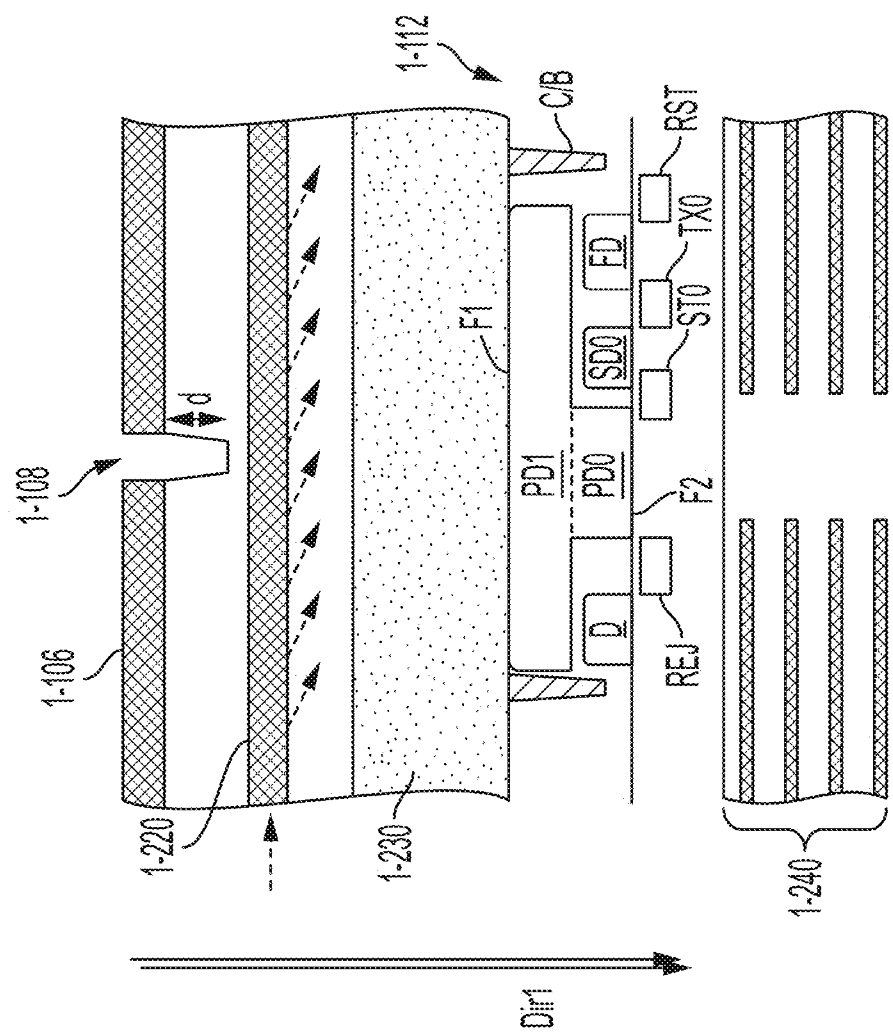
FIG. 2 is a cross-sectional schematic of a pixel of the integrated device of FIG. 1, according to some embodiments.
Figures 3A, 3B:
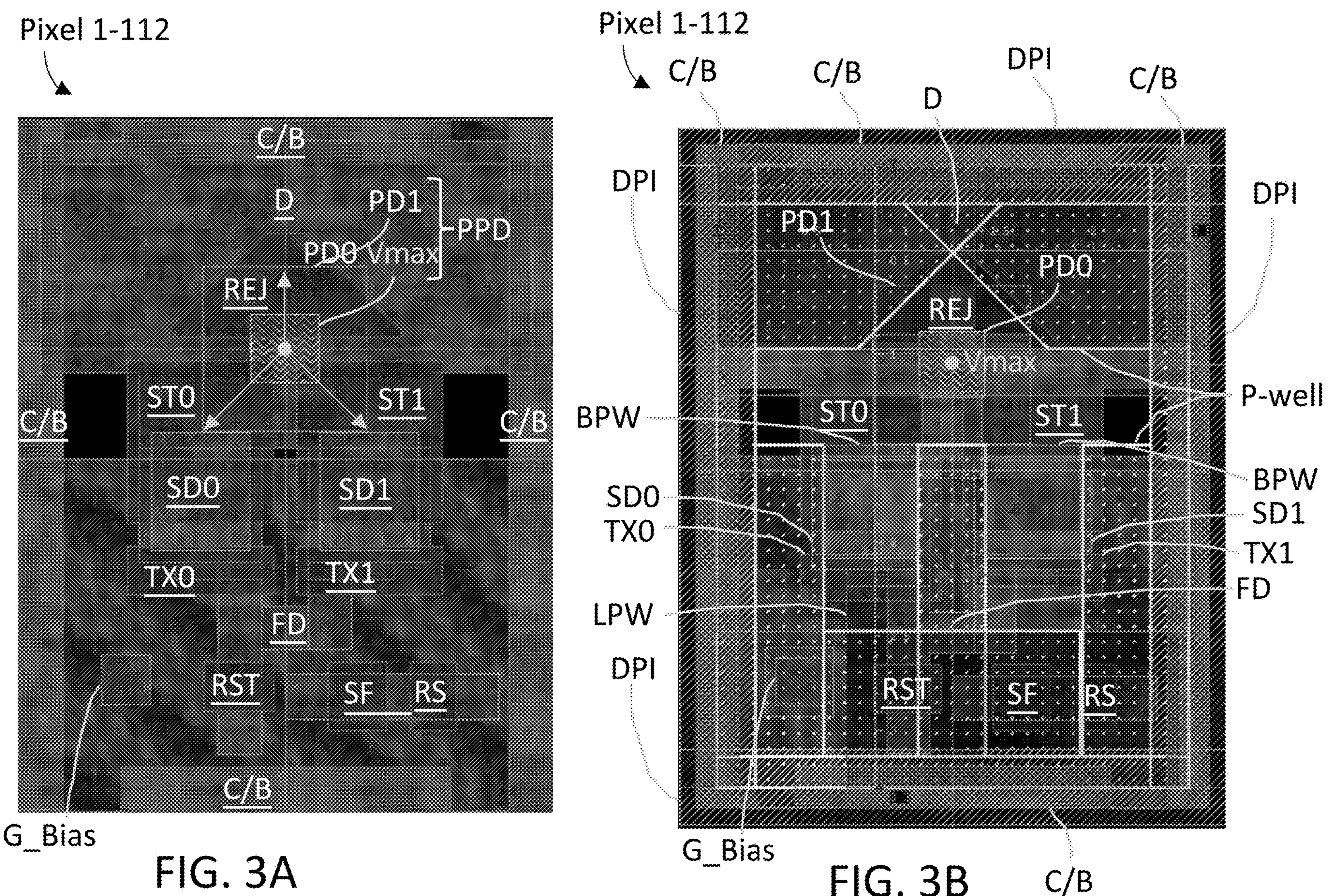
FIG. 3A is a layout sketch of the pixel of FIG. 2, according to some embodiments.
FIG. 3B is a layout sketch of the pixel of 2 further illustrating multiple barriers in the pixel, according to some embodiments.

FIG. 2 illustrates a cross-sectional view of a pixel 1-112 of integrated device 1-102, according to some embodiments. FIG. 3A is a layout sketch of pixel 1-112, according to some embodiments. FIG. 3B is a layout sketch of pixel 1-112 further illustrating multiple barriers in pixel 1-112, according to some embodiments.

As shown in FIGS. 2, 3A, and 3B, pixel 1-112 includes a photodetection region, which may be a pinned photodiode (PPD), two charge storage regions, which may be storage diodes (SD0, SD1), a readout region, which may be a floating diffusion (FD) region, a drain region D, and transfer gates REJ, ST0, ST1, TX0, TX1, reset (RST), source-follower (SF), and row-select (RS). In some embodiments, photodetection region PPD, charge storage regions SD0 and SD1, readout region FD, and/or drain region D may be formed in the integrated device 1-102 by doping portions of one or more layers of substrate 1-105. For example, the integrated device 1-102 may have a lightly p-doped substrate 1-105, and photodetection region PPD, charge storage region SD0, readout region FD, and/or drain region D may be n-doped regions of the substrate 1-105. In this example, p-doped regions may be doped using boron and n-doped regions may be doped using phosphorus, although other dopants and configurations are possible. It should be appreciated that, in some embodiments, the substrate 1-105 may be lightly n-doped and photodetection region PPD, charge storage regions SD0 and SD1, readout region FD, and/or drain region D may be p-doped, as embodiments described herein are not so limited.

In some embodiments, pixel 1-112 may have an area smaller than or equal to 10 microns by 10 microns, such as smaller than or equal to 7.5 microns×5 microns. In some embodiments, pixel 1-112 may have an area smaller than or equal to 5 microns by 5 microns, such as less than or equal to 4 microns by 4 microns. As one example, pixel 1-112 may have an area smaller than or equal to 3.3 microns by 2.5 microns. In some embodiments, pixel 1-112 may be fabricated using 65 nm process technology.

As shown in FIG. 2, photodetection region PPD may have a first face F1 and a second face F2. In some embodiments, photodetection region PPD may be configured to receive, in first direction Dir1, at first face F1, incident photons. For example, during operation of pixel 1-112, excitation light may illuminate sample well 1-108 causing incident photons, including fluorescent emissions from a sample, to flow in the first direction Dirt to photodetection region PPD. In some embodiments, photodetection region PPD may be configured to generate charge carriers in response to receiving incident photons. For example, photodetection region PPD may be configured to generate fluorescent emission charge carriers in response to receiving incident fluorescent photons from sample well 1-108.

In some embodiments, the integrated device 1-102 may be configured to transfer the charge carriers to drain region D or to charge storage region SD0 and/or SD1. For example, during a discarding period following a pulse of excitation light, the incident photons reaching photodetection region PPD may be predominantly excitation photons to be transferred to drain region D to be discarded. In this example, during a collection period following the discarding period, fluorescent emission photons may reach photodetection region PPD to be transferred to charge storage region SD0 and/or charge storage region SD1 for collection. In some embodiments, a discarding period and collection period may follow each excitation pulse.

In some embodiments, charge storage regions SD0 and SD1 and/or drain region D may be positioned at second face F2 of photodetection PPD. For example, as shown in FIGS. 2, 3A, and 3B, charge storage regions SD0 and SD1, drain region D, and readout region FD are positioned, in the first direction Dirt, after at least a portion of photodetection region PPD. Also shown in FIG. 2, portions of photodetection region PPD are positioned between charge storage regions SD0 and SD1, drain region D, and readout region FD and sample well 1-108. Transfer gates ST0, ST1, TX0, TX1, and REJ are also shown in FIG. 2 positioned, in the first direction Dir1, after photodetection region PPD, charge storage region SD0, readout region FD, and drain region D. Pixel 1-112 is also shown in FIG. 2 including one or more charged and/or biased (C/B) regions.

In some embodiments, the C/B regions may be configured to induce a charge carrier depletion in photodetection region PPD. For example, one or more of the C/B regions may include a charge layer configured to induce an intrinsic charge carrier depletion in photodetection region PPD, such as including an oxide layer and a metal-oxide compound. In this example, the oxide layer may provide isolation between the photodetection region PPD and the metal-oxide compound. In accordance with various embodiments, the metal-oxide compound may be aluminum oxide ($Al_2O_3$), hafnium dioxide ($HfO_2$), titanium dioxide ($TiO_2$), tantalum pentoxide ($Ta_2O_5$), or any combination thereof. It should be appreciated that other charged oxide materials, such as any other metal-oxides, configured to generate an accumulation layer of free charge carriers, may be used. In some embodiments, C/B regions may be positioned between two or more pixels 1-112 to induce a charge carrier depletion in the photodetection region of some or each of the pixels 1-112.

Alternatively or additionally, the C/B regions may include one or more metal regions configured to receive a voltage bias that induces the charge carrier depletion in photodetection region PPD. For example, the metal region(s) may be configured for electrically coupling to a DC power supply, voltage source, and/or voltage regulator of integrated device 1-102 and/or an external power supply when the integrated device 1-102 is connected to the power supply. In some embodiments, pixel 1-112 may have a combination of charge layers and metal regions configured to receive a voltage bias with the combination configured to induce the charge carrier depletion in photodetection region PPD. Also shown in FIGS. 3A and 3B, pixel 1-112 includes a bias region G_Bias, which may be configured to receive a power supply voltage for coupling to the C/B regions.

In some embodiments, at least some C/B regions of pixel 1-112 may be continuous. For example, in FIGS. 3A and 3B, the C/B regions elongated in the direction from drain region D to charge storage regions SD0 and SD1 are continuous. In some embodiments, at least some C/B regions of pixel 1-112 may be discontinuous. For example, in FIGS. 3A and 3B, the C/B regions elongated in the direction from charge storage region SD0 to charge storage region SD1 are discontinuous. In other embodiments, the C/B regions elongated in the direction from drain region D to charge storage regions SD0 and SD1 may be discontinuous and/or the C/B regions elongated in the direction from charge storage region SD0 to charge storage region SD1 may be discontinuous, as embodiments described herein are not so limited.

In some embodiments, pixel 1-112 may include one or more barriers DPI positioned around the C/B regions, such as shown in FIG. 3B. In some embodiments, barriers DPI may be doped with an opposite conductivity type from photodetection region PPD (e.g., p-type doped when photodetection region PPD is n-type doped). In some embodiments, barriers DPI may be configured to block charge carriers from traveling between adjacent pixels 1-112. For example, barriers DPI may be positioned between pixel 1-112 and one or more adjacent pixels 1-112. As shown in FIG. 3B, barriers DPI are positioned at each side of pixel 1-112.

In some embodiments, pixel 1-112 may further include one or more barriers positioned to block charge carriers from reaching charge storage regions SD0 and SD1 and/or readout region FD via secondary paths (e.g., paths other than the charge transfer channels controlled by transfer gates). For example, as shown in FIG. 3B, barriers BPW may be positioned to block charge carriers from reaching charge storage regions SD0 and SD1, respectively. Similarly, as shown in FIG. 3B, a barrier LPW may be positioned to block charge carriers from reaching readout region FD. In some embodiments, barriers BPW and/or LPW may be doped with an opposite conductivity type from charge storage regions SD0 and SD1 and/or readout region FD (e.g., p-type doped to block photoelectrons). Also shown in FIG. 3B, a P-well of pixel 1-112 is positioned to block charge carriers from traveling within pixel 1-112.

In some embodiments, charge storage region SD0 may be configured to receive charge carriers generated in photodetection region PPD in response to the incident light. For example, charge storage region SD0 may be configured to receive and store charge carriers generated in photodetection region PPD in response to fluorescent emission photons from the sample well 1-108. In some embodiments, charge storage region SD0 may be configured to accumulate charge carriers received from photodetection region PPD over the course of multiple collection periods, each preceded by an excitation pulse.

III. Charge Transfer Path Bypass Techniques

In some embodiments, pixel 1-112 may include a charge transfer path configured to electrically couple photodetection region PPD to charge storage region SD0 for charge storage region SD0 to receive charge carriers from photodetection region PPD. For example, the charge transfer path may include a charge transfer channel configured to, when biased to a conductive state, transfer charge carriers from photodetection region PPD to charge storage region SD0. In some embodiments, the charge transfer channel may be formed by doping a region of pixel 1-112 between photodetection region PPD and charge storage region SD0 with a same conductivity type as photodetection region PPD and charge storage region SD0. In this example, the charge transfer channel may be configured to be biased to a conductive state when at least a threshold voltage is applied to the charge transfer channel and to a nonconductive state when a voltage less than (or greater than, for some embodiments) the threshold voltage is applied to the charge transfer channel. In some embodiments, the threshold voltage may be a voltage above (or below, for some embodiments) the voltage at which the charge transfer channel is depleted of charge carriers, such that charge carriers from photodetection region PPD may travel through the charge transfer channel to charge storage region SD0. For example, the threshold voltage may be determined based on the materials, dimensions, and/or doping configuration of the charge transfer channel.

In some embodiments, pixel 1-112 may include a charge transfer path configured to electrically couple photodetection region PPD to charge storage region SD1 for charge storage region SD1 to receive charge carriers from photodetection region PPD. For example, the charge transfer path may include a charge transfer channel, such as described herein for charge storage region SD0.

In some embodiments, at least one charge transfer path of pixel 1-112 may bypass another charge transfer path of pixel 1-112. For example, the charge transfer path of pixel 1-112 electrically coupling photodetection region PPD to charge storage region SD1 may bypass the charge transfer path electrically coupling photodetection region PPD to charge storage region SD0, and/or vice versa. For example, the charge transfer path electrically coupling photodetection region PPD to charge storage region SD1 may have a channel that bypasses a channel of the charge transfer path electrically coupling photodetection region PPD to charge storage region SD0, and/or vice versa. As shown in FIG. 3A, charge carriers transferred via the charge transfer path from photodetection region PPD to charge storage region SD0 may not travel in the charge transfer path from photodetection region PPD to charge storage region SD1, and/or vice versa. In some embodiments, pixel 1-112 may further include charge transfer paths respectively coupling charge storage region SD0 and SD1 to readout region FD. For example, charge carriers transferred from photodetection region PPD to charge storage region SD0 and read out to readout region FD may bypass charge storage region SD1, and/or vice versa.

In some embodiments, pixel 1-112 may include a charge transfer path configured to electrically couple photodetection region PPD to drain region D, bypassing charge storage regions SD0 and SD1. For example, the charge transfer path may include a charge transfer channel such as described herein for charge storage regions SD0 and SD1. As shown in FIG. 3A, charge carriers transferred from photodetection region PPD to drain region D may not travel in charge transfer paths electrically coupling photodetection region PPD to charge storage regions SD0 and SD1.

IV. Transfer Gate & Control Circuit Configuration Techniques

In some embodiments, transfer gates ST0, ST1, and REJ may be positioned at second face F2 and configured to control charge carrier transfer out of photodetection region PPD in different directions. For example, as shown in FIG. 3A, transfer gate ST0 may control charge carrier transfer out of photodetection region PPD in one direction, transfer gate ST1 may control charge carrier transfer out of photodetection region PPD in another direction, and transfer gate REJ may control charge carrier transfer out of photodetection region PPD in yet another direction.

In some embodiments, transfer gate ST0 may be configured to control transfer of charge carriers from photodetection region PPD to charge storage region SD0. For instance, transfer gate ST0 may be configured to receive a control signal and bias the charge transfer channel electrically coupling photodetection region PPD to charge storage region SD0 with the control signal. For example, when the control signal is at a first voltage level, transfer gate ST0 may bias the charge transfer channel, with the control signal, to a nonconductive state, such that charge carriers are blocked from reaching charge storage region SD0. Similarly, when the control signal is at a second voltage level, transfer gate ST0 may bias the charge transfer channel, with the control signal, to a conductive state, such that charge carriers may flow from photodetection region PPD to charge storage region SD0 via the charge transfer channel. In some embodiments, transfer gate ST0 may be formed using polysilicon. Similarly, in some embodiments, transfer gate ST1 may be configured to control transfer of charge carriers from photodetection region PPD to charge storage region SD1. For example, transfer gate ST1 may be configured to bias the charge transfer channel electrically coupling photodetection region PPD to charge storage region SD1 with a control signal.

In some embodiments, transfer gates TX0 and TX1 may be configured to control transfer of charge carriers from charge storage regions SD0 and SD1 to readout region FD in the manner described for transfer gates ST0 and ST1 in connection with photodetection region PPD and charge storage regions SD0 and SD1. For example, following a plurality of collection periods during which charge carriers are transferred from photodetection region PPD to charge storage region SD0, charge carriers stored in charge storage region SD0 may be transferred to readout region FD to be read out for processing.

In some embodiments, transfer gate REJ may be configured to control transfer of charge carriers from photodetection region PPD to drain region D in the manner described for transfer gate ST0 in connection with photodetection region PPD and charge storage region SD0. For example, excitation photons from the excitation light source may reach photodetection region PPD before fluorescent emission photons from the sample well 1-108 reach photodetection region PPD. In some embodiments, the integrated device 1-102 may be configured to control transfer gate REJ to transfer charge carriers generated in photodetection region PPD in response to the excitation photons to drain region D during a discarding period following an excitation light pulse and preceding reception of fluorescent emission charge carriers. In some embodiments, drain region D may be configured to receive a DC power supply voltage for discarding charge carriers. For example, drain region D may be configured to receive a high DC power supply voltage for discarding photoelectrons. Alternatively, drain region D may be configured to receive a low DC power supply voltage for discarding photo-holes. In some embodiments, drain region D may be configured to receive the DC power supply voltage via one or more of metal lines 1-240. Alternatively or additionally, in some embodiments, drain region D may be configured to receive the DC power supply voltage via at least one auxiliary device, such as a diode-connected transistor.

In some embodiments, pixel 1-112 may be electrically coupled to a control circuit of integrated device 1-102, and/or of a system that includes integrated device 1-102, and configured to receive control signals at transfer gates REJ, ST0, and TX0 at second face F2 of photodetection region PPD. For example, metal lines of metal layers 1-240 may be configured to carry the control signals to pixels 1-112 of the integrated device 1-102. In some embodiments, a single metal line carrying a control signal may be electrically coupled to a plurality of pixels 1-112, such as an array, subarray, row, and/or column of pixels 1-112. For example, each pixel 1-112 in an array may be configured to receive a control signal from a same metal line and/or net such that the row of pixels 1-112 is configured to drain and/or collect charge carriers from photodetection region PPD at the same time. Alternatively or additionally, each row of pixels 1-112 in the array may be configured to receive different control signals (e.g., row-select signals) during a readout period such that the rows read out charge carriers one row at a time.

In some embodiments, the control circuit may be packaged separately from integrated device 1-102. For example, the control circuit may be electrically coupled to integrated device 1-102 via one or more cables. Alternatively or additionally, the control circuit may be disposed on a circuit board with integrated device 1-102 and electrically coupled to integrated device 1-102 by one or more traces of the circuit board. In some embodiments, the control circuit may be packaged together with integrated device 1-102. For example, the control circuit may be positioned on a different wafer and/or die from integrated device 1-102 and stacked together with integrated device 1-102. In this example, the control circuit may be electrically coupled to integrated device 1-102 via one or more bond pads and/or vias (e.g., through-silicon-vias (TSVs)).

Figure 4:
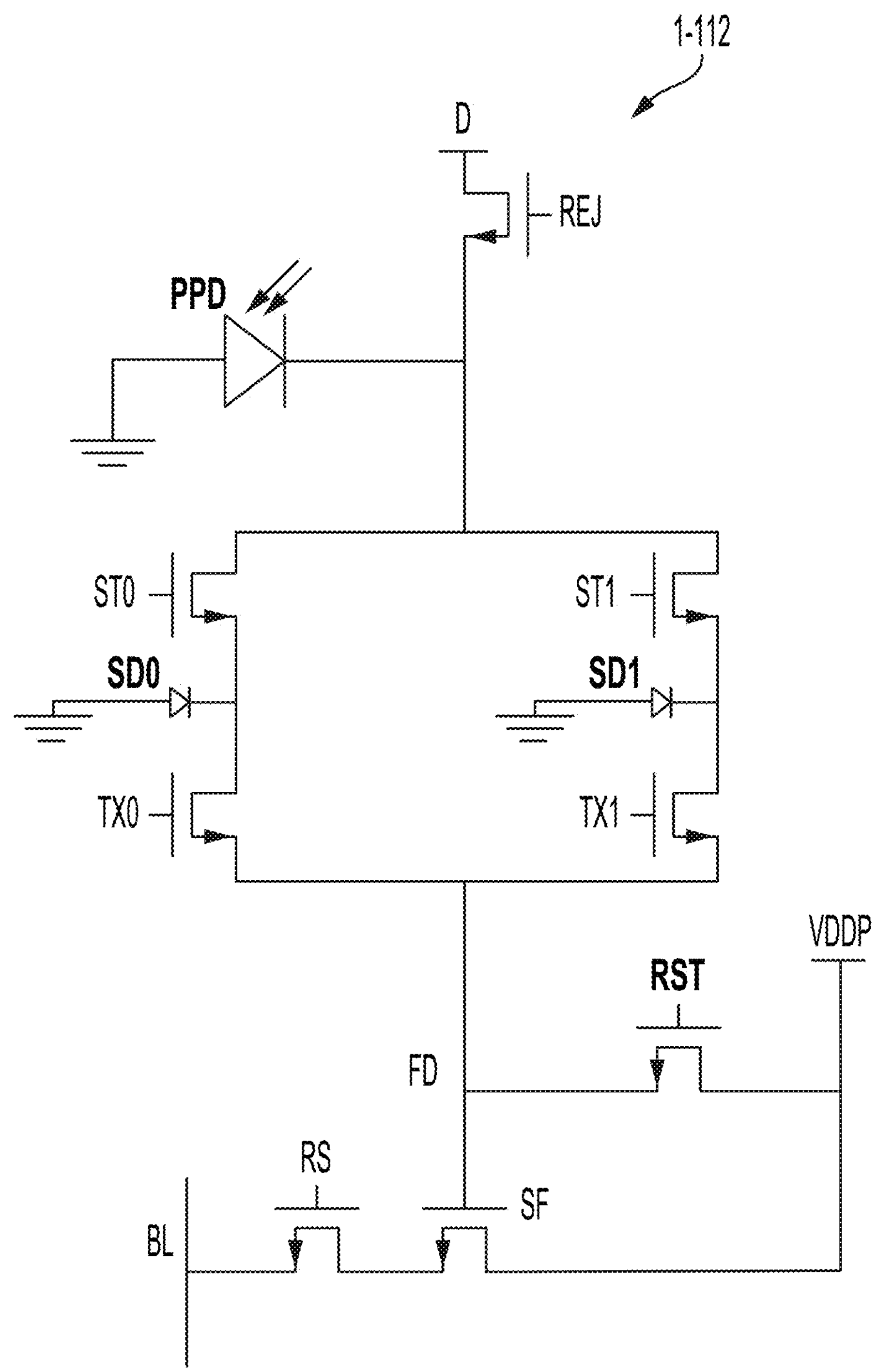
FIG. 4 is a circuit diagram of the pixel of FIG. 2, according to some embodiments.

FIG. 4 is a circuit diagram of pixel 1-112, according to some embodiments. In FIG. 4, transfer gate REJ is the gate of a transistor coupling photodetection region PPD to drain region D, transfer gate ST0 is the gate of a transistor coupling photodetection region PPD to charge storage region SD0, and transfer gate TX0 is the gate of a transistor coupling charge storage region SD0 to readout region FD.

As shown in FIG. 4, transfer gate RST is the gate of a transistor coupled to readout region FD and configured for coupling to a power supply voltage VDDP, and transfer gate RS is the gate of a transistor coupled between readout region FD and a bitline BL. When the integrated device 1-102 is coupled to a power source (e.g., at least a DC power supply), transfer gate RST may be coupled to power supply voltage VDDP, which is supplied by the power source and/or regulated by a voltage regulator of integrated device 1-102. For example, transfer gate RST may be configured to cause charge carriers to flow from readout region FD and/or from charge storage region SD0 via transfer gate TX0 and readout region FD, to power supply voltage VDDP to reset the sampling voltage of readout region FD. As shown in FIG. 4, transfer gate SF is the gate of a source-follower transistor that is coupled to the transistor having transfer gate RS and configured to receive the power supply voltage VDDP. For example, the source-follower transistor may be configured to provide a unity-gain, buffered sampling output of charge carriers in readout region FD.

In some embodiments, transfer gate RST may be configured to reset a voltage of readout region FD. For example, when a reset signal is applied to transfer gate RST, transfer gate RST may bias the transfer channel electrically coupling readout region FD to power supply voltage VDDP, thereby increasing the conductivity of the transfer channel and transferring charge carriers from readout region FD to power supply voltage VDDP. In some embodiments, reset transfer gate RST may be further configured to reset the voltage of charge storage region SD0. For example, when a reset signal is applied to reset transfer gate RST and a control signal is applied to transfer gate TX0, transfer gate TX0 may transfer charge carriers in charge storage region SD0 to readout region FD and transfer gate RST may transfer the charge carriers to power supply voltage VDDP. In some embodiments, integrated device 1-102 may be configured to reset readout region FD and charge storage region SD0 before collecting and reading out charge carriers. For example, integrated device 1-102 may be configured to reset readout region FD and then reset charge storage region SD0 before collecting and reading out charge carriers.

In some embodiments, transfer gate RS may be configured to, in response to a row select control signal, transfer charge carriers from readout region FD to the bitline BL for processing. In some embodiments, the bitline BL may be coupled to processing circuitry on the integrated device 1-102 and/or an external circuit configured to receive a voltage level indicative of charge carriers read out to readout region FD. For example, one bitline may be electrically coupled between each pixel 1-112 of an array and processing circuitry. In some embodiments, the processing circuitry may include an analog-to-digital converter (ADC). In some embodiments, integrated device 1-102 may be configured to reset the voltage of readout region FD of each pixel before reading out charge carriers. For example, integrated device 1-102 may be configured to reset the voltage of readout region FD, sample the voltage, transfer charge carriers into readout region FD, and sample the voltage again. In this example, the second sampled voltage may be indicative of a number of the charge carriers transferred into readout region FD when compared to the first sampled voltage. In some embodiments, integrated device 1-102 may be configured to read out charge carriers from each pixel 1-112 to the bitline sequentially, such as row by row and/or column by column (e.g., in response to receiving row select control signals).

It should be appreciated that some arrays of pixels 1-112 may have multiple bitlines electrically coupled to different ones and/or groups of pixels 1-112, such as with one bitline coupling a first column of pixels 1-112 to first processing circuitry and another bitline coupling a second column of pixels 1-112 to second processing circuitry, and so on. In some embodiments, pixels of multiple columns may be read out to respective processing circuitry at the same time. For example, a first pixel of each column may be read out to the respective processing circuitry at the same time, and then a second pixel of each may be read out to the respective processing circuitry at the same time. It should be appreciated that, in some embodiments, processing circuitry may be provided for each row of the array as an alternative or in addition to each column. In some embodiments, integrated device 1-102 may include multiple units of processing circuitry, such as each being electrically coupled to a bitline.

It should be appreciated that, in accordance with various embodiments, transfer gates described herein may include semiconductor material(s) and/or metal, and may include a gate of a field effect transistor (FET), a base of a bipolar junction transistor (BJT), and/or the like. It should be appreciated that control signals described herein applied to the various transfer gates may vary in shape and/or voltage, such as depending on the electric potential of the semiconductor region and of the regions electrically coupled to the semiconductor region (e.g., neighboring regions).

V. Intrinsic Electric Field Techniques

Figure 5A:
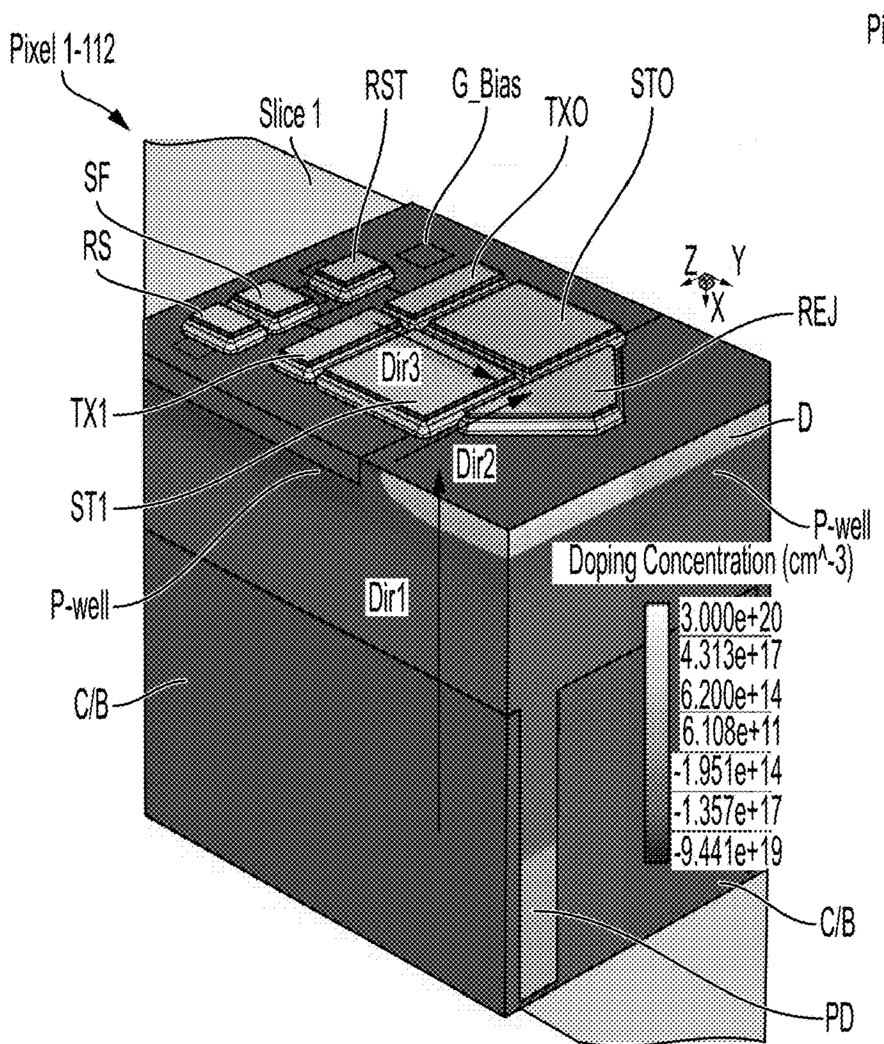
FIG. 5A is a bottom perspective view of the pixel of FIG. 2 showing dopant concentrations in the pixel, according to some embodiments.
Figure 5B:
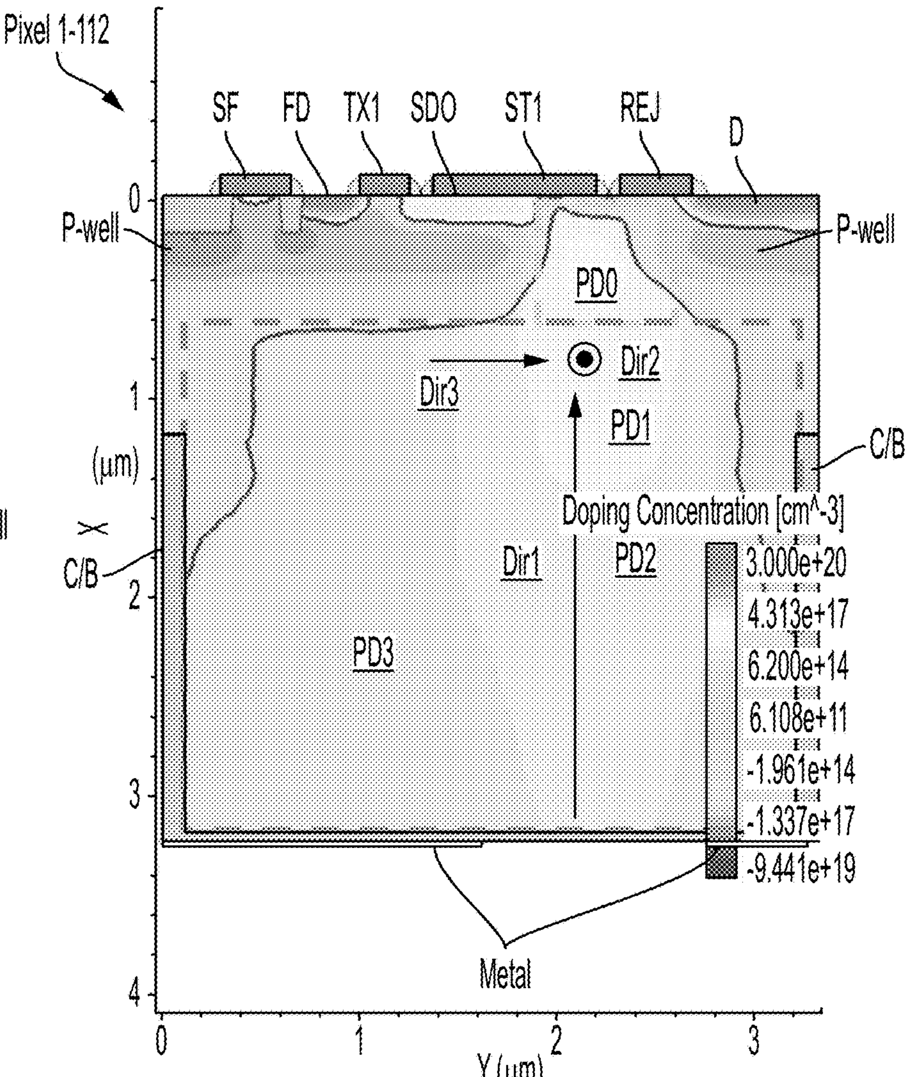
FIG. 5B is a cross-sectional view of the pixel of FIG. 2 showing dopant concentrations in the pixel, according to some embodiments.

FIG. 5A is a bottom perspective view of pixel 1-112 showing dopant concentrations in pixel 1-112, according to some embodiments. FIG. 5B is a cross-sectional view of pixel 1-112 along Slice 1 (FIG. 5A) showing dopant concentrations in pixel 1-112, according to some embodiments.

In some embodiments, photodetection region PPD may be configured to induce an intrinsic electric field. For example, photodetection region PPD may have sub-regions having different intrinsic electric potential levels. For instance, as shown in FIG. 5B, photodetection region PPD includes sub-regions PD0, PD1, PD2, and PD3. In some embodiments, sub-regions PD0, PD1, PD2, and PD3 may have different intrinsic electric potential levels, thereby inducing an intrinsic electric field between the sub-regions. In some embodiments, sub-regions PD0, PD1, PD2, and PD3 may have different dopant concentrations. As shown in FIG. 5B, sub-region PD3 has a lower dopant concentration than sub-region PD2, sub-region PD2 has a lower dopant concentration than sub-region PD1, and sub-region PD1 has a lower dopant concentration than sub-region PD0. In some embodiments, photodetection region PPD may be n-type doped, such that a higher dopant concentration results in a higher intrinsic electric potential level. Alternatively, photodetection region PPD may be p-type doped, such that a higher dopant concentration results in a lower intrinsic electric potential level.

In some embodiments, photodetection region PPD may be configured to induce an intrinsic electric field having a vector component in three substantially perpendicular directions. For example, photodetection region PPD may be configured to induce an intrinsic electric field in each of the first direction Dirt, a second direction Dir2 substantially perpendicular to the first direction Dir1, and a third direction Dir3 substantially perpendicular to each of the first and second directions Dir1 and Dir2. In some embodiments, vector components of the intrinsic electric field may direct charge carriers toward a focal volume Vmax (FIGS. 3A, 3B) of photodetection region PPD. For example, focal volume Vmax may be at least partially disposed within and/or at least partially aligned with sub-region PD0.

In some embodiments, sub-regions of photodetection region PPD may at least partially surround one another to induce the intrinsic electric field in three substantially perpendicular directions. For example, sub-region PD1 may at least partially surround sub-region PD0 in the first direction Dir1, the second direction Dir2, and the third direction Dir3. In some embodiments, the higher intrinsic electric potential level of sub-region PD0 may induce an intrinsic electric field from sub-region PD1 to sub-region PD0 in each direction in which sub-region PD1 surrounds sub-region PD0. FIG. 5B shows sub-region PD0 surrounded by sub-region PD1 at least in the first and third directions Dir1 and Dir3. It should be appreciated that sub-region PD1 may further surround sub-region PD0 in the second direction Dirt, though not shown in the illustrated cross-section. As a result, in FIG. 5B, the higher dopant concentration of sub-region PD0, as compared to sub-region PD1, results in an intrinsic electric field from sub-region PD1 to sub-region PD0 in the first, second, and third directions Dir1, Dir2, and Dir3. Similarly, in some embodiments, sub-region PD2 may at least partially surround sub-region PD1 in the first, second, and third directions Dir1, Dir2, and Dir3, and sub-region PD3 may at least partially surround sub-region PD2 in like manner. For example, sub-regions of photodetection region PPD may be nested at least partially within one another from the innermost to outermost sub-region, such as shown for sub-regions PD0, PD1, PD2, and PD3 in FIG. 5B. In some embodiments, having sub-regions at least partially surrounding one another (e.g., nested at least partially within one another) may orient the intrinsic electric field toward a focal volume disposed at least partially within and/or at least partially aligned with an innermost of the sub-regions.

In some embodiments, sub-regions PD0, PD1, PD2, and PD3 may be formed by doping photodetection region PPD with multiple implants. For example, a first implant may be used to form sub-region PD3, a second implant at least partially overlapping with the first implant may be used to form sub-region PD2, a third implant at least partially overlapping with the first and second implants may be used to form sub-region PD1, and a fourth implant at least partially overlapping with the first, second, and third implants may be used to form sub-region PD0. In some embodiments, some or each of the implants may be nested at least partially within one another to obtain the sub-region configuration shown in FIG. 5B.

In some embodiments, transfer gates ST0 and ST1 may be configured to control charge carrier transfer from sub-region PD0 of photodetection region PPD to respective charge storage regions SD0 and SD1. For example, as described above, photodetection region PPD may be configured to orient its intrinsic electric field toward focal volume Vmax disposed, at least in part, in sub-region PD0. Referring back to FIG. 3B, focal volume Vmax may be positioned between transfer gates REJ, ST0, and ST1, which may allow transfer gates REJ, ST0, and ST1 to control charge carrier transfer from focal volume Vmax to drain region D, charge storage region SD0, and charge storage region SD1, respectively. In some embodiments, transfer gates REJ, ST0, and ST1 may be positioned closely around focal volume Vmax, such as within 1 micron of focal volume Vmax and/or within 2 microns of one another. In some embodiments, transfer gates REJ, ST0, and ST1 may be positioned within 0.5 microns of focal volume Vmax and/or within one micron of one another.

As shown in FIG. 5B, pixel 1-112 may further include a metal shield. In some embodiments, the metal shield may be configured to block incident photons from reaching at least some portions of pixel 1-112 in first direction Dir1. For example, the metal shield may be configured to block incident photons from reaching charge storage region SD0 and/or SD1 in the first direction Dir1. As shown in FIG. 5B, the metal shield may include an aperture at least partially aligned with sub-region PD0 in the first direction Dir1. In other embodiments, the aperture may be offset from sub-region in the second direction Dir2 and/or third direction Dir3.

It should be appreciated that photodetection region PPD may have any number of sub-regions, such as any or each of 2-10 sub-regions, 10-20 sub-regions, and/or 20-50 sub-regions as is suitable for the application, as embodiments described herein are not so limited. For instance, using a large number of sub-regions may be desirable for some applications, such as applications that tolerate the manufacturing cost of implementing many sub-regions, whereas other applications may use only a few sub-regions to keep manufacturing cost low. It should also be appreciated that intrinsic electric field techniques may be used with any number of charge storage regions, such as single charge storage region, and/or with charge storage regions configured in a sequential manner (e.g., first charge storage region electrically coupled between the photodetection region and second charge storage region), as embodiments are not so limited.

Figures 6A, 6B:
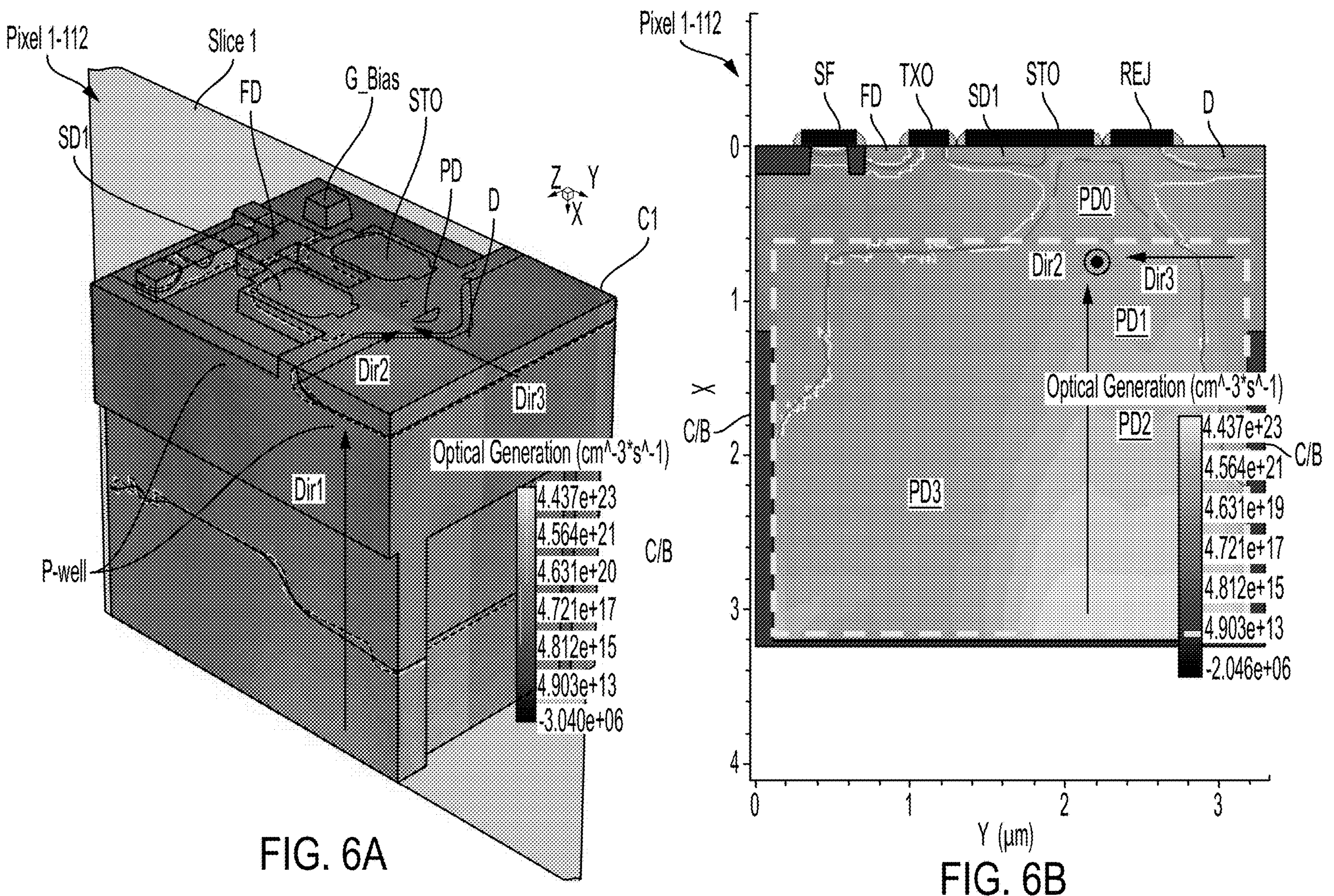
FIG. 6A is a bottom perspective view of the pixel of FIG. 2 showing optical generation in the pixel, according to some embodiments.
FIG. 6B is a cross-sectional view of the pixel of FIG. 2 showing optical generation in the pixel, according to some embodiments.

FIG. 6A is a bottom perspective view of pixel 1-112 showing optical generation in pixel 1-112, according to some embodiments. FIG. 6B is a cross-sectional view of pixel 1-112 along Slice 1 showing optical generation in pixel 1-112, according to some embodiments. In the example illustrated in FIGS. 6A and 6B, pixel 1-112 is illuminated under uniform plane wave illumination at 532 nm wavelength. The optical generation shown in FIGS. 6A and 6B is at least partially impacted by the positioning of the metal shield and/or aperture, C/B regions, metal lines (e.g., 1-240), and/or transfer gates of pixel 1-112. It should be appreciated that optical generation profiles may be used other than the profile illustrated in FIGS. 6A and 6B, as embodiments described herein are not so limited.

Figures 6C, 6D:
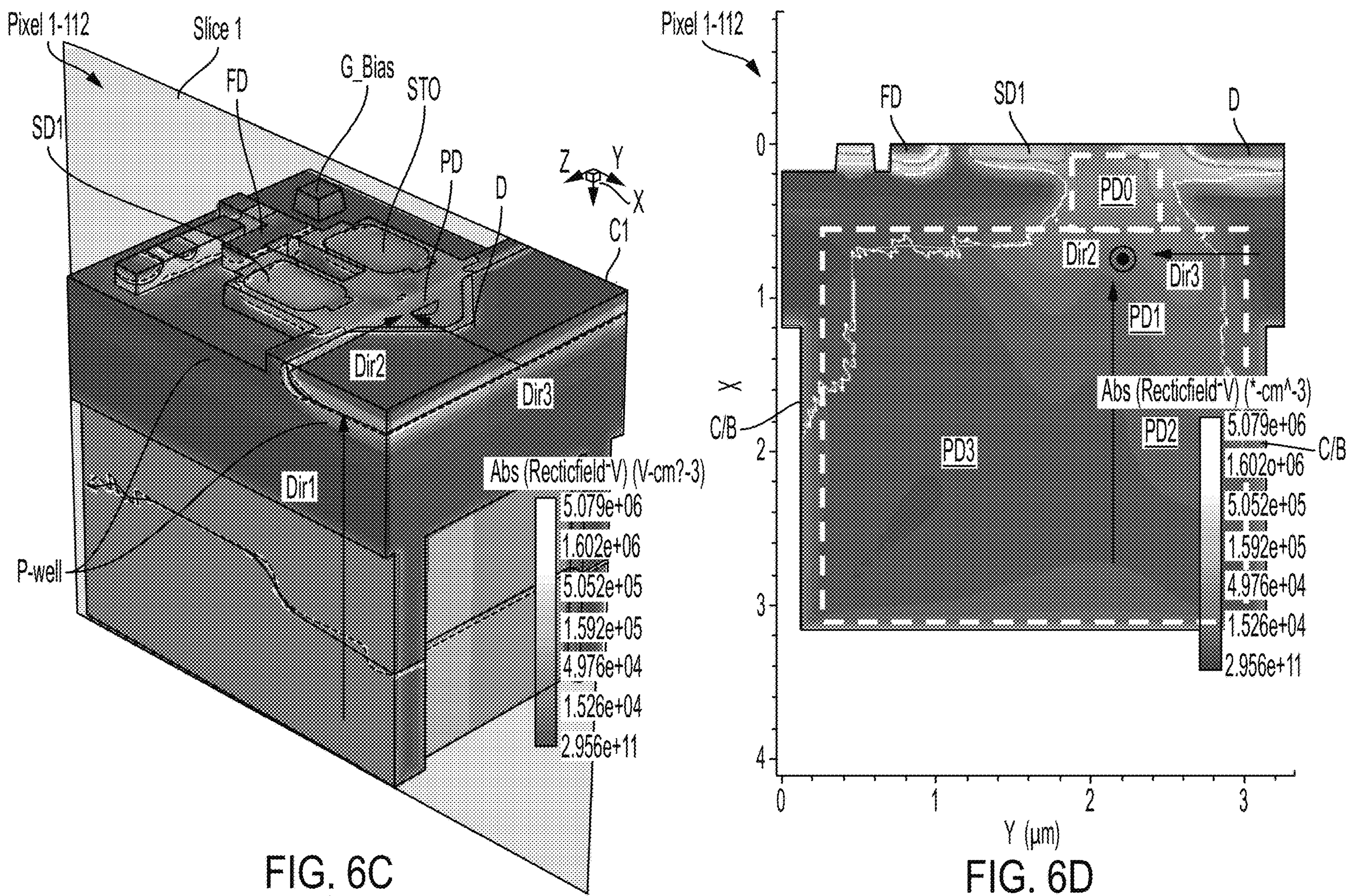
FIG. 6C is a bottom perspective view of the pixel of FIG. 2 showing electric fields in the pixel, according to some embodiments.
FIG. 6D is a cross-sectional view of the pixel of FIG. 2 showing electric fields in the pixel, according to some embodiments.

FIG. 6C is a bottom perspective view of pixel 1-112 showing electric fields in pixel 1-112, according to some embodiments. FIG. 6D is a cross-sectional view of pixel 1-112 along Slice 1 showing electric fields in pixel 1-112, according to some embodiments. As shown in FIG. 6D, electric fields in pixel 1-112 increase from sub-region PD3 to sub-region PD2, from sub-region PD2 to sub-region PD1, and from sub-region PD1 to sub-region PD0.

Figure 7:
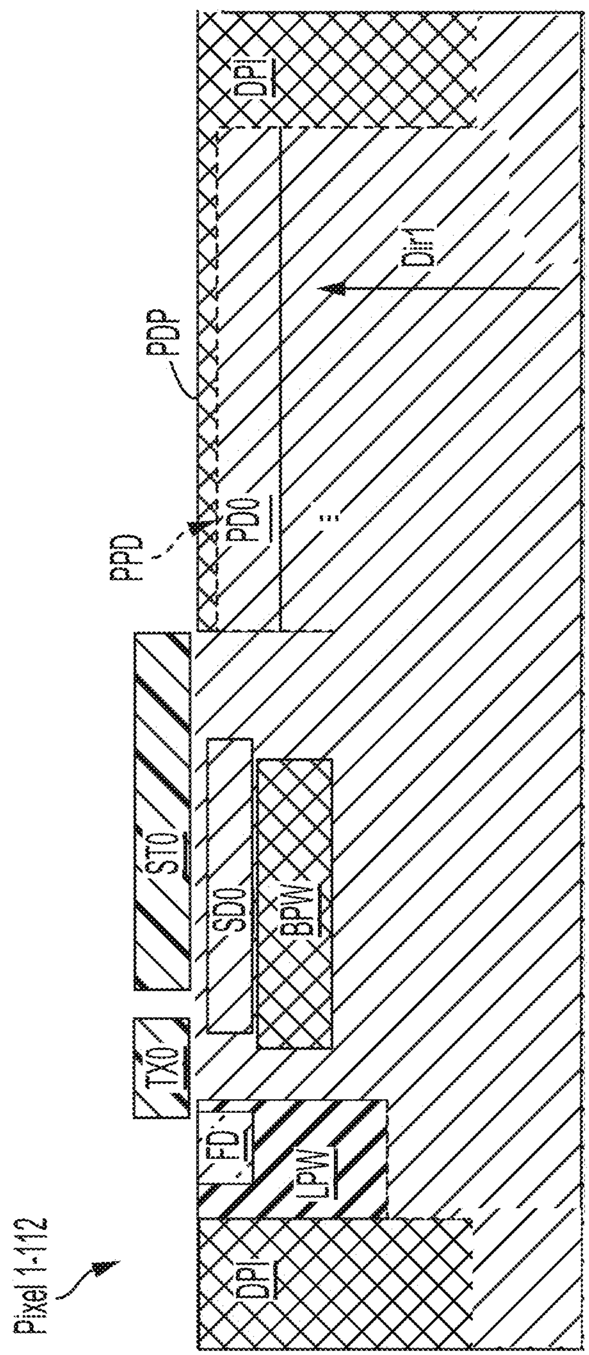
FIG. 7 is a cross-sectional schematic of the pixel of FIG. 2, according to some embodiments.

FIG. 7 is a cross-sectional schematic of pixel 1-112, according to some embodiments. As shown in FIG. 7, charge storage region SD0 may be positioned, in the first direction Dir1, after barrier BPW. Similarly, as shown in FIG. 7, readout region FD may be positioned, in the first direction Dir1, after barrier LPW. Also shown in FIG. 7, photodetection region PPD may have a surface pinning layer PDP positioned, in the first direction Dirt, after sub-region PD0.

In some embodiments, transfer gate ST0 and/or ST1 may be at least partially positioned, in the first direction Dir1, after charge storage region SD0 and/or SD1, such as shown in FIG. 7 for transfer gate ST0 for charge storage region SD0.

In some embodiments, transfer gate ST0 and charge storage region SD0 may be configured to operate as a charge storage gate. For instance, transfer gate ST0 may be configured to bias a channel electrically connecting photodetection region PPD to charge storage region SD0 to conduct charge carriers from photodetection region PPD to charge storage region SD0. In the example shown in FIG. 7, no surface pinning layer is disposed between transfer gate ST0 and charge storage region SD0.

VI. Alternative Charge Storage Techniques

Figure 8:
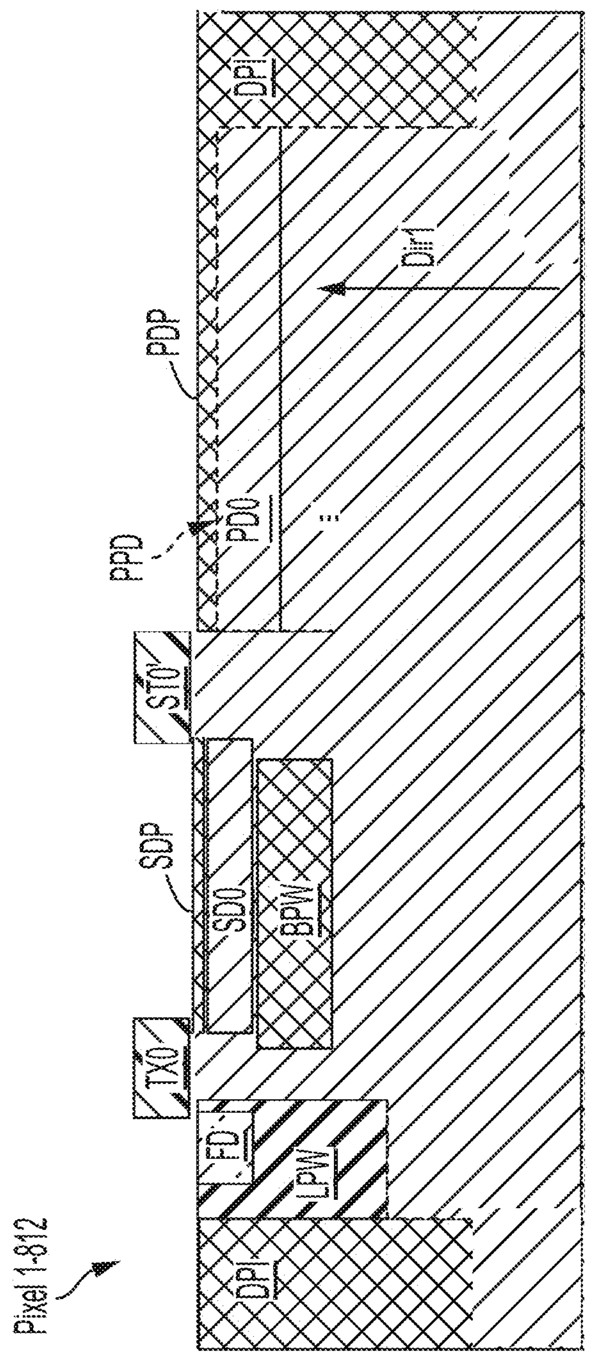
FIG. 8 is a cross-sectional schematic of an example pixel 1-812 having an alternative charge storage region configuration that may be included in the integrated device of FIG. 1, according to some embodiments.

FIG. 8 is a cross-sectional schematic of a pixel 1-812 having an alternative charge storage region configuration, which may be included in integrated device 1-102, according to some embodiments. In some embodiments, pixel 1-812 may be configured in the manner described herein for pixel 1-112. For example, as shown in FIG. 8, pixel 1-812 includes a photodetection region PPD, a charge storage region SD0, a readout region FD, and barriers BPW, LPW, and DPI. While not shown in FIG. 8, it should be appreciated that pixel 1-812 may include a drain region D and/or charge storage region SD1 configured in the manner described herein for pixel 1-112.

In some embodiments, charge storage region SD0 may be configured to operate as a charge storage diode. For example, a surface pinning layer may be positioned, in the first direction, at least in part, between charge storage region SD0 and transfer gate ST0'. For instance, in the example shown in FIG. 8, surface pinning layer SDP is shown positioned, in the first direction Dir1, after charge storage region SD0 and between charge storage region SD0 and transfer gate ST0'. The inventors have recognized that a charge storage diode configuration may achieve low dark current, in some embodiments, by including surface pinning layer SDP positioned between charge storage region SD0 and transfer gate ST0'. In some embodiments, transfer gates of pixel 1-812 may be offset, in the direction from the charge storage region(s) to photodetection region PPD, from the charge storage region(s). For example, as shown in FIG. 8, a transfer gate ST0' is shown positioned substantially entirely, in the direction from charge storage region SD0 to photodetection region PPD, between charge storage region SD0 and photodetection region PPD. While not shown in FIG. 8, it should be appreciated that a corresponding transfer gate configured to control charge transfer between photodetection region PPD and charge storage region SD1 may be configured in the manner described herein for transfer gate ST0'.

VII. Integrated Device Operation Techniques

Figure 9:
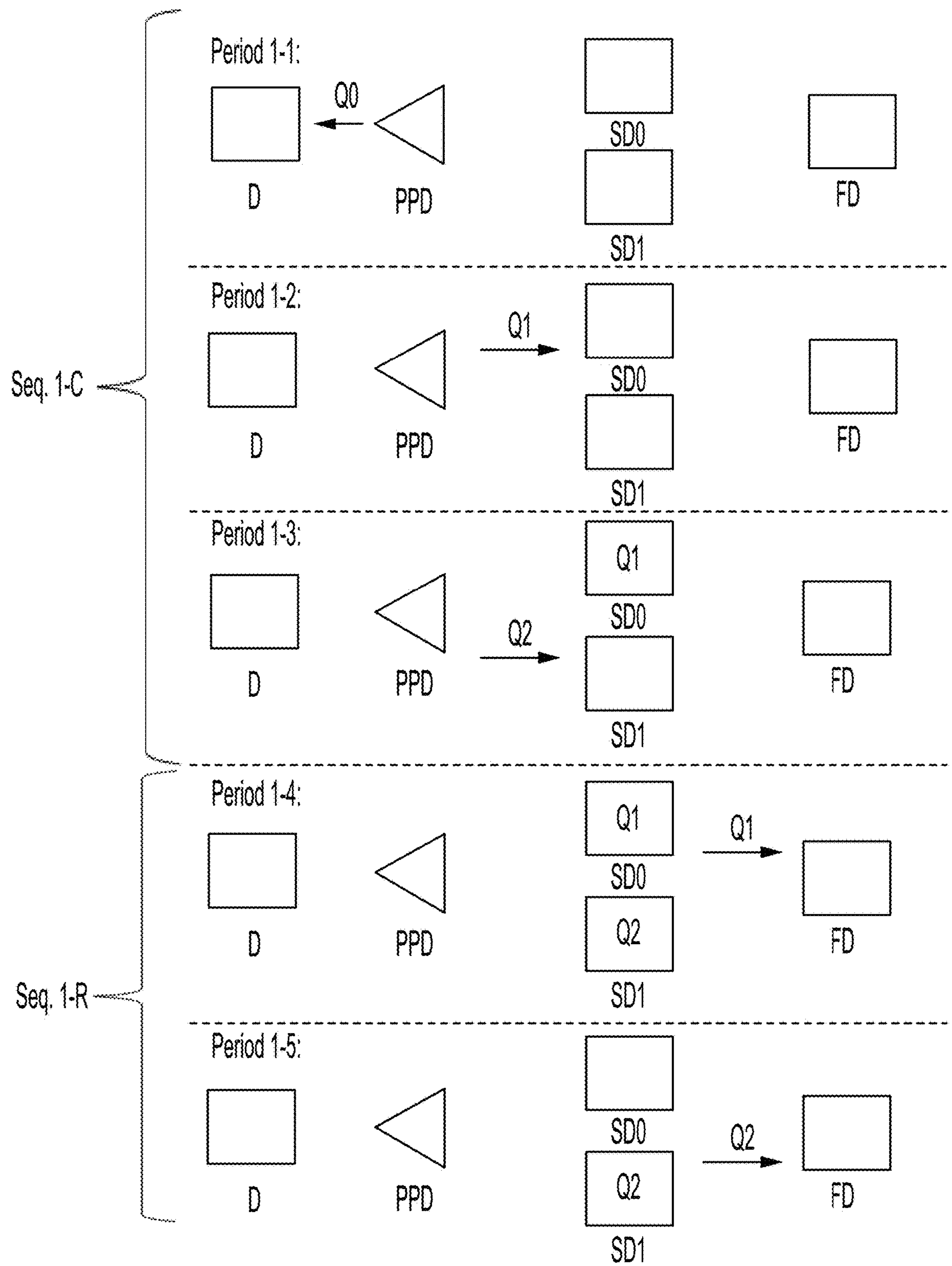
FIG. 9 is a diagram showing example charge transfer in the pixel of FIG. 2, according to some embodiments.

FIG. 9 is a diagram showing example charge transfer in pixel 1-112, according to some embodiments. In some embodiments, operation of pixel 1-112 may include one or more collection sequences 1-C and one or more readout sequences 1-R. An example collection sequence 1-C is shown in FIG. 9 including a discarding period 1-1, a first collection period 1-2, and a second collection period 1-3. An example readout sequence 1-R is shown in FIG. 9 including a first readout period 1-4 and a second readout period 1-5. In some embodiments, operation of pixel 1-112 may include one or multiple iterations of collection sequence 1-C followed by one readout sequence 1-R. In some embodiments, one or more collection sequences 1-C may be coordinated with one or more excitations of samples in the sample wells 1-108. For example, a collection sequence 1-C may be performed for each excitation of the samples in the sample wells 1-108. In some embodiments, a single control circuit may be configured to control the excitation light source and operation of pixels 1-112.

In some embodiments, the discarding period 1-1 may include receiving a plurality of excitation photons at photodetection region PPD. For example, the discarding period 1-1 may occur during and/or immediately following illumination of a sample well 1-108 using a pulse of excitation light. In this example, the excitation light may reach photodetection region PPD during discarding period 1-1, causing photodetection region PPD to generate charge carriers Q0. As shown in FIG. 9, charge carriers Q0 generated during the discarding period 1-1 may be transferred to drain region D to be discarded.

In some embodiments, the first collection period 1-2 may include receiving a first plurality of fluorescent emission photons at photodetection region PPD. For example, during first collection period 1-2, fluorescent emission photons emitted from an excited sample in sample well 1-108 may reach photodetection region PPD, causing photodetection region PPD to generate charge carriers Q1. As shown in FIG. 9, charge carriers Q1 may be transferred to charge storage region SD0 during the first collection period 1-2. For example, a control circuit electrically coupled to pixel 1-112 may control the transfer of charge carriers Q1 to charge storage region SD0 during the first collection period 1-2.

In some embodiments, the second collection period 1-3 may occur in the manner described for the first collection period 1-2. For example, following the first collection period 1-1, a second plurality of fluorescent emission photons may reach photodetection region PPD, causing photodetection region PPD to generate charge carriers Q2. As shown in FIG. 9, during the second collection period 1-3, charge carriers Q2 may be transferred to charge storage region SD1. For example, the control circuit electrically coupled to pixel 1-112 may control the transfer of charge carriers Q2 to charge storage region SD1 during the second collection period 1-3.

In some embodiments, the relative timing of first and second collection periods 1-2 and 1-3 may indicate fluorescence information of the fluorescent emissions received from the sample. For example, by collecting charge carriers during a different time period following the excitation pulse, numbers of charge carriers Q1 and Q2 collected in charge storage regions SD0 and SD1, respectively, as well as differences therebetween, may indicate the fluorescence decay profile of the received fluorescent emissions.

In some embodiments, first collection period 1-2 may occur at a first time and second collection period 1-3 may occur at a second time following the first time. For example, first collection period 1-2 may start at the first time and second collection period may start at the second time following the first time. As shown in FIG. 9, second collection period 1-3 may start after the termination of first collection period 1-2. Alternatively, first and second collection periods 1-2 and 1-3 may start at different times and at least partially overlap in time. For example, first and second collection periods 1-2 and 1-3 may be offset by a time difference shorter than the duration of first collection period 1-2. As one example, second collection period 1-3 may begin after the start of first collection period 1-2 and second collection period 1-3 may end after the termination of first collection period 1-2, with first and second collection periods having the same or substantially the same durations. Alternatively, first and second collection periods 1-2 and 1-3 may terminate at the same or substantially the same time. In some embodiments, comparing the number of charge carriers Q2 collected in charge storage region SD1 to the number of charge carriers Q1 collected in charge storage region SD0 (e.g., as a ratio), and/or vice versa, may indicate characteristics of the fluorescence decay curve of the sample.

In some embodiments, the control circuit electrically coupled to pixel 1-112 may be configured to control collection sequence 1-C in response to a single excitation of samples in sample wells 1-108. For example, in response to a single excitation, the control circuit may be configured to control a transfer of charge carriers Q0 to drain region D during discarding period 1-1, followed by a transfer of charge carriers Q1 to charge storage region SD0 during first collection period 1-2, followed by a transfer of charge carriers Q2 to charge storage region SD1 during second collection period 1-3. In some embodiments, collection sequence 1-C may be repeated multiple times in response to multiple respective excitation pulses. For example, charge carriers Q1 may be accumulated in charge storage region SD0 over the course of multiple first collection periods 1-2 and charge carriers Q2 may be accumulated in charge storage region SD1 over the course of multiple second collection periods 1-3. In some embodiments, the collection sequence 1-C may be synchronized to occur at the same time for each pixel of an array, subarray, row, and/or column of the integrated device 1-102.

In some embodiments, the first readout period 1-4 may occur following one or more collection sequences 1-C during which charge carriers Q1 are accumulated in charge storage region SD0. As shown in FIG. 9, during the first readout period 1-2, charge carriers Q1 stored in charge storage region SD0 may be transferred to readout region FD to be read out for processing. In some embodiments, the readout period 1-2 may be performed using correlated double sampling (CDS) techniques. For example, a first voltage of readout region FD may be read out at a first time, followed by a reset of the readout region FD (e.g., by applying a reset signal to transfer gate RST) and the transfer of charge carriers Q1 from charge storage region SD0 to readout region FD, and a second voltage of readout region FD may be read out at a second time following the transfer of charge carriers Q1. In this example, the difference between the first and second voltages may indicate a quantity of charge carriers Q1 transferred from charge storage region SD0 to readout region FD. In some embodiments, the first readout period 1-2 may occur at a different time for each row, column, and/or pixel of an array. For example, by reading out pixels one row or column at a time, a single processing line may be configured to process readout of each row or column in sequence rather than dedicating a processing line to each pixel to read out simultaneously. In other embodiments, each pixel of an array may be configured to read out at the same time, as a processing line may be provided for each pixel of the array. According to various embodiments, charge carriers read out from the pixels may indicate fluorescence intensity, lifetime, spectral, and/or other such fluorescence information of the samples in the sample wells 1-108.

In some embodiments, the second readout period 1-5 may be performed in the same manner as described herein for first readout period 1-4, except that charge carriers Q2 stored in charge storage region SD1 may be transferred to readout region FD. Although FIG. 9 shows a readout sequence 1-R in which charge storage region SD0 is read out before charge storage region SD1, it should be appreciated that embodiments are not so limited, as charge storage regions may be read out in any suitable order. In addition, it should be appreciated that some embodiments may include multiple readout regions, allowing readout of multiple charge storage regions that at least partially overlap in time.

While FIG. 9 illustrates integrated device operation using multiple charge storage regions, it should be appreciated that pixels of integrated devices described herein may include any number and/or arrangement of charge storage regions. For example, one charge storage region may be included per pixel. As another example, a pixel may include a second charge storage region electrically coupled sequentially between a first charge storage region and the readout region, with transfer channels electrically coupling the first charge storage region to the second charge storage region and the second charge storage region to the readout region. In this example, transfer gates may be configured to control the transfer of charge carriers from the first charge storage region to the second charge storage region and from the second charge storage region to the readout region, respectively.

Figure 10:
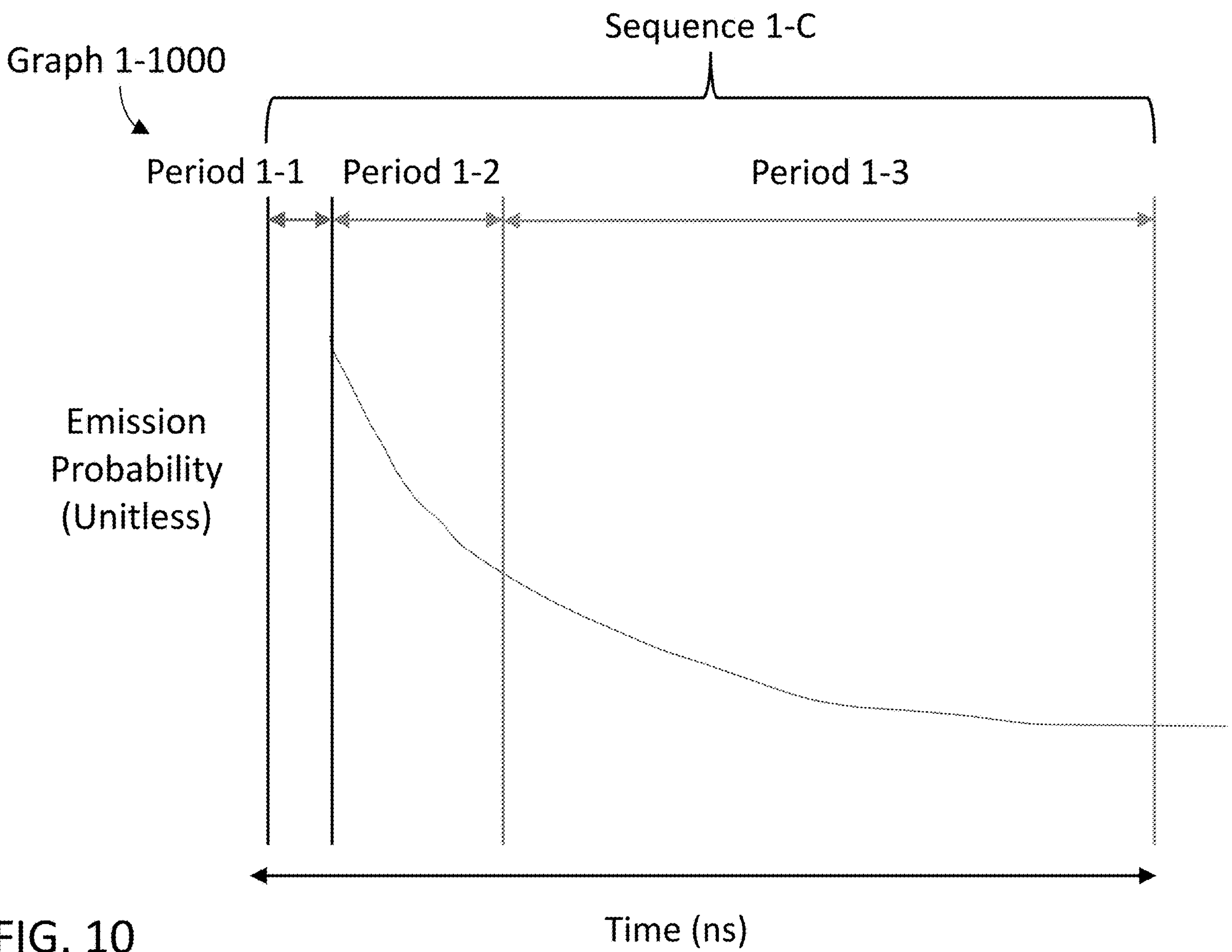
FIG. 10 is a graph of fluorescence emission probability over time during a collection sequence in the pixel of FIG. 2, according to some embodiments.

FIG. 10 is a graph 1-1000 of fluorescence emission probability over time during a collection sequence in pixel 1-112, according to some embodiments. As shown in FIG. 10, graph 1-1000 is divided in time among discarding period 1-1, first collection period 1-2, and second collection period 1-3. In some embodiments, discarding period 1-1 may have a duration of 1 nanosecond (ns), first collection period 1-2 may have a duration of 2 ns, and second collection period 1-3 may have a duration of 8 ns. In some embodiments, second collection period may have a duration of 10 ns and start at the same time as first collection period 1-2.

As shown in FIG. 10, the fluorescence emission probability is substantially zero during discarding period 1-1. Accordingly, substantially all charge carriers Q0 generated in photodetection region PPD during discarding period 1-1 may be due to excitation light. Also shown in FIG. 10. The fluorescence emission probability decays substantially exponentially during collection periods 1-2 and 1-3. In some embodiments, the number of charge carriers Q1 stored in charge storage region SD0 may correspond to an integral of the fluorescence emission probability over the first collection period 1-2, and the number of charge carriers Q2 stored in charge storage region SD1 may correspond to an integral of the fluorescence emission probability over the second collection period 1-3.

VIII. Multiple Drain Transfer Gate Techniques

Figure 11:
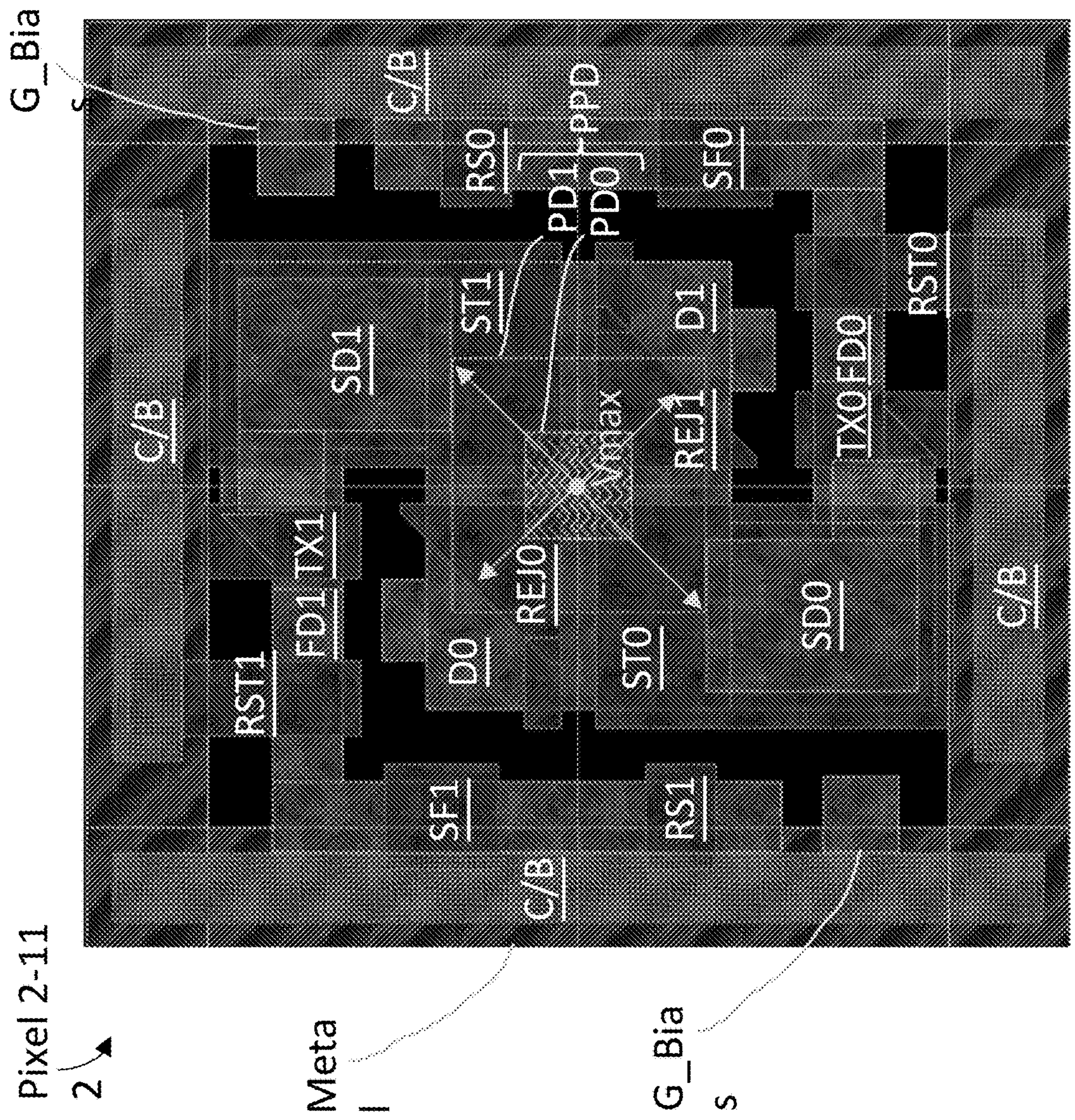
FIG. 11 is a layout sketch of an example pixel having a plurality of drain transfer gates and readout paths, which may be included in the integrated device of FIG. 1, according to some embodiments.

FIG. 11 is a layout sketch of an example pixel 2-112, which may be included in integrated device 1-102, according to some embodiments. In some embodiments, pixel 2-112 may be configured in the manner described herein for pixel 1-112. For example, as shown in FIG. 11, pixel 2-112 includes a photodetection region PPD, charge storage regions SD0 and SD1, and transfer gates ST0 and ST1, as well as C/B regions.

In some embodiments, pixel 2-112 may include multiple transfer gates configured to control charge carrier transfer in different directions from photodetection region PPD to one or more drain regions. For example, as shown in FIG. 11, pixel 2-112 includes transfer gates REJ0 and REJ1 and drain regions D0 and D1. In some embodiments, transfer gates REJ0 may be configured to control the transfer of charge carriers from photodetection region PPD to drain region D0 in one direction and transfer gate REJ1 may be configured to control the transfer of charge carriers from photodetection region PPD to drain region D1 in another, at least partially opposite direction. For example, as shown in FIG. 11, transfer gate REJ0 is positioned on a first side of photodetection region PPD and transfer gate REJ1 is positioned on a second side of photodetection region PPD opposite transfer gate REJ0.

In some embodiments, transfer gates ST0, ST1, REJ0, and REJ1 may be configured to control charge carrier transfer in different directions. For example, transfer gates ST0 and ST1 may be configured to control charge carrier transfer from the photodetection region to charge storage regions SD0 and SD1, respectively, in at least partially opposite directions from one another and that are different from the directions in which transfer gates REJ0 and REJ1 are configured to control charge carrier transfer. In some embodiments, transfer gates ST0 and ST1 may be configured to control charge carrier transfer in directions that are perpendicular to the directions in which transfer gates REJ0 and REJ1 are configured to control charge carrier transfer. In some embodiments, transfer gates ST0, ST1, REJ0, and REJ1 may be configured to direct charge carriers in different directions out of the focal volume Vmax in sub-region PD0 of photodetection region PPD, such as in the manner described herein for pixel 1-112.

Also as shown in FIG. 11, pixel 2-112 may include a metal shield. In some embodiments, the C/B regions may be positioned, in the first direction, after the metal shield. For example, as shown in FIG. 11, the metal shield may overlap, at least in part, with the C/B regions of pixel 2-112.

While FIG. 11 shows pixel 2-112 including multiple drain regions D0 and D1, it should be appreciated that transfer gates REJ0 and REJ1 may be alternatively configured to control the transfer of charge carriers from photodetection region PPD to a single drain region (e.g., with portions positioned on multiple sides of photodetection region PPD).

In some embodiments, pixel 2-112 may include multiple readout regions. For example, as shown in FIG. 11, pixel 2-112 includes readout regions FD0 and FD1, as well as transfer gates RST0 and RST1, SF0 and SF1, and RS0 and RS1.

In some embodiments, pixel 2-112 may have an at least partially symmetrical layout with respect to focal volume Vmax. For example, transfer gates, drain regions, charge storage regions, and readout regions of pixel 2-112 may be disposed about focal volume Vmax with odd symmetry. For instance, as shown in FIG. 11, if pixel 2-112 is rotated 180 degrees about focal volume Vmax, transfer gate REJ0, ST0, TX0, RST0, SF0, RS0, drain region D0, charge storage region SD0, and readout region FD0 lie substantially in place of transfer gates REJ1, ST1, TX1, RST1, SF1, RS1, drain region D1, charge storage region SD1, and readout region FD1.

Figure 12:
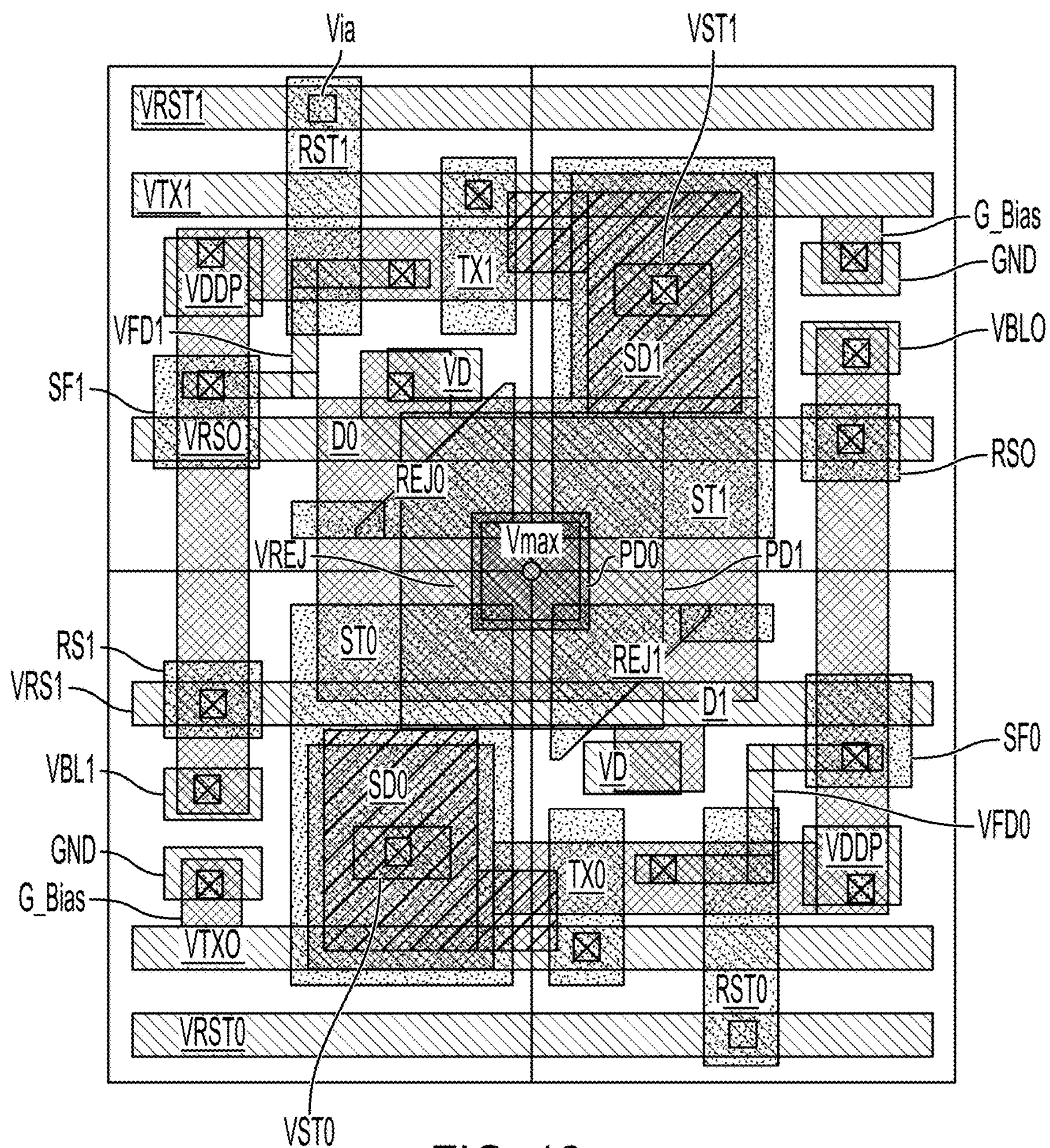
FIG. 12 is a layout sketch of the pixel of FIG. 11 further illustrating metal lines connected to the pixel, according to some embodiments.

FIG. 12 is a layout sketch of pixel 2-112 further illustrating metal lines connected to pixel 2-112, according to some embodiments. In some embodiments, pixel 2-112 may be electrically coupled to metal lines (e.g., 1-240 in FIG. 2) of integrated device 1-102. In some embodiments, a control circuit may be configured to provide control signals and/or bias voltages to pixel 2-112 via the metal lines to operate pixel 2-112. While not shown for pixel 1-112, it should be appreciated that similarly configured metal lines may be connected to pixel 1-112.

In some embodiments, metal lines of integrated device 1-102 may be configured to provide power supply and/or bias voltages for operating pixel 2-112. For example, as shown in FIG. 12, the metal lines include line VD, which may be configured to provide a power supply voltage for discarding charge carriers transferred to drain regions D0 and D1. As shown in FIG. 12, drain regions D0 and D1 are connected to VD lines by vias. As another example shown in FIG. 12, the metal lines include line VDDP, which may be configured to provide a power supply voltage for resetting the sampling voltage of readout regions FD0 and FD1 via transfer gates RST0 and RST1, respectively. In FIG. 12, the side of transfer gate RST0 opposite readout region FD0 and the side of transfer gate RST1 opposite readout region FD1 connected to VDDP lines by vias. As another example shown in FIG. 12, the metal lines include line GND, which may be configured to provide a power supply voltage for biasing region G_Bias of pixel 2-112. As shown in FIG. 12, region G_Bias is connected to line GND by a via.

In some embodiments, metal lines of integrated device 1-102 may be configured to transfer charge carriers to other portions of integrated device 1-102. For example, as shown in FIG. 12, the metal lines include lines VFD0 and VFD1, which may be configured to transfer charge carriers from readout regions FD0 and FD1 to transfer gates SF0 and SF1, respectively. As shown in FIG. 12, readout regions FD0 and FD1 and transfer gates SF0 and SF1 are connected to lines VFD0 and VFD1, respectively, by vias. Also shown in FIG. 12, the metal lines include bitlines VBL0 and VBL1, which may be configured to transfer charge carriers read out from pixel 2-112 to another portion of integrated device 1-102 for processing, such as via one or more ADCs.

In some embodiments, metal lines of integrated device 1-102 may be configured to carry control signals for operating pixel 2-112. For example, as shown in FIG. 12, the metal lines include lines VREJ, VST0, and VST1. In some embodiments, line VREJ may be configured to carry a control signal for biasing transfer gates REJ0 and REJ1 to transfer charge carriers from photodetection region PPD to drain regions D0 and D1, respectively. For instance, the control circuit may be configured to control transfer gates REJ0 and REJ1 to transfer charge carriers substantially simultaneously by providing the same control signal VREJ. For example, as shown in FIG. 12, transfer gates REJ0 and REJ1 are connected to line VREJ by vias. It should be appreciated that different control signals may be provided to transfer gates REJ0 and REJ1 and/or transfer gates REJ0 and REJ1 may be configured to control charge carrier transfer at different times, as embodiments described herein are not so limited.

In some embodiments, lines VST0 and VST1 may be configured to carry control signals for biasing transfer gates ST0 and ST1 to transfer charge carriers from photodetection region PPD to charge storage regions SD0 and SD1, respectively. For example, as shown in FIG. 12, transfer gates ST0 and ST1 are connected to lines VST0 and ST1, respectively, by vias.

Similarly, as shown in FIG. 12, the metal lines include lines VTX0 and VTX1, which may be configured to carry control signals for biasing transfer gates TX0 and TX1 to transfer charge carriers from charge storage regions SD0 and SD1 to readout regions FD0 and FD1, respectively. For example, as shown in FIG. 12, transfer gates TX0 and TX1 are connected to lines VTX0 and VTX1, respectively, by vias. As another example shown in FIG. 12, the metal lines include lines VRST0 and VRST1, which may be configured to carry control signals for biasing transfer gates RST0 and RST1 to reset the sampling voltage of readout regions FD0 and FD1, respectively. For example, as shown in FIG. 12, transfer gates RST0 and RST are connected to lines VRST0 and VRST1, respectively, by vias. As another example shown in FIG. 12, the metal lines include lines VRS0 and VRS1, which may be configured to carry control signals for biasing transfer gates RS0 and RS1 to read out charge carriers via transfer gates SF0 and SF1 to bitlines VBL0 and VBL1, respectively. For example, as shown in FIG. 12, transfer gates RS0 and RS1 are connected to lines VRS0 and VRS1, respectively, by vias.

In some embodiments, pixel 2-112 may include multiple charge readout paths. For example, a first charge readout path of pixel 2-112 may include readout region FD0, transfer gates SF0 and RS0, and bitline VBL0. For example, transfer gate TX0 may be configured to transfer charge carriers stored in charge storage region SD0 (e.g., Q1 in FIG. 9) to readout region FD0. In this example, transfer gate SF may be configured to transfer charge carriers from readout region FD0 toward transfer gate RS0 for reading out to bitline VBL0. Transfer gate RST0 may be configured to reset the sampling voltage of readout region FD0 as described herein for transfer gate RST of pixel 1-112. Similarly, a second charge readout path of pixel 2-112 may include readout region FD1, transfer gates SF1 and RS1, and bitline VBL1. For example, the second charge readout path may be configured, in the manner described for the first readout path, to read out charge carriers stored in charge storage region SD1 (e.g., Q2 in FIG. 9) to bitline VBL1.

In some embodiments, pixel 2-112 may be configured to read out charge carriers from charge storage regions SD0 and SD1, at least in part, at substantially the same time. For example, readout region FD0 may be configured to receive charge carriers from charge storage region SD0, at least in part, while readout region FD1 is configured to receive charge carriers from charge storage region SD1.

The inventors recognized that it may be desirable, in some applications, to control charge carrier transfer using a transfer gate positioned closer to a focal volume of a pixel before using a transfer gate positioned farther from the focal volume of the pixel. In some embodiments, a first transfer gate may be positioned closer to the focal volume than is a second transfer gate, and a control circuit electrically coupled to integrated device 1-102 may be configured to control a first charge carrier transfer using the first transfer gate at a first time following a single excitation and a second charge carrier using the second transfer gate at a second time following the first time. For example, in FIG. 12, transfer gate ST0 may be positioned closer to focal volume Vmax than transfer gate ST1 is. In this example, the control circuit electrically connected to pixel 2-112 may be configured to control a first charge carrier transfer to charge storage region SD0 at a first time (e.g., first collection period 1-2 in FIG. 9) and a second charge carrier transfer to charge storage region SD1 at a second time (e.g., second collection period 1-3 in FIG. 9).

The inventors further recognized that it may be desirable to determine, which, if any, of multiple transfer gates of a pixel is positioned closer to the focal volume of the photodetection region of the pixel than at least one other transfer gate is. For instance, manufacturing imprecision may result in transfer gates of pixel 2-112 being offset from their desired position(s), such as by tens of nm (e.g., +/−20 nm, 30 nm, 40 nm, and/or 50 nm). In some cases, manufacturing imprecision may cause some or all transfer gates REJ0, REJ1, ST0, and/or ST1 of pixel 2-112 to be offset substantially in the same direction and by substantially the same distance as one another. As a result, one of transfer gates REJ0 and REJ1 and/or one of transfer gates ST0 and ST1 may be closer to focal volume Vmax than the other. In some embodiments, the control circuit may be further configured to, in response to determining that a first transfer gate is positioned closer to the focal volume than a second transfer gate is, select the first transfer gate for a first charge carrier transfer at a first time following excitation of a sample and select the second transfer gate for a second charge carrier transfer at a second time following the first time. For example, in FIG. 12, the control circuit electrically coupled to pixel 2-112 may be configured to determine that transfer gate ST0 is positioned closer to focal volume Vmax than is transfer gate ST1 and, in response, select charge storage region SD0 for a first charge carrier transfer and select charge storage region SD1 for a second charge carrier transfer.

In some embodiments, a single transfer gate selection may be used to operate an entire integrated device (e.g., for control signals VST0 and VST1 used throughout an integrated device). In some embodiments, a transfer gate selection may be used to operate only a portion of an integrated device (e.g., a quadrant of a rectangular array, where each quadrant receives its own control signals VST0 and VST1). In some embodiments, transfer gate positioning determination and/or selection may be performed during production of integrated device 1-102. Alternatively or additionally, in some embodiments, transfer gate positioning determination and/or selection may be performed as part of a calibration procedure when integrated device 1-102 is powered on (e.g., initially and/or each time).

It should be appreciated that, in some embodiments, transfer gates ST0 and ST1 and/or charge storage regions SD0 and SD1 may be substantially functionally interchangeable, allowing whichever of transfer gates ST0 and ST1 is determined to be closest to focal volume Vmax to be considered transfer gate ST0 and the other to be considered transfer gate ST1. It should also be appreciated that additional transfer gates and/or charge storage regions may be used with such techniques, such as to select a second-closest transfer gate for charge carrier transfer prior to a third closest transfer gate, and so on, as embodiments are not so limited.

Figure 13:
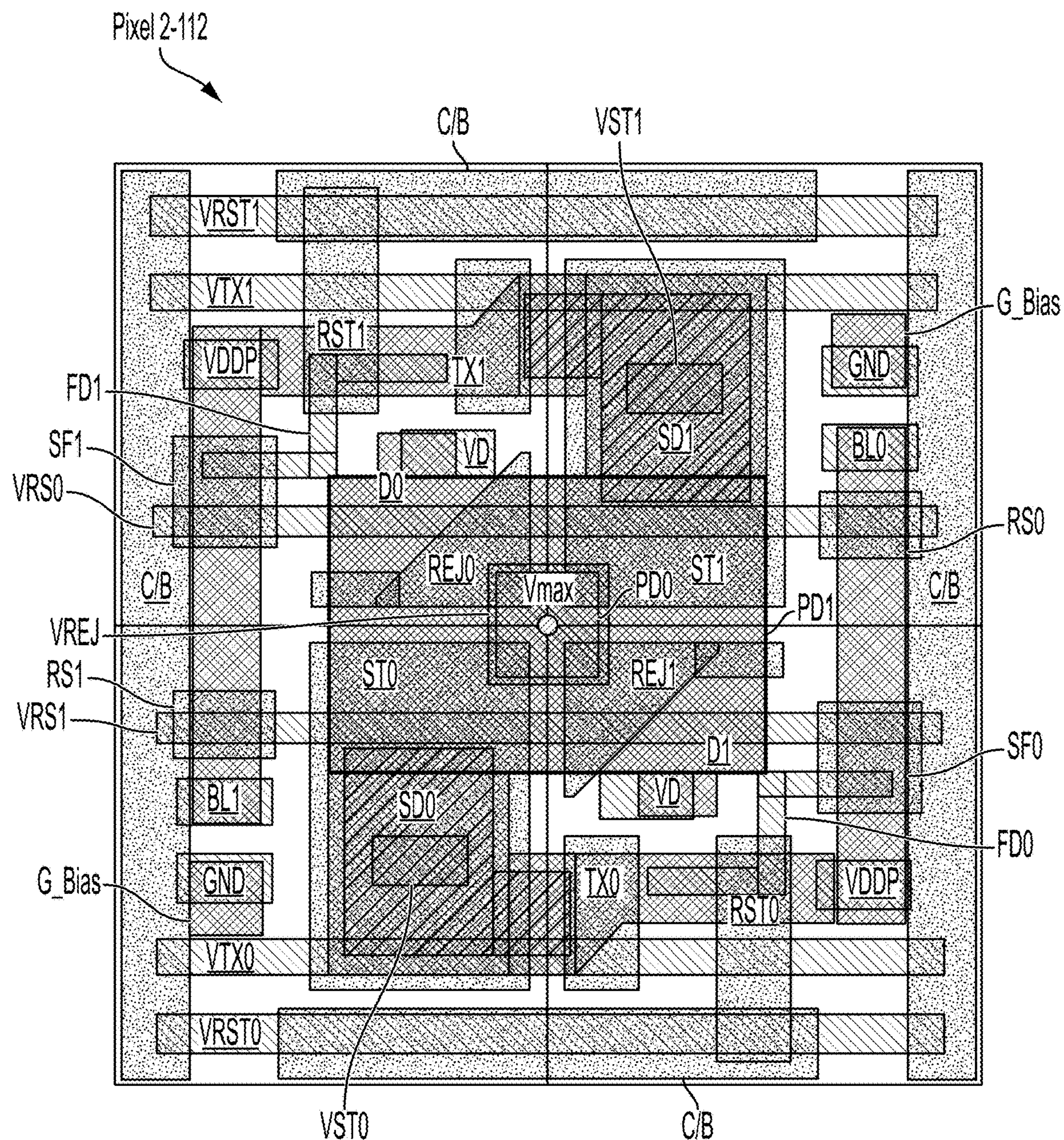
FIG. 13 is a layout sketch of the pixel of FIG. 11 further illustrating the metal lines and charged and/or biased (C/B) regions of the pixel, according to some embodiments.
Figure 14:
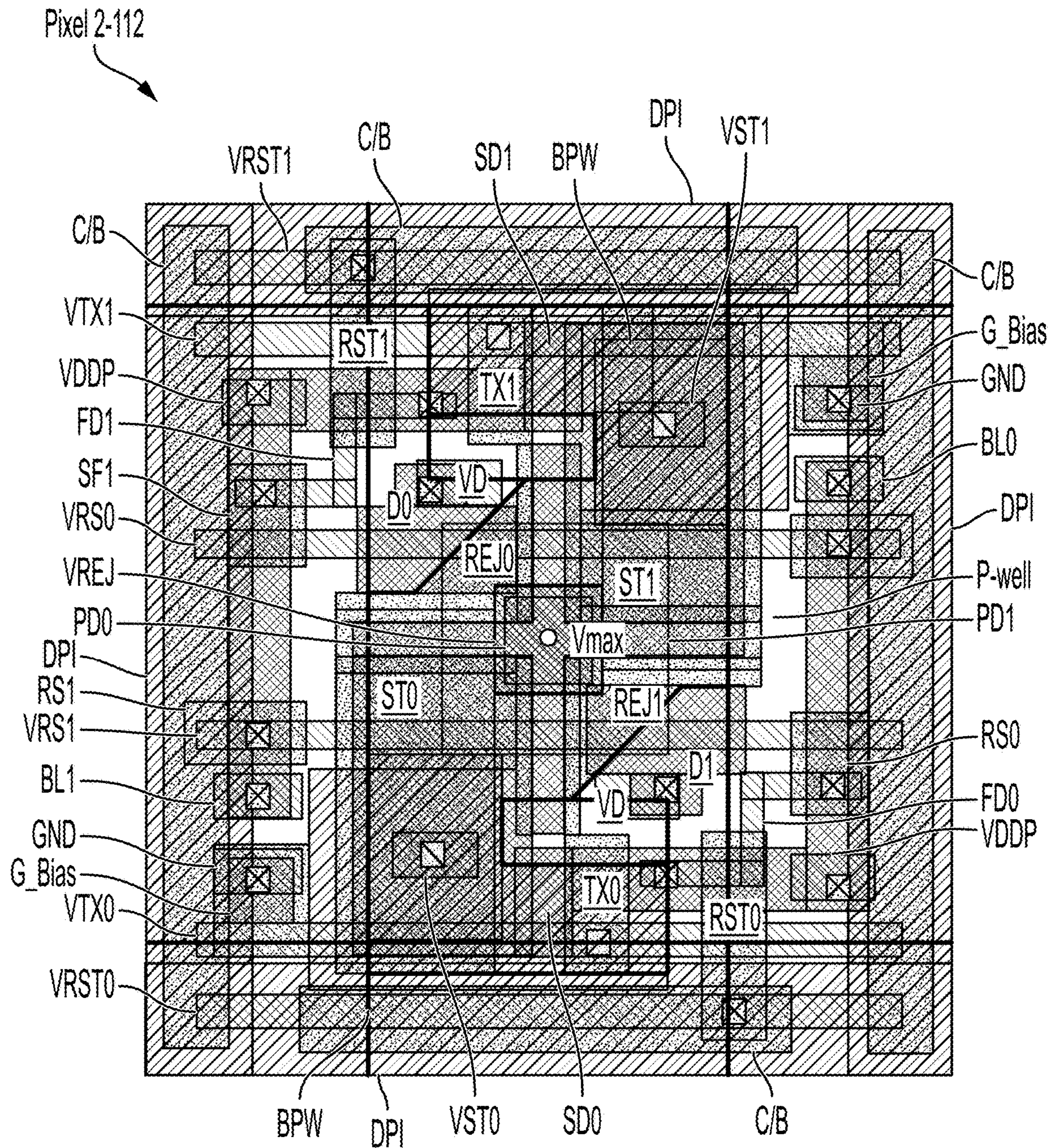
FIG. 14 is a layout sketch of the pixel of FIG. 11 further illustrating multiple barriers in the pixel, according to some embodiments.

FIG. 13 is a layout sketch of pixel 2-112 further illustrating the metal lines and C/B regions, according to some embodiments. FIG. 14 is a layout sketch of pixel 2-112 further illustrating barriers DPI and BPW and the P-well, according to some embodiments.

Figure 15:
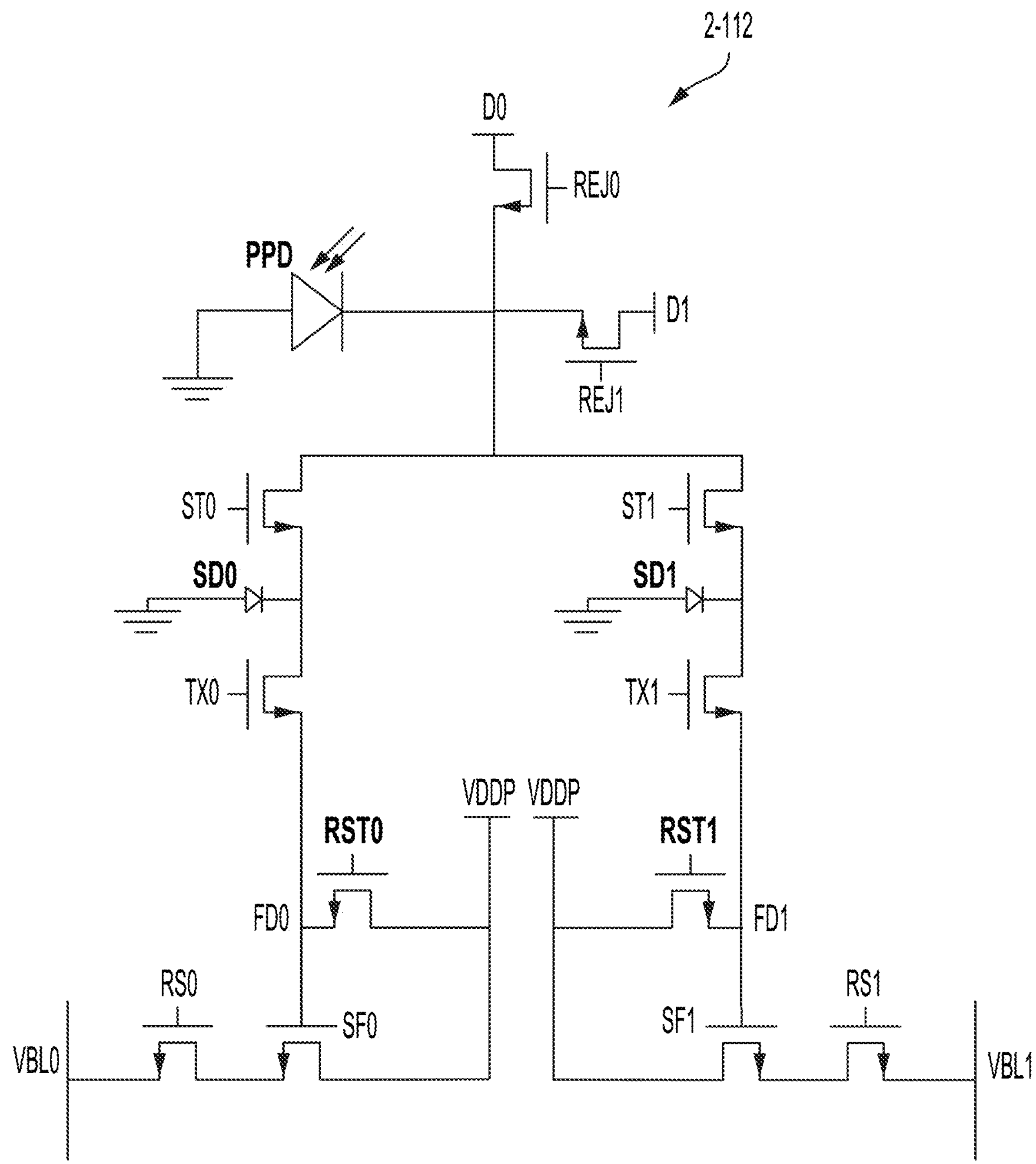
FIG. 15 is a circuit diagram of the pixel of FIG. 11, according to some embodiments.

FIG. 15 is a circuit diagram of pixel 2-112, according to some embodiments. In FIG. 15, transfer gate REJ0 is the gate of a transistor coupling photodetection region PPD to drain region D0 and transfer gate REJ1 is the gate of a transistor coupling photodetection region PPD to drain region D1. Also shown in FIG. 15, transfer gate RST0 is the gate of a transistor coupled to readout region FD0 and configured to receive a power supply voltage from line VDDP, and transfer gate RST1 is the gate of a transistor coupled to readout region FD1 and configured to receive a power supply voltage from line VDDP. Also shown in FIG. 15, transfer gate RS0 is the gate of a transistor configured for coupling to bitline VBL0, and transfer gate RS1 is the gate of a transistor configured for coupling to bitline VBL1. Also shown in FIG. 15, transfer gate SF0 is the gate of a source-follower transistor that is coupled to the transistor having transfer gate RS0 and configured to receive the power supply voltage from line VDDP, and transfer gate SF1 is the gate of a source-follower transistor that is coupled to the transistor having transfer gate RS1 and configured to receive the power supply voltage from line VDDP.

Figure 16:
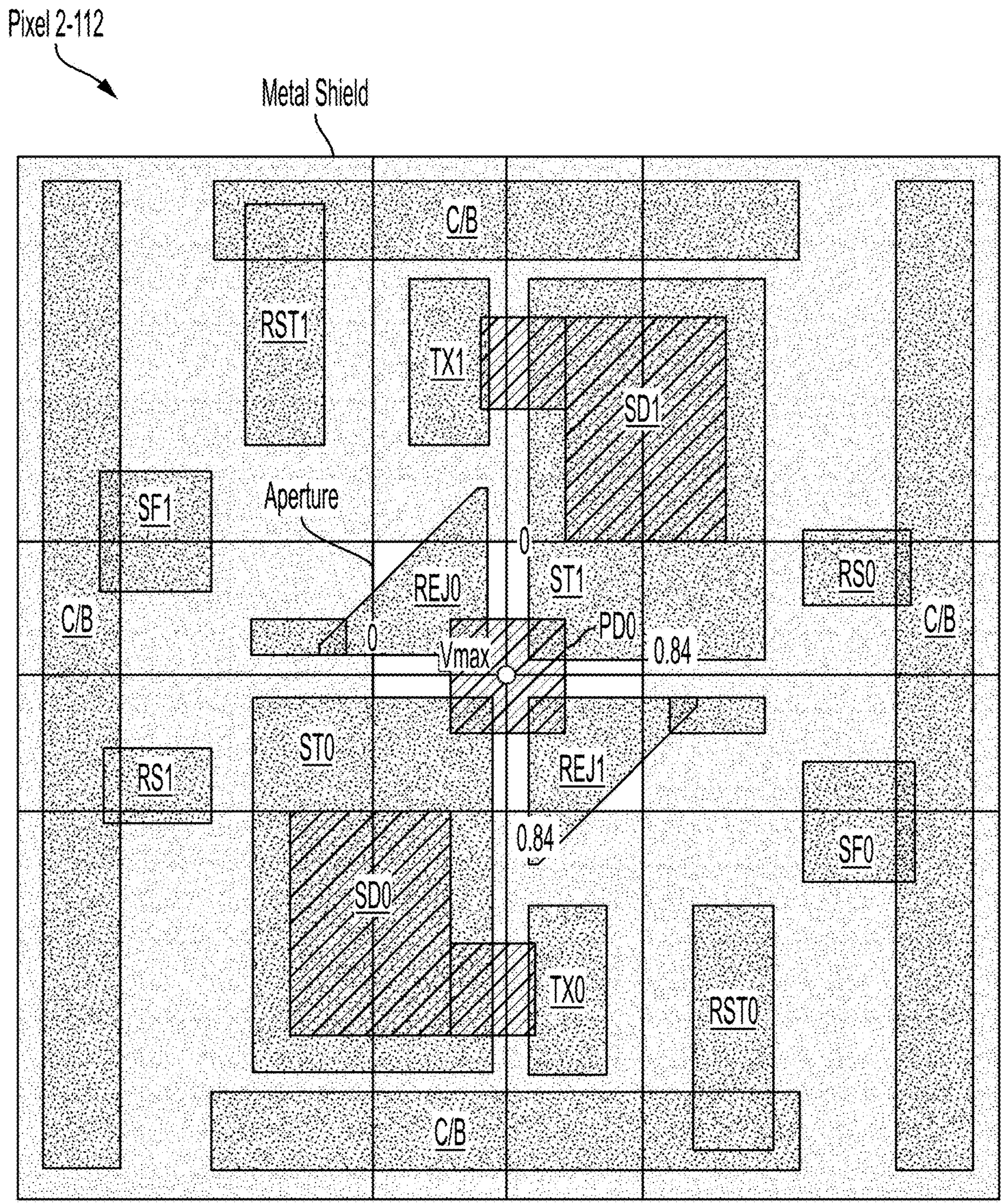
FIG. 16 is a layout sketch of the transfer gates, C/B regions, and metal shield of the pixel of FIG. 11 with respect to a focal volume of the photodetection region of the pixel, according to some embodiments.

FIG. 16 is a layout sketch of the transfer gates, C/B regions, and metal shield of pixel 2-112 with respect to focal volume Vmax of photodetection region PPD, according to some embodiments. In some embodiments, the metal shield may have an aperture configured to transmit incident photons to photodetection region PPD. For example, as shown in FIG. 16, the aperture of the metal shield may be aligned, in the first direction Dir1, with sub-region PD0 of photodetection region PPD. For instance, as shown in FIG. 16, the aperture may be centered around focal volume Vmax of photodetection region PPD.

Figures 17A, 17B:
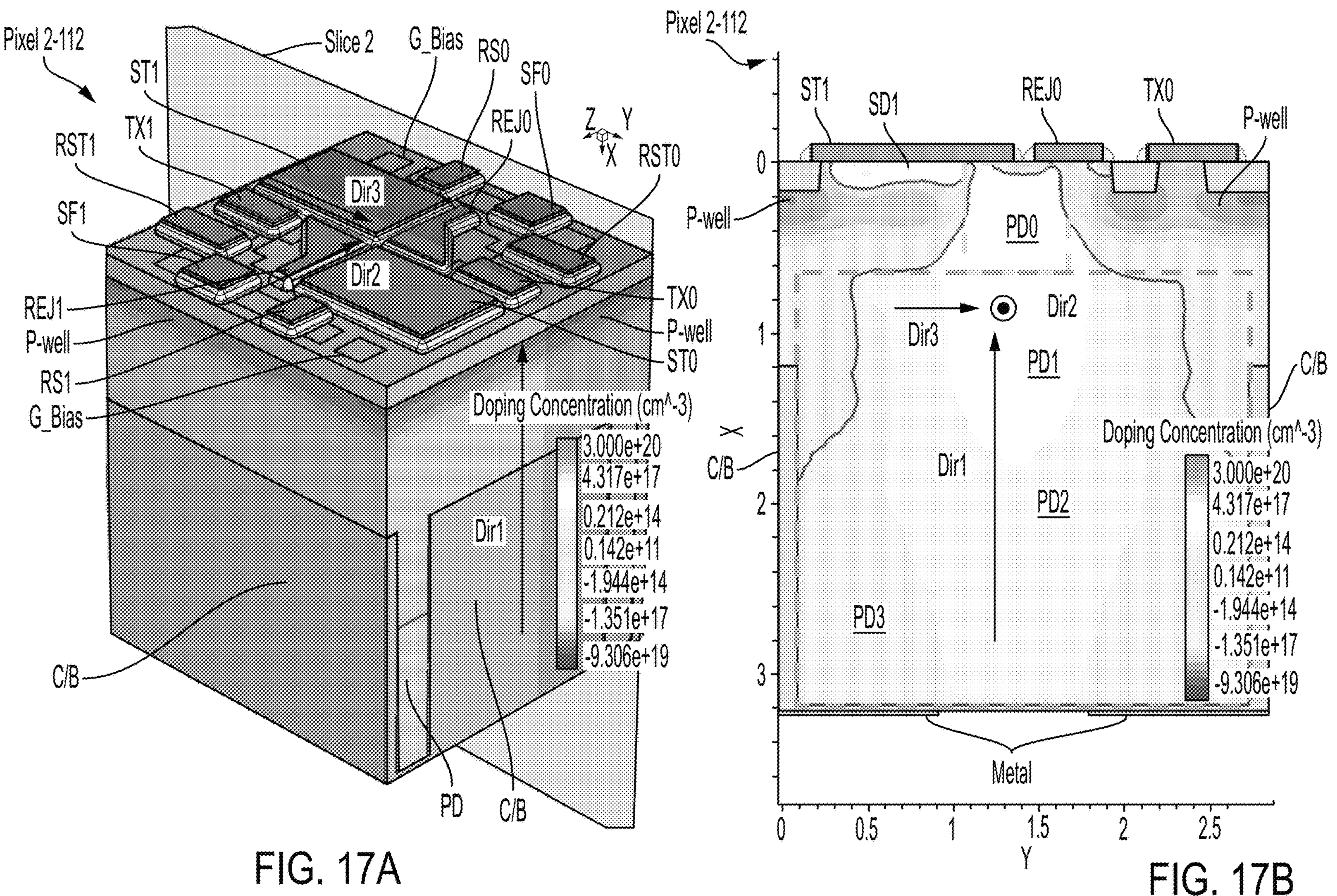
FIG. 17A is a bottom perspective view of the pixel of FIG. 11 showing dopant concentrations in the pixel, according to some embodiments.
FIG. 17B is a cross-sectional view of the pixel of FIG. 11 showing dopant concentrations in the pixel, according to some embodiments.

FIG. 17A is a bottom perspective view of pixel 2-112 showing dopant concentrations in pixel 2-112, according to some embodiments. FIG. 17B is a cross-sectional view of pixel 2-112 along Slice 2 (FIG. 17A) showing dopant concentrations in pixel 2-112, according to some embodiments. In some embodiments, photodetection region PPD may be configured to induce an intrinsic electric field, such as in the manner described herein for pixel 2-112. For example, as shown in FIG. 17B, photodetection region PPD of pixel 2-112 may include sub-regions PD0, PD1, PD2, and PD3 configured in the manner described herein for pixel 2-112.

Figure 18:
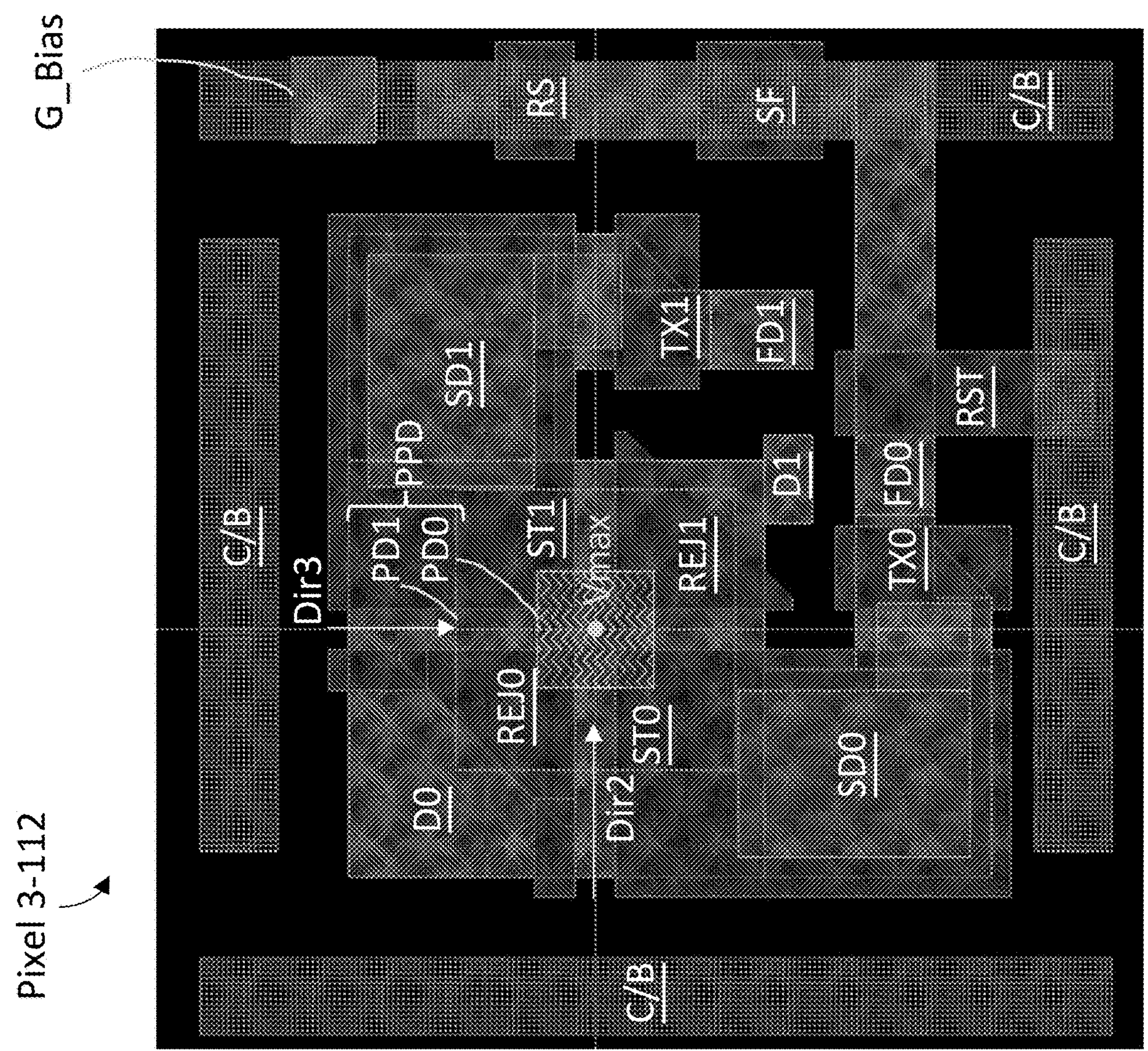
FIG. 18 is a layout sketch of an example pixel having multiple drain transfer gates and a single readout path, which may be included in the integrated device of FIG. 1, according to some embodiments.

FIG. 18 is a layout sketch of an example pixel 3-112 having multiple drain transfer gates and a single readout path, which may be included in integrated device 1-102, according to some embodiments. In some embodiments, pixel 3-112 may be configured in the manner described herein for pixel 1-112. For example, as shown in FIG. 18, pixel 3-112 includes photodetection region PPD, charge storage regions SD0 and SD1 and transfer gates ST0, ST1, TX0, TX1, RST, SF and RS. In some embodiments, pixel 3-112 may be further configured in the manner described herein for pixel 2-112. For example, as shown in FIG. 18, pixel 3-112 includes drain regions D0 and D1, transfer gates REJ0 and REJ1, and readout regions FD0 and FD1.

Figure 19:
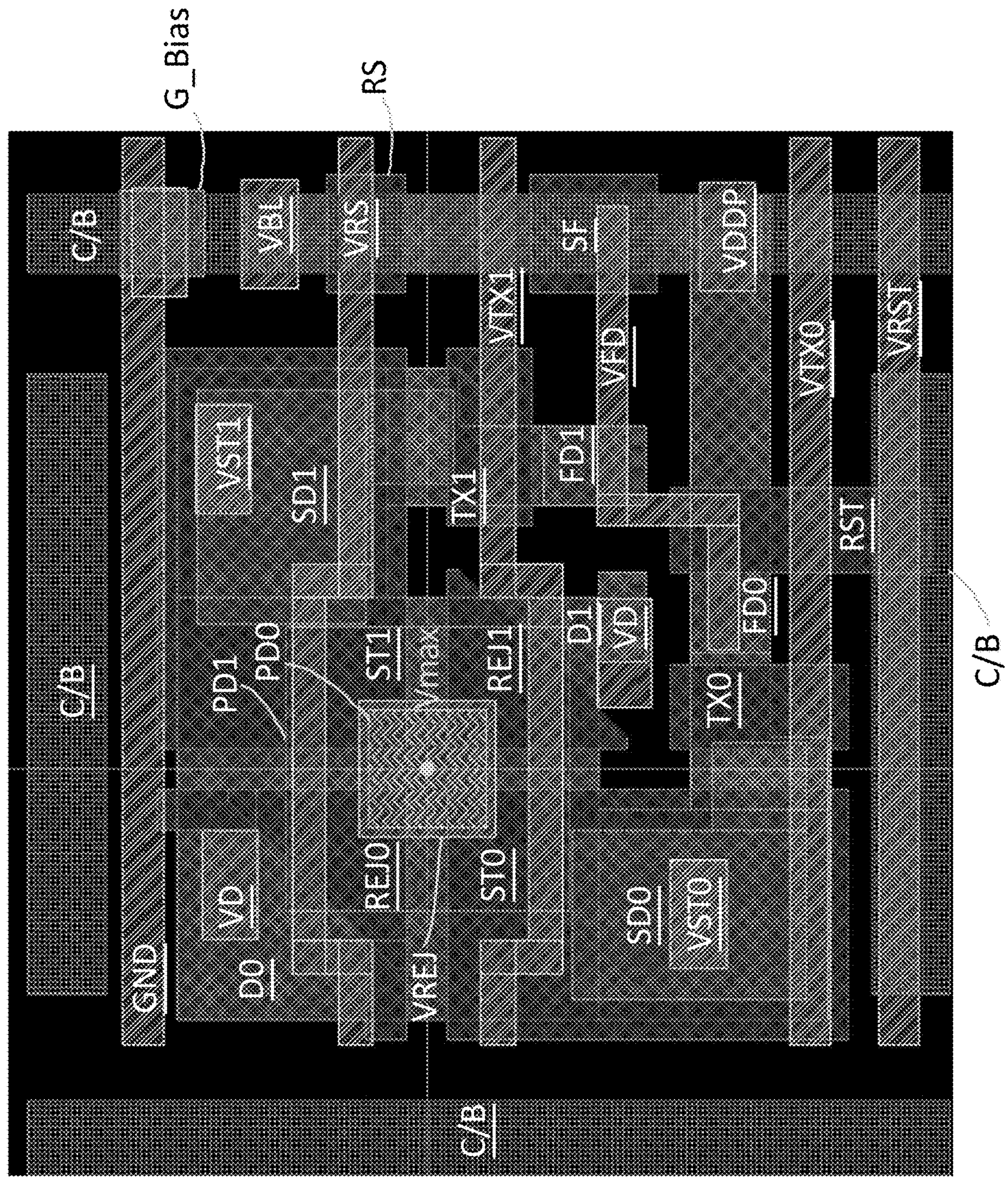
FIG. 19 is a layout sketch of the pixel of FIG. 18 further illustrating metal lines connected to the pixel, according to some embodiments.

FIG. 19 is a layout sketch of pixel 3-112 further illustrating metal lines connected to pixel 3-112, according to some embodiments. In some embodiments, the metal lines connected to pixel 3-112 may be configured in the manner described herein for pixel 2-112. For example, as shown in FIG. 19, the metal lines include lines VD, VST0, VST1, VTX0, VTX1, and VDDP. Also shown in FIG. 19, the metal lines include line VFD, which may be configured in the manner described herein for lines VFD0 and VFD1. Also shown in FIG. 19, the metal lines include line VRST, which may be configured in the manner described herein for lines VRST0 and VRST1. Also shown in FIG. 19, the metal lines include line VRS, which may be configured in the manner described herein for lines VRS0 and VRS1. Also shown in FIG. 19, the metal lines include bitline VBL, which may be configured in the manner described herein for bitlines VBL0 and VBL1.

In some embodiments, pixel 3-112 may have a single readout path configured in the manner described herein for pixel 1-112. For example, charge carriers stored in charge storage region SD0 and charge carriers stored in charge storage region SD1 may be read out via transfer gates TX0 and TX1 to readout regions FD0 and FD1, and metal line VFD may be configured to transfer charge carriers from each of readout regions FD0 and FD1 to transfer gate SF.

Figure 20:
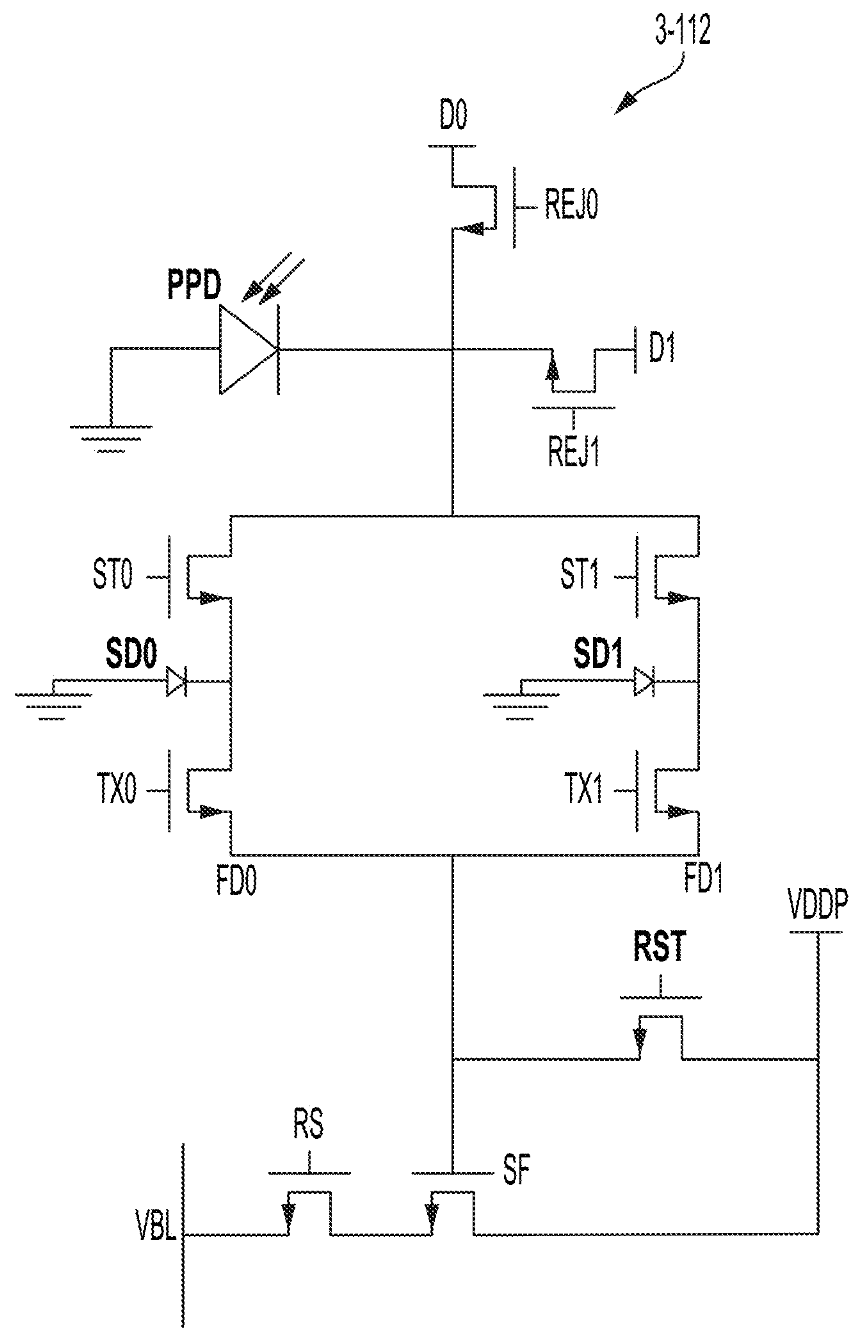
FIG. 20 is a circuit diagram of the pixel of FIG. 18, according to some embodiments.

FIG. 20 is a circuit diagram of pixel 3-112, according to some embodiments. As shown in FIG. 20, transfer gates REJ0 and REJ1 are gates of transistors, as described herein for pixel 2-112, and the transistors having transfer gates TX0 and TX1 are each coupled to readout regions FD0 and FD1, as described herein for pixel 3-112, and readout regions FD0 and FD1 are electrically coupled to one another via metal line VFD (FIG. 19).

Figure 21:
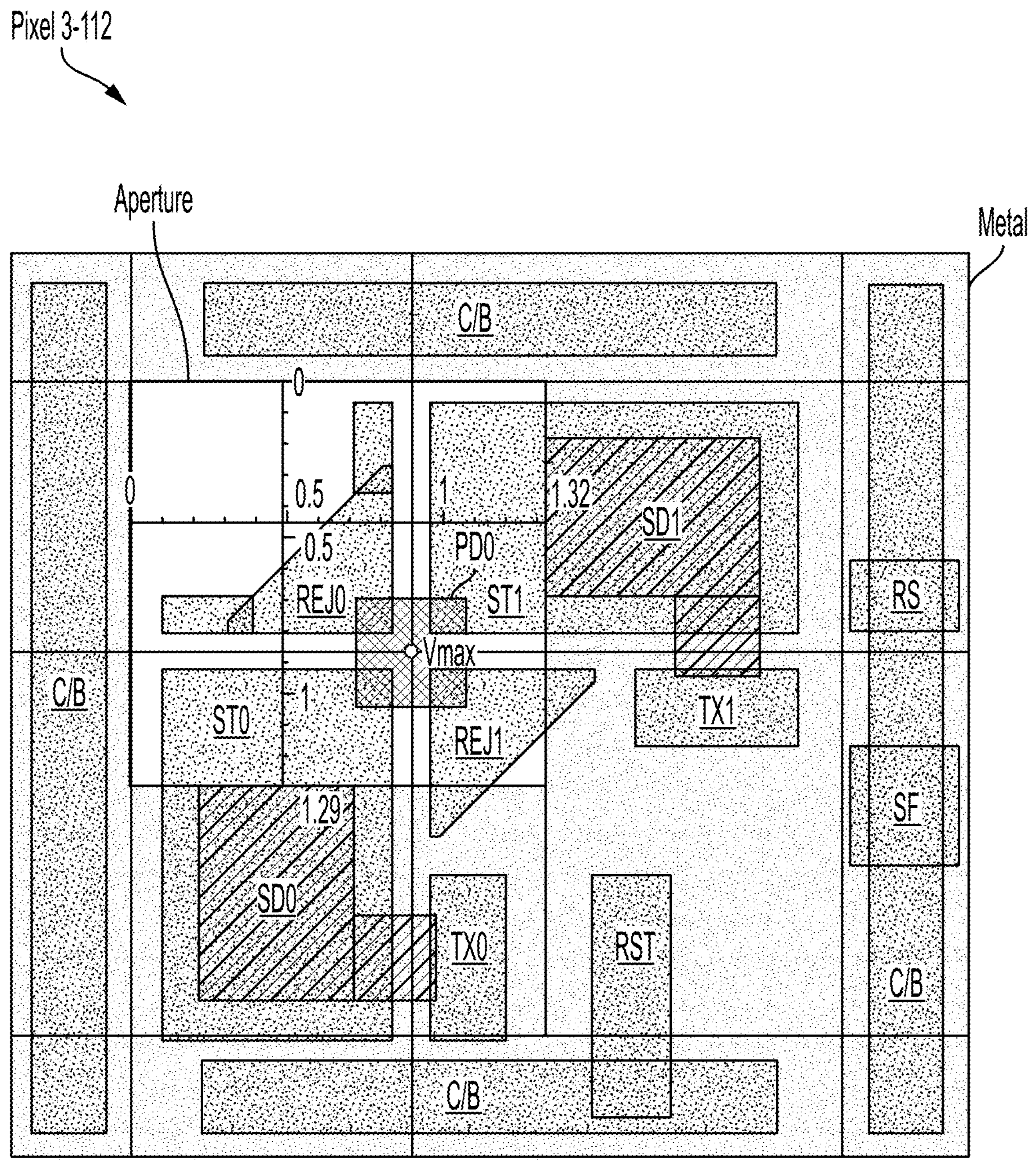
FIG. 21 is a layout sketch of the transfer gates, C/B regions, and metal shield of the pixel of FIG. 18 with respect to a focal volume of the photodetection region of the pixel, according to some embodiments.

FIG. 21 is a layout sketch of the transfer gates, C/B regions, and metal shield of pixel 3-112 with respect to focal volume Vmax of photodetection region PPD, according to some embodiments. As shown in FIG. 21, the aperture of the metal shield of pixel 3-112 may be at least partially aligned and/or at least partially offset from sub-region PD0 of photodetection region PPD. For example, as shown in FIG. 21, at least a portion of the aperture may be aligned, in the first direction Dir 1, with sub-region PD0, and the aperture may be centered at a point that is offset from focal volume Vmax of photodetection region PPD.

As described herein, photodetection region PPD may be configured to induce an intrinsic electric field to direct charge carriers toward focal volume Vmax. In some embodiments, one or more sub-regions of photodetection region PPD may be offset from one another in the second direction Dir2 and/or third direction Dir3. For instance, sub-region PD0 may be offset from sub-region PD1, PD2, and/or PD3 in the second and/or third direction Dir2 and/or third direction Dir3. As shown in FIG. 21, sub-region PD0 is at least partially offset, in the second direction Dir2 and third direction Dir3 from the aperture, and sub-region PD1, PD2, and/or PD3 may be aligned with the aperture. For instance, sub-region PD3 may be centered at a point that is aligned, in the first direction Dirt, with the point at which the aperture is centered. It should be appreciated, however, that sub-regions may not be offset from one another in either or each of the second direction Dir2 and/or third direction Dir3, as embodiments described herein are not so limited.

Figure 22:
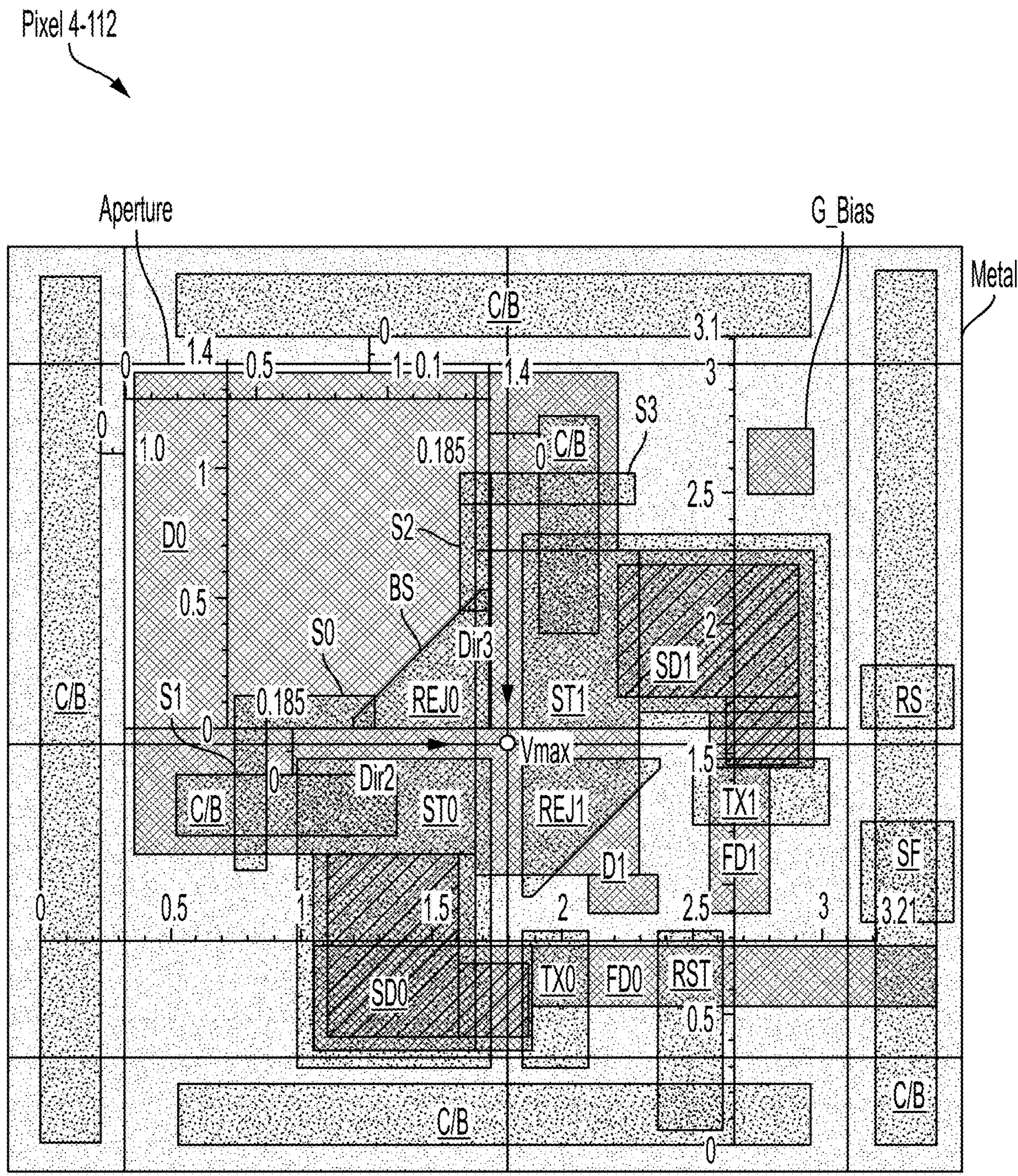
FIG. 22 is a layout sketch of an alternative example pixel having multiple drain transfer gates and a single readout path, which may be included in the integrated device of FIG. 1, according to some embodiments.
Figure 23:
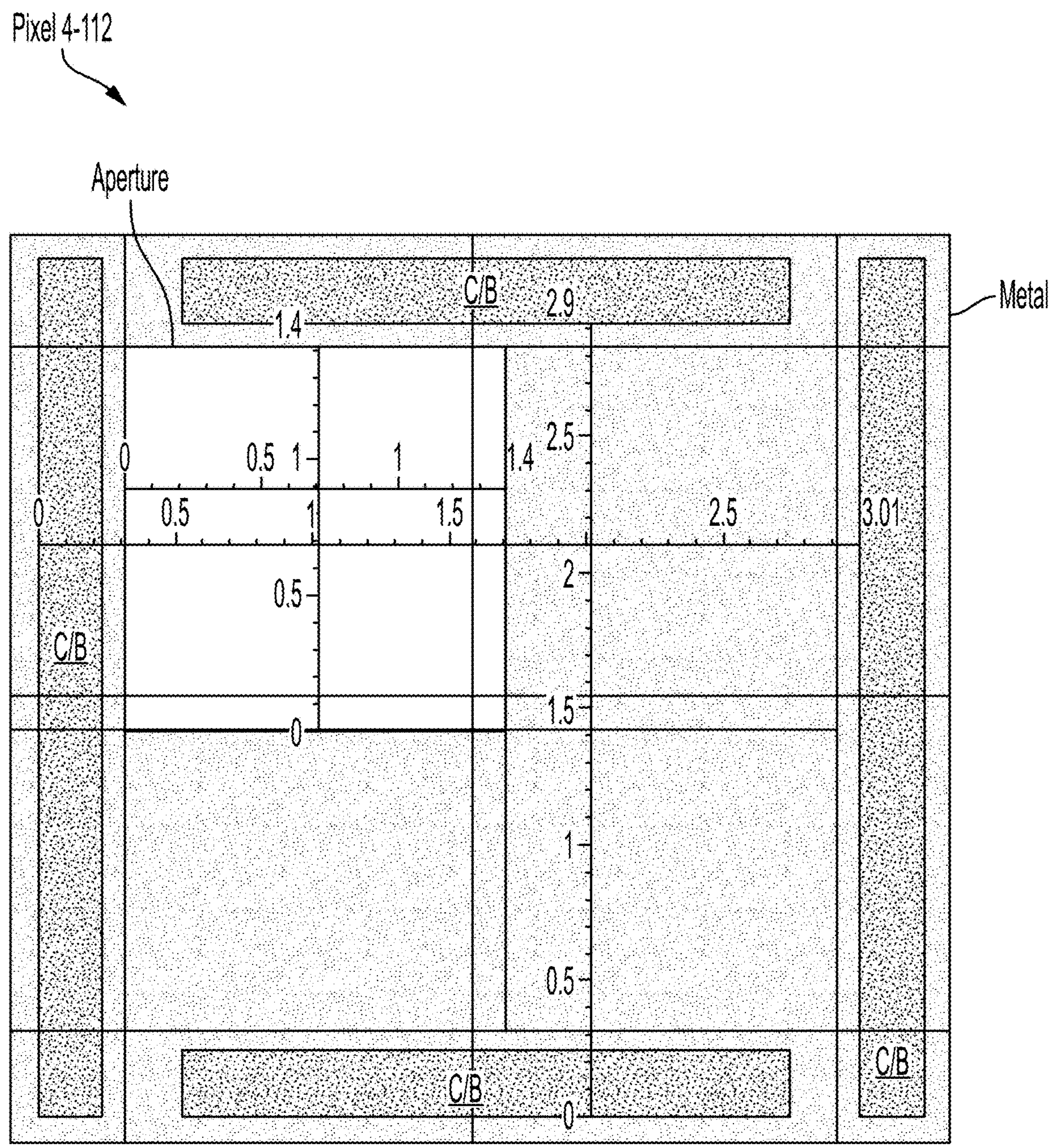
FIG. 23 is a layout sketch of the C/B regions and metal shield of the pixel of FIG. 22, according to some embodiments.
Figure 25:
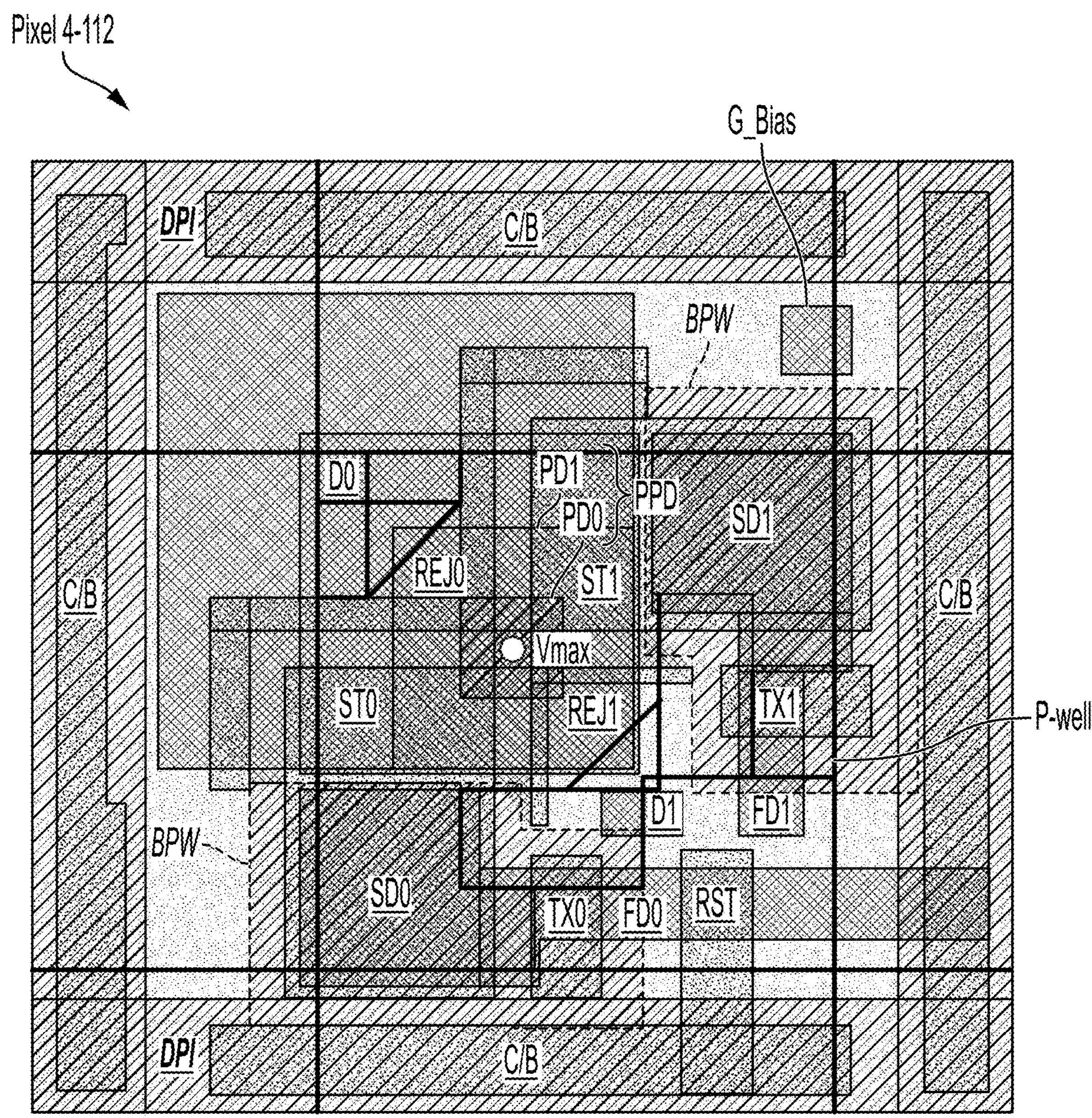
FIG. 25 is a layout sketch of the pixel of FIG. 22 further illustrating multiple barriers in the pixel, according to some embodiments.

FIG. 22 is a layout sketch of an alternative example pixel 4-112 having multiple drain transfer gates and a single readout path, which may be included in integrated device 1-102, according to some embodiments. FIG. 23 is a layout sketch of the metal shield and some of the C/B regions of pixel 4-112, according to some embodiments. In some embodiments, pixel 4-112 may be configured in the manner described herein for pixel 3-112. For example, as shown in FIG. 22, pixel 4-112 includes charge storage regions SD0 and SD1, drain regions D0 and D1, readout regions FD0 and FD1, and transfer gates REJ0, REJ1, ST0, ST1, TX0, TX1, RST, SF, and RS. As shown in FIGS. 22 and 23, pixel 4-112 includes a metal shield with an aperture. Although not shown in FIG. 22, pixel 4-112 further includes photodetection region PPD (FIG. 25).

In some embodiments, transfer gate REJ0 and/or REJ1 may have a meandering shape. For instance, transfer gate REJ0 and/or REJ1 may have a base and one or more segments elongated from one or more respective ends of the base in different (e.g., substantially perpendicular) directions. For example, as shown in FIG. 22, transfer gate REJ0 has a substantially triangular base BS with a first segment S0 elongated from a first corner of base BS and a second segment S1 elongated from first segment S0. Also shown in FIG. 22, first segment S0 is elongated substantially parallel to second direction Dir2 and second segment S1 is elongated substantially parallel to third direction Dir3, such that first and second segments S0 and S1 are elongated substantially perpendicular to one another. Also shown in FIG. 22, a third segment S2 is elongated from a second corner of base BS and a fourth segment S3 is elongated from third segment S2, with third segment S2 elongated substantially parallel to third direction Dir3 (and to second segment S1) and fourth segment S3 elongated substantially parallel to second direction Dir3 (and to first segment S0). It should be appreciated that transfer gate REJ0 may have any arrangement of segments, and/or transfer gate REJ1 may be configured as described herein for transfer gate REJ0, as embodiments are not so limited.

In some embodiments, transfer gate REJ0 and/or REJ1 may at least partially surround transfer gate ST0 and/or ST1. For instance, transfer gate REJ0 and/or REJ1 may at least partially surround transfer gate ST0 and/or ST1 on at least three sides. For example, as shown in FIG. 22, first segment S0 of transfer gate REJ0 is positioned on a first side of transfer gate ST0, second segment S1 and base BS of transfer gate REJ0 are positioned on a second side of transfer gate ST0, and transfer gate REJ1 is positioned on a third side of transfer gate ST0. Similarly, as shown in FIG. 22, third segment S2 and base BS of transfer gate REJ0 are positioned on a first side of transfer gate ST1, fourth segment S3 of transfer gate REJ0 is positioned on a second side of transfer gate ST1, and transfer gate REJ1 is positioned on a third side of transfer gate ST1.

In some embodiments, the aperture of the metal shield of pixel 4-112 may be offset from focal volume Vmax of photodetection region PPD. For example, as shown in FIG. 22, focal volume Vmax is offset from the aperture in the second direction Dir2 and third direction Dir3. In some embodiments, photodetection region PPD of pixel 4-112 may be configured to induce an intrinsic electric field to direct charge carriers, received at the aperture, to focal volume Vmax.

Also shown in FIG. 22, pixel 4-112 includes C/B regions positioned around the aperture. For example, one of the C/B regions shown around the aperture in FIG. 22 may be positioned, in the first direction Dir1, before transfer gates REJ0 and ST0. Similarly, another C/B region shown around the aperture in FIG. 22 may be positioned, in the first direction Dir1, before transfer gates REJ0 and ST1.

Figure 24:
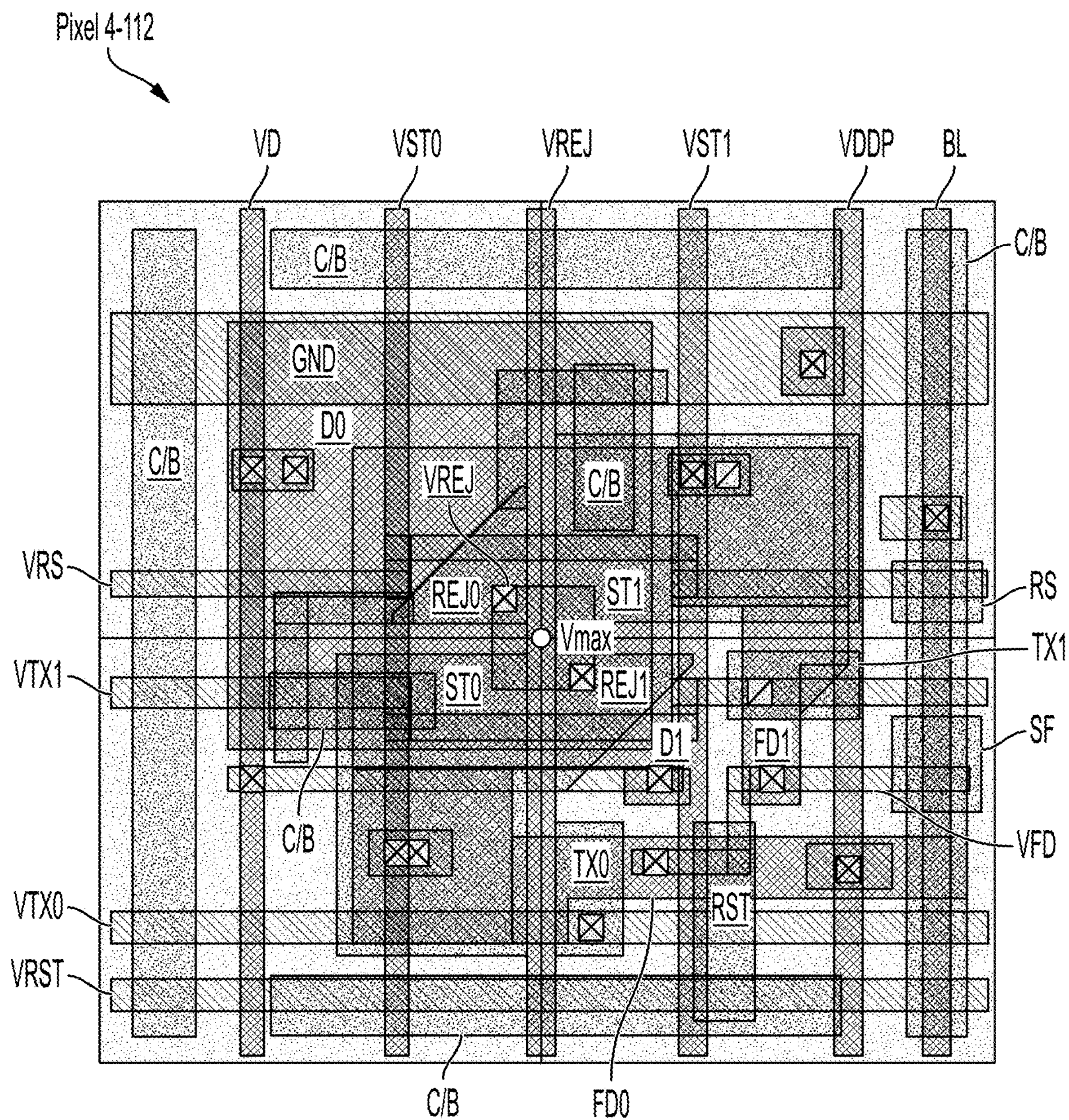
FIG. 24 is a layout sketch of the pixel of FIG. 22 further illustrating metal lines connected the pixel, according to some embodiments.

FIG. 24 is a layout sketch of pixel 4-112 further illustrating metal lines connected to pixel 4-112, according to some embodiments. In some embodiments, the metal lines connected to pixel 4-112 may be configured in the manner described herein for pixel 3-112. For example, as shown in FIG. 24, readout regions FD0 and FD1 are connected to common line VFD. Also shown in FIG. 24, a common line VD may be connected to drain regions D0 and D1.

FIG. 25 is a layout sketch of pixel 4-112 further illustrating photodetection region PPD, barriers DPI and BPW, and the P-well, according to some embodiments. In some embodiments, photodetection region PPD may include sub-regions, such as sub-regions PD0 and PD1 shown in FIG. 25.

Figures 26A, 26B:
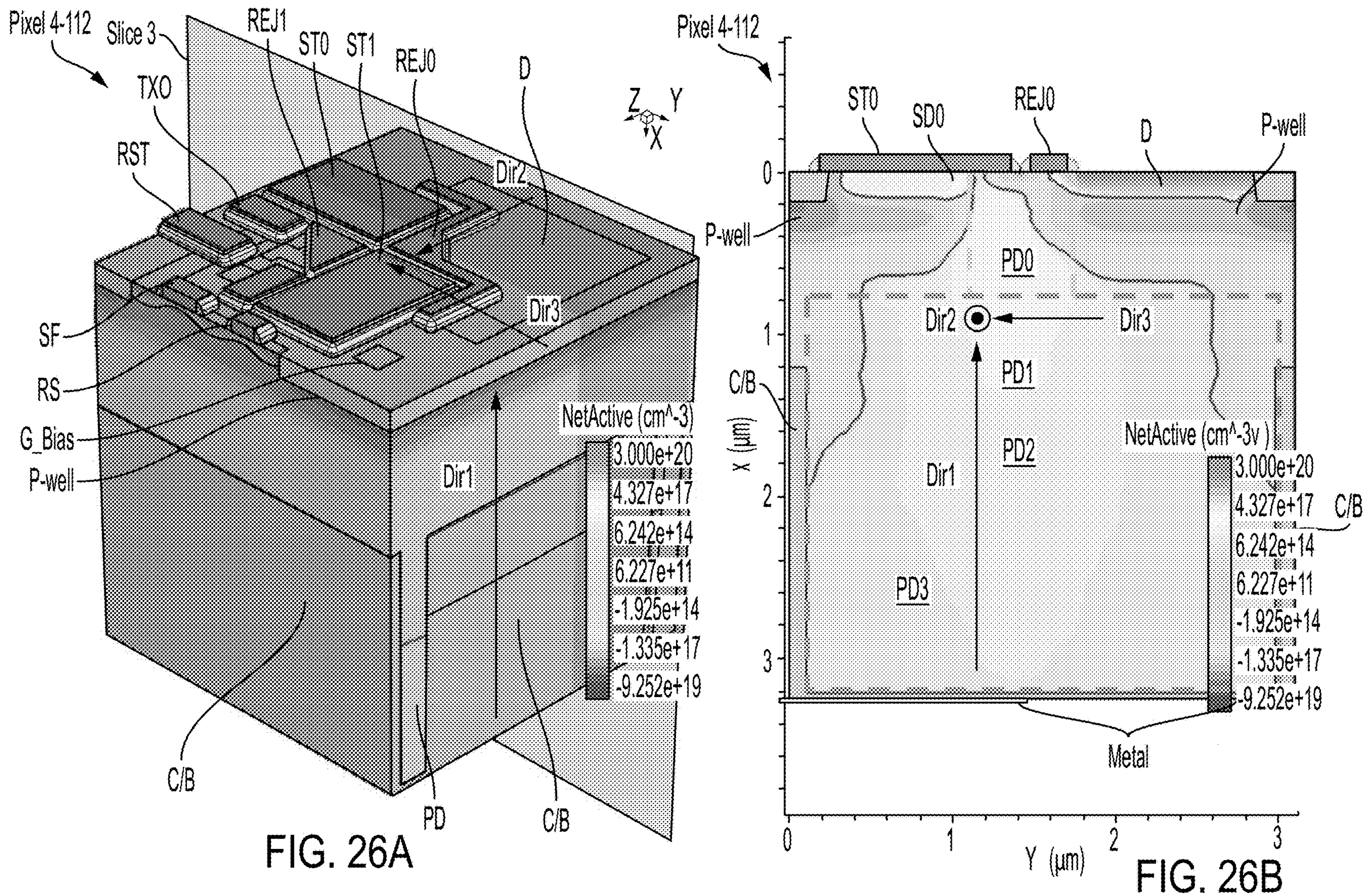
FIG. 26A is a bottom perspective view of the pixel of FIG. 22 showing dopant concentrations in the pixel, according to some embodiments.
FIG. 26B is a cross-sectional view of the pixel of FIG. 22 showing dopant concentrations in the pixel, according to some embodiments.

FIG. 26A is a bottom perspective view of pixel 4-112 showing dopant concentrations in pixel 4-112, according to some embodiments. FIG. 26B is a cross-sectional view of pixel 4-112 along Slice 3 (FIG. 26A) showing dopant concentrations in pixel 4-112, according to some embodiments.

In some embodiments, photodetection region PPD may be configured to induce an intrinsic electric field having vector components that direct charge carriers from the offset aperture to focal volume Vmax. For example, sub-regions of photodetection region PPD may be offset from the aperture in the second direction Dir2 and/or third direction Dir3. As shown in FIG. 26B, sub-regions PD0, PD1, PD2, and PD3 are offset from the aperture in the third direction Dir3. It should be appreciated that, though not show, sub-regions PD0, PD1, PD2, and/or PD3 may be offset from the aperture in the second direction Dir2.

Figures 27A, 27B:
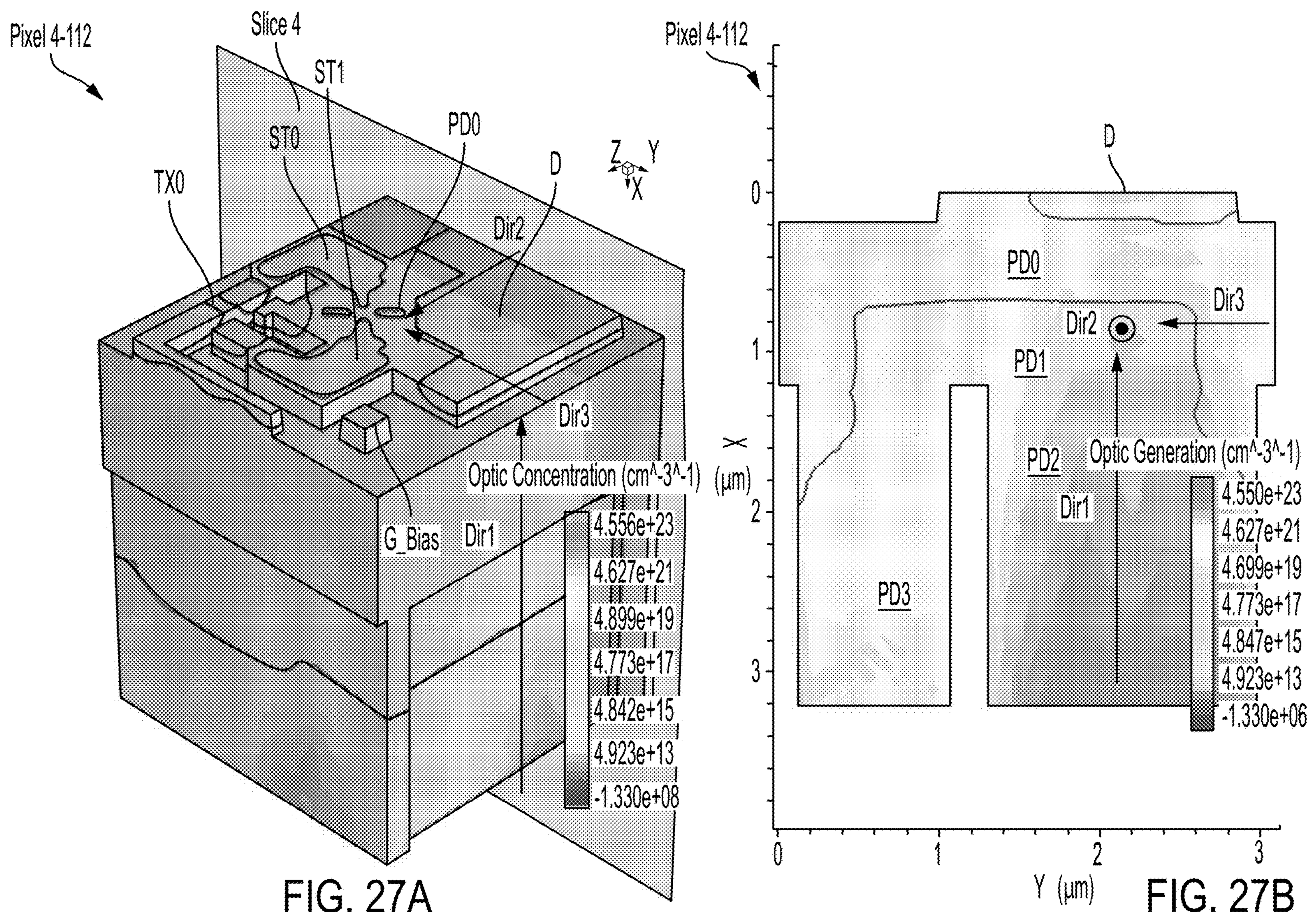
FIG. 27A is a bottom perspective view of the pixel of FIG. 22 showing optical generation in the pixel, according to some embodiments.
FIG. 27B is a cross-sectional view of the pixel of FIG. 22 showing optical generation in the pixel, according to some embodiments.

FIG. 27A is a bottom perspective view of pixel 4-112 showing optical generation in pixel 4-112, according to some embodiments. FIG. 27B is a cross-sectional view of pixel 4-112 along Slice 4 (FIG. 27A) showing optical generation in pixel 4-112, according to some embodiments. It should be appreciated that optical generation profiles may be used other than the profile illustrated in FIGS. 27A and 27B, as embodiments described herein are not so limited.

Figure 28A:
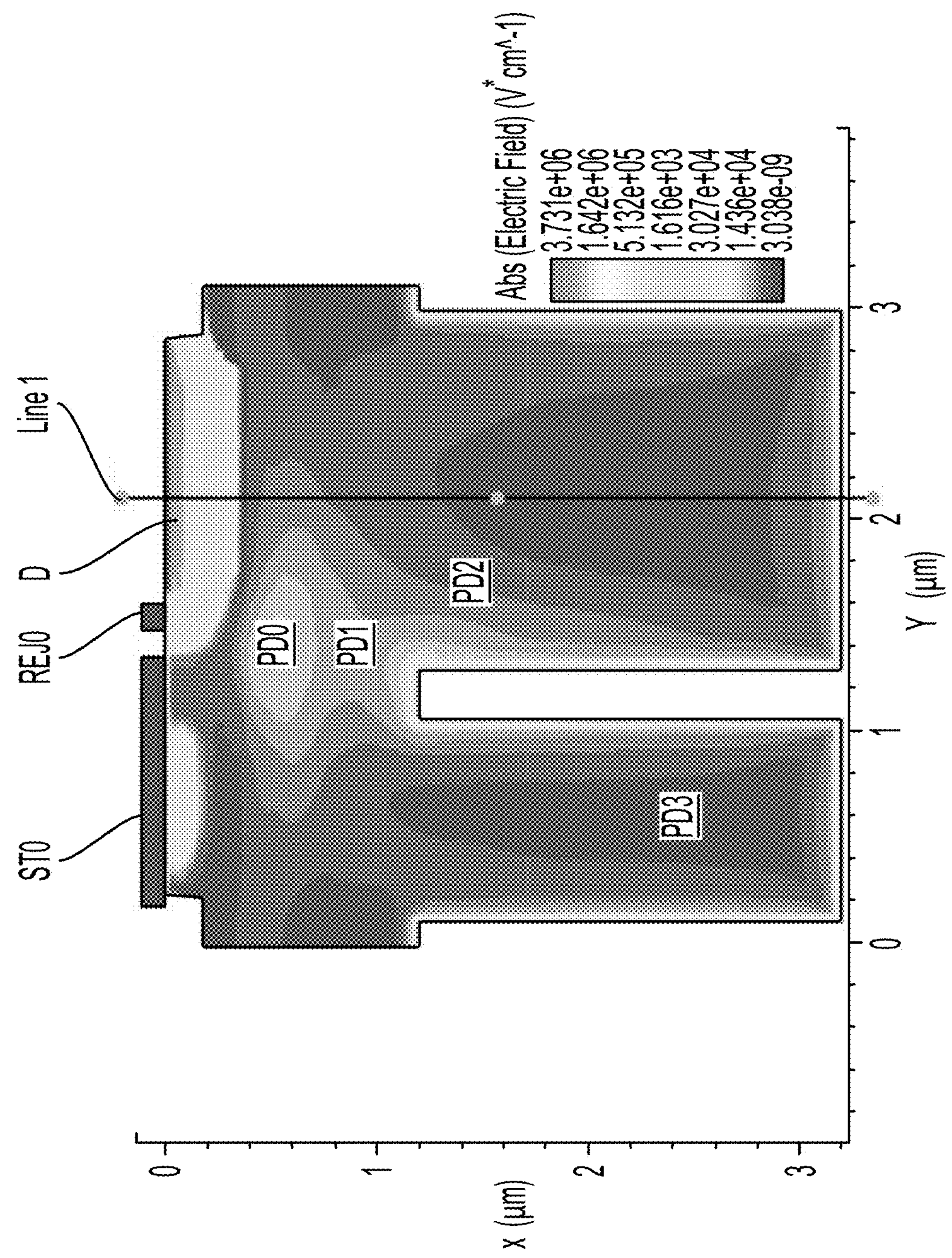
FIG. 28A is a cross-sectional view of the pixel of FIG. 22 showing electric fields in the pixel, according to some embodiments.
Figure 28B:
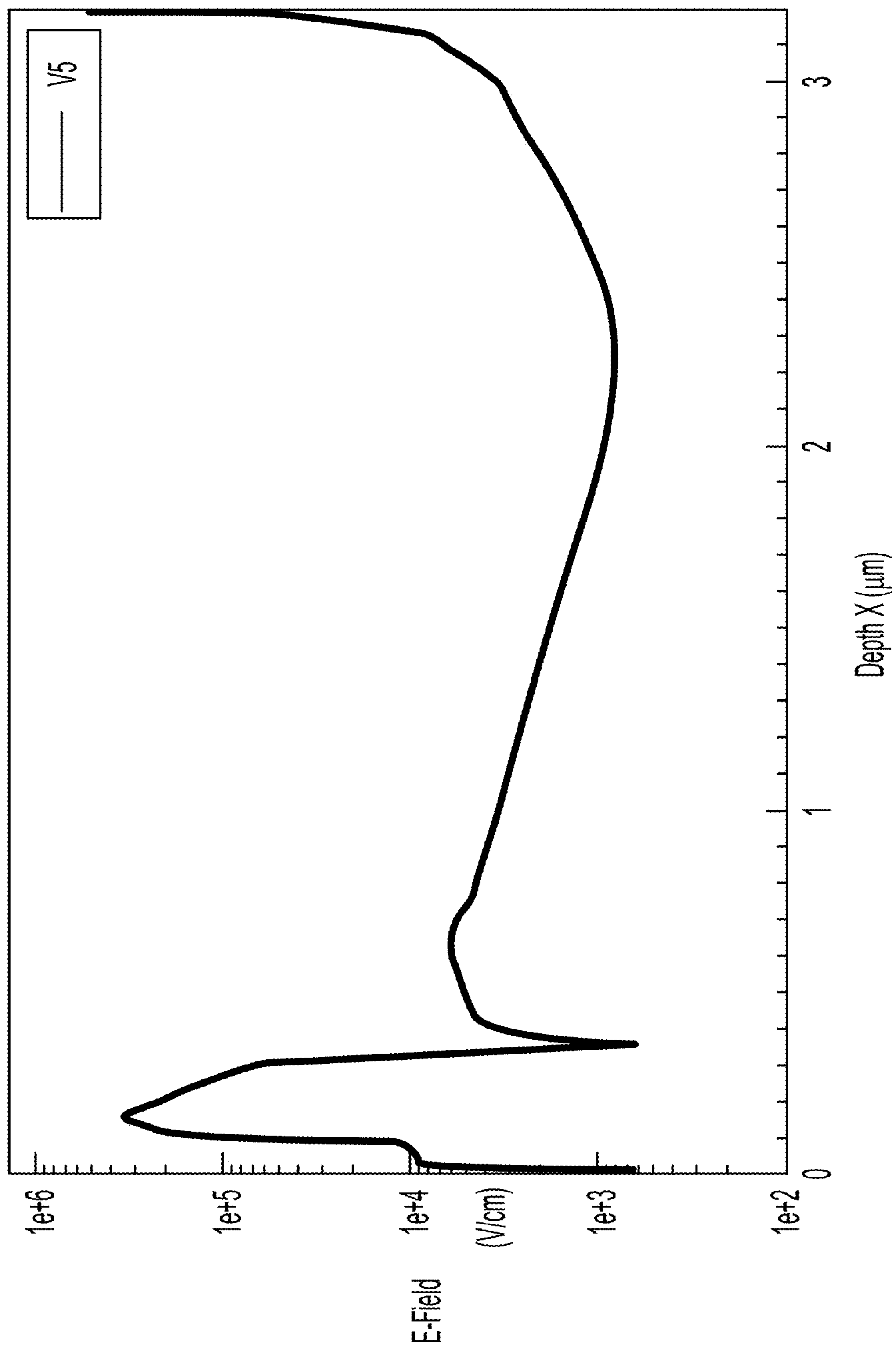
FIG. 28B is a graph of electric field over position for a line through the pixel of FIG. 22, according to some embodiments.

FIG. 28A is a cross-sectional view of pixel 4-112 along Slice 4 showing electric fields in pixel 4-112, according to some embodiments. FIG. 28B is a graph of electric fields along Line 1 (FIG. 28A) in pixel 4-112, according to some embodiments. As shown in FIG. 28A, electric fields in pixel 4-112 increase from sub-region PD3 to sub-region PD2, from sub-region PD2 to sub-region PD1, and from sub-region PD1 to sub-region PD0. As shown in FIG. 28B, the electric fields in pixel 4-112 increase from about a depth X=2.3 substantially up to the pinning layer (about a depth X=0.1 micron).

IX. DNA and/or RNA Sequencing Applications

Figure 29A:
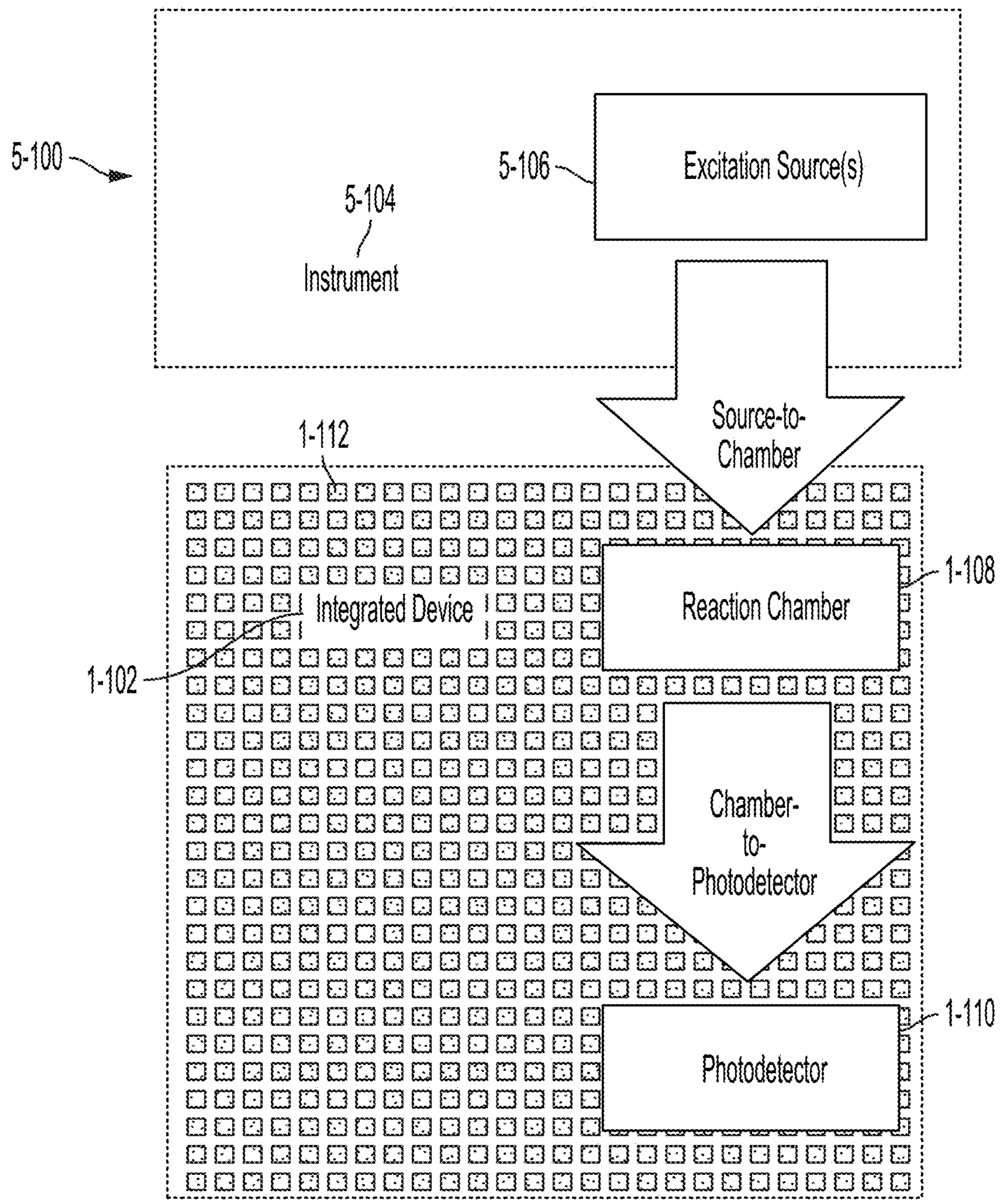
FIG. 29A is a block diagram of example analytic system that may include the integrated device of FIG. 1, according to some embodiments.

FIG. 29A is a block diagram of example analytic system 5-100 that may include integrated device 1-102, according to some embodiments. As shown in FIG. 29A, integrated device 1-102 interfaces with an instrument 5-104. In some embodiments, instrument 5-104 may include one or more excitation sources 5-106 integrated as part of instrument 5-104. In some embodiments, an excitation source may be external to both instrument 5-104 and integrated device 1-102, and instrument 5-104 may be configured to receive excitation light from the excitation source and direct excitation light to integrated device 1-102. For example, integrated device 1-102 may interface with the instrument 5-104 using any suitable socket for receiving integrated device 1-102 and holding it in precise optical alignment with the excitation source(s) 5-106. The excitation source(s) 5-106 may be configured to provide excitation light to some or all pixels 1-112 of the integrated device 1-102. In some embodiments, at least a portion of pixels 1-112 may be configured to perform independent analysis of a sample of interest. Such pixels 1-112 may be referred to as "passive source pixels" since a pixel 1-112 receives excitation light from a source 5-106 separate from the pixel, where excitation light from the source excites some or all of the pixels 1-112. It should be appreciated that any or all pixels described herein may be included in integrated device 1-102. Excitation source 5-106 may be any suitable light source. Examples of suitable excitation sources are described in U.S. patent application Ser. No. 14/821,688, filed Aug. 7, 2015, titled "INTEGRATED DEVICE FOR PROBING, DETECTING AND ANALYZING MOLECULES," which is incorporated by reference in its entirety. In some embodiments, excitation source 5-106 includes multiple excitation sources that are combined to deliver excitation light to integrated device 1-102. The multiple excitation sources may be configured to produce multiple excitation energies or wavelengths.

A pixel 1-112 has a sample well 1-108 configured to receive a single sample of interest and a photodetector 1-110 for detecting emission light emitted from the sample well in response to illuminating the sample and at least a portion of the sample well 1-108 with excitation light provided by the excitation source 5-106. In some embodiments, sample well 1-108 may retain the sample in proximity to a surface of integrated device 1-102, which may ease delivery of excitation light to the sample and detection of emission light from the sample or a reaction component (e.g., a labeled nucleotide).

Sample wells 1-108 of integrated device 1-102 may be configured to receive a sample from a suspension placed on the surface of integrated device 1-102. A suspension may contain multiple samples of a same type, and in some embodiments, different types of samples. In this regard, the phrase "sample of interest" as used herein can refer to a plurality of samples of a same type that are dispersed in a suspension, for example. Similarly, the phrase "molecule of interest" as used herein can refer to a plurality of molecules of a same type that are dispersed in a suspension. Sample wells 1-108 may have a suitable size and shape such that at least a portion of the sample wells receive one sample from a suspension. In some embodiments, the number of samples within a sample well 1-108 may be different among the sample wells 1-108 such that some sample wells 1-108 contain one sample with others contain zero, two or more samples.

In some embodiments, a suspension may contain multiple single-stranded DNA templates, and sample wells 1-108 on a surface of integrated device 1-102 may be sized and shaped to receive a sequencing template. Sequencing templates may be distributed among the sample wells of the integrated device such that at least a portion of the sample wells of the integrated device contain a sequencing template. The suspension may also contain labeled nucleotides which then enter in the sample well and may allow for identification of a nucleotide as it is incorporated into a strand of DNA complementary to the single-stranded DNA template in the sample well. In some embodiments, the suspension may contain sequencing templates and labeled nucleotides may be subsequently introduced to a sample well as nucleotides are incorporated into a complementary strand within the sample well. In this manner, timing of incorporation of nucleotides may be controlled by when labeled nucleotides are introduced to the sample wells of an integrated device.

Optical elements for coupling excitation light from excitation light source 5-106 to integrated device 1-102 and guiding excitation light to the sample well 1-108 are located both on integrated device 1-102 and the instrument 5-104. Source-to-well optical elements may comprise one or more grating couplers 1-216 located on integrated device 1-102 to couple excitation light to integrated device 1-102 and waveguides 1-220 to deliver excitation light from instrument 5-104 to sample wells 1-108 in pixels 1-112. One or more optical splitter elements may be positioned between grating coupler 1-216 and the waveguides 1-220. The optical splitter may couple excitation light from the grating coupler 1-216 and deliver excitation light to at least one of the waveguides 1-220. In some embodiments, the optical splitter may have a configuration that allows for delivery of excitation light to be substantially uniform across all the waveguides 1-220 such that each of the waveguides 1-220 receives a substantially similar amount of excitation light. Such embodiments may improve performance of integrated device 1-102 by improving the uniformity of excitation light received by sample wells 1-108 of the integrated device.

In some embodiments, excitation source 5-106 and a portion of the source-to-chamber components may be located in instrument 5-104. In some embodiments, a single component may play a role in both coupling excitation light to sample well 1-108 and delivering emission light from sample well 1-108 to photodetector 1-110. Examples of suitable components, for coupling excitation light to a sample well 1-108 and/or directing emission light to a photodetector 1-110, to include in an integrated device are described in U.S. patent application Ser. No. 14/821,688, filed Aug. 7, 2015, titled "INTEGRATED DEVICE FOR PROBING, DETECTING AND ANALYZING MOLECULES," and U.S. patent application Ser. No. 14/543,865, filed Nov. 17, 2014, titled "INTEGRATED DEVICE WITH EXTERNAL LIGHT SOURCE FOR PROBING, DETECTING, AND ANALYZING MOLECULES," both of which are incorporated by reference in their entirety.

Pixel 1-112 is associated with its own individual sample well 1-108 and at least one photodetector 1-110. The plurality of pixels of integrated device 1-102 may be arranged to have any suitable shape, size, and/or dimensions. Integrated device 1-102 may have any suitable number of pixels. The number of pixels in integrated device 1-102 may be in the range of approximately 10,000 pixels to 1,000,000 pixels or any value or range of values within that range. In some embodiments, the pixels may be arranged in an array of 512 pixels by 512 pixels. Integrated device 1-102 may interface with instrument 5-104 in any suitable manner. In some embodiments, instrument 5-104 may have an interface that detachably couples to integrated device 1-102 such that a user may attach integrated device 1-102 to instrument 5-104 for use of integrated device 1-102 to analyze at least one sample of interest in a suspension and remove integrated device 1-102 from instrument 5-104 to allow for another integrated device to be attached. The interface of instrument 5-104 may position integrated device 1-102 to couple with circuitry of instrument 5-104 to allow for readout signals from one or more photodetectors to be transmitted to instrument 5-104. Integrated device 1-102 and instrument 5-104 may include multi-channel, high-speed communication links for handling data associated with large pixel arrays (e.g., more than 10,000 pixels).

Components located off of the integrated device may be used to position and align the excitation source 5-106 to the integrated device 1-102. Such components may include optical components including lenses, mirrors, prisms, windows, apertures, attenuators, and/or optical fibers. Additional mechanical components may be included in the instrument to allow for control of one or more alignment components. Such mechanical components may include actuators, stepper motors, and/or knobs. Examples of suitable excitation sources and alignment mechanisms are described in U.S. patent application Ser. No. 15/161,088, filed May 20, 2016, titled "PULSED LASER AND SYSTEM," which is incorporated by reference in its entirety. Another example of a beam-steering module is described in U.S. patent application Ser. No. 15/842,720, filed Dec. 14, 2017, titled "COMPACT BEAM SHAPING AND STEERING ASSEMBLY," which is incorporated herein by reference.

Instrument 5-104 may include a user interface for controlling operation of instrument 5-104 and/or integrated device 1-102. The user interface may be configured to allow a user to input information into the instrument, such as commands and/or settings used to control the functioning of the instrument. In some embodiments, the user interface may include buttons, switches, dials, and a microphone for voice commands. The user interface may allow a user to receive feedback on the performance of the instrument and/or integrated device, such as proper alignment and/or information obtained by readout signals from the photodetectors on the integrated device. In some embodiments, the user interface may provide feedback using a speaker to provide audible feedback. In some embodiments, the user interface may include indicator lights and/or a display screen for providing visual feedback to a user.

In some embodiments, instrument 5-104 may include a computer interface configured to connect with a computing device. Computer interface may be a USB interface, a FireWire interface, or any other suitable computer interface. Computing device may be any general purpose computer, such as a laptop or desktop computer. In some embodiments, computing device may be a server (e.g., cloud-based server) accessible over a wireless network via a suitable computer interface. The computer interface may facilitate communication of information between instrument 5-104 and the computing device. Input information for controlling and/or configuring the instrument 5-104 may be provided to the computing device and transmitted to instrument 5-104 via the computer interface. Output information generated by instrument 5-104 may be received by the computing device via the computer interface. Output information may include feedback about performance of instrument 5-104, performance of integrated device 1-102, and/or data generated from the readout signals of photodetector 1-110.

In some embodiments, instrument 5-104 may include a processing device configured to analyze data received from one or more photodetectors 1-110 of integrated device 1-102 and/or transmit control signals to excitation source(s) 2-106. In some embodiments, the processing device may comprise a general purpose processor, a specially-adapted processor (e.g., a central processing unit (CPU) such as one or more microprocessor or microcontroller cores, a field-programmable gate array (FPGA), an application-specific integrated circuit (ASIC), a custom integrated circuit, a digital signal processor (DSP), or a combination thereof.) In some embodiments, the processing of data from one or more photodetectors may be performed by both a processing device of instrument 5-104 and an external computing device. In other embodiments, an external computing device may be omitted and processing of data from one or more photodetectors may be performed solely by a processing device of integrated device 1-102.

Figure 29B:
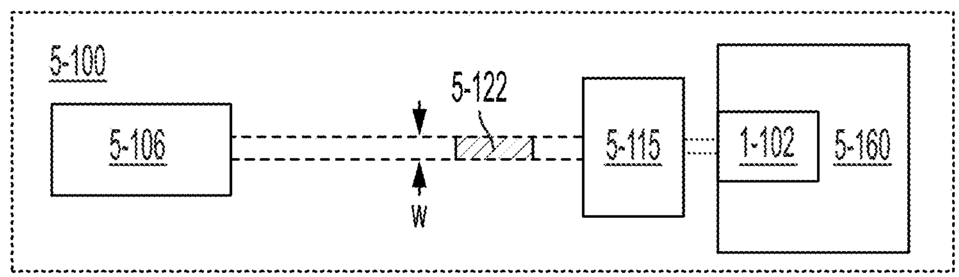
FIG. 29B is a block diagram depiction of an analytical instrument that includes a compact mode-locked laser module, according to some embodiments.

Referring to FIG. 29B, a portable, advanced analytic instrument 5-100 can comprise one or more pulsed optical sources 5-106 mounted as a replaceable module within, or otherwise coupled to, the instrument 5-100. The portable analytic instrument 5-100 can include an optical coupling system 5-115 and an analytic system 5-160. The optical coupling system 5-115 can include some combination of optical components (which may include, for example, none, one from among, or more than one component from among the following components: lens, mirror, optical filter, attenuator, beam-steering component, beam shaping component) and be configured to operate on and/or couple output optical pulses 5-122 from the pulsed optical source 5-106 to the analytic system 5-160. The analytic system 5-160 can include a plurality of components that are arranged to direct the optical pulses to at least one sample well for sample analysis, receive one or more optical signals (e.g., fluorescence, backscattered radiation) from the at least one sample well, and produce one or more electrical signals representative of the received optical signals. In some embodiments, the analytic system 5-160 can include one or more photodetectors and may also include signal-processing electronics (e.g., one or more microcontrollers, one or more field-programmable gate arrays, one or more microprocessors, one or more digital signal processors, logic gates, etc.) configured to process the electrical signals from the photodetectors. The analytic system 5-160 can also include data transmission hardware configured to transmit and receive data to and from external devices (e.g., one or more external devices on a network to which the instrument 5-100 can connect via one or more data communications links). In some embodiments, the analytic system 5-160 can be configured to receive integrated device 1-102 prepared to hold one or more samples to be analyzed.

Figure 29C:
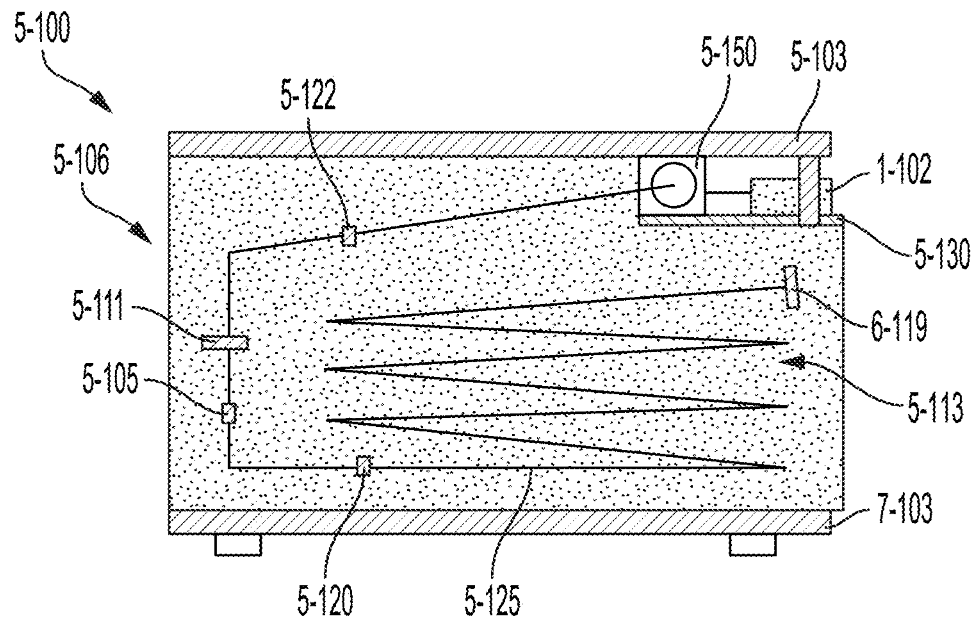
FIG. 29C depicts a compact mode-locked laser module incorporated into an analytical instrument, according to some embodiments.

FIG. 29C depicts a further detailed example of a portable analytical instrument 5-100 that includes a compact pulsed optical source 5-106. In this example, the pulsed optical source 5-106 comprises a compact, passively mode-locked laser module 5-113. A passively mode-locked laser can produce optical pulses autonomously, without the application of an external pulsed signal. In some implementations, the module can be mounted to an instrument chassis or frame 5-103, and may be located inside an outer casing of the instrument. According to some embodiments, a pulsed optical source 5-106 can include additional components that can be used to operate the optical source and operate on an output beam from the optical source 5-106. A mode-locked laser 5-113 may comprise an element (e.g., saturable absorber, acousto-optic modulator, Kerr lens) in a laser cavity, or coupled to the laser cavity, which induces phase locking of the laser's longitudinal frequency modes. The laser cavity can be defined in part by cavity end mirrors 5-111, 5-119. Such locking of the frequency modes results in pulsed operation of the laser (e.g., an intracavity pulse 5-120 bounces back-and-forth between the cavity end mirrors) and produces a stream of output optical pulses 5-122 from one end mirror 5-111 which is partially transmitting.

In some cases, the analytic instrument 5-100 is configured to receive integrated device 1-102, which may be made removable, packaged, and/or disposable. In some implementations, integrated device 1-102 can be disposable after a single use, whereas in other implementations integrated device 1-102 can be reused two or more times. When integrated device 1-102 is received by the instrument 5-100, it can be in electrical and optical communication with the pulsed optical source 5-106 and with apparatus in the analytic system 5-160. Electrical communication may be made through electrical contacts on the chip package of integrated device 1-102, for example.

In some embodiments and referring to FIG. 29C, integrated device 1-102 can be mounted (e.g., via a socket connection) on an electronic circuit board 5-130, such as a printed circuit board (PCB) that can include additional instrument electronics. For example, the PCB 5-130 can include circuitry configured to provide electrical power, one or more clock signals, and control signals to integrated device 1-102, and signal-processing circuitry arranged to receive signals representative of fluorescent emission detected from the sample wells. Data returned from integrated device 1-102 can be processed in part or entirely by electronics on the instrument 5-100, although data may be transmitted via a network connection to one or more remote data processors, in some implementations. The PCB 5-130 can also include circuitry configured to receive feedback signals from integrated device 1-102 relating to optical coupling and power levels of the optical pulses 5-122 coupled into waveguides of integrated device 1-102. The feedback signals can be provided to one or both of the pulsed optical source 5-106 and optical system 5-115 to control one or more parameters of the output beam of optical pulses 5-122. In some cases, the PCB 5-130 can provide or route power to the pulsed optical source 5-106 for operating the optical source and related circuitry in the optical source 5-106.

According to some embodiments, the pulsed optical source 5-106 comprises a compact mode-locked laser module 5-113. The mode-locked laser can comprise a gain medium 5-105 (which can be solid-state material in some embodiments), an output coupler 5-111, and a laser-cavity end mirror 5-119. The mode-locked laser's optical cavity can be bound by the output coupler 5-111 and end mirror 5-119. An optical axis 5-125 of the laser cavity can have one or more folds (turns) to increase the length of the laser cavity and provide a desired pulse repetition rate. The pulse repetition rate is determined by the length of the laser cavity (e.g., the time for an optical pulse to make a round-trip within the laser cavity).

In some embodiments, there can be additional optical elements (not shown in FIG. 29C) in the laser cavity for beam shaping, wavelength selection, and/or pulse forming. In some cases, the end mirror 5-119 comprises a saturable-absorber mirror (SAM) that induces passive mode locking of longitudinal cavity modes and results in pulsed operation of the mode-locked laser. The mode-locked laser module 5-113 can further include a pump source (e.g., a laser diode, not shown in FIG. 29C) for exciting the gain medium 5-105. Further details of a mode-locked laser module 5-113 can be found in U.S. patent application Ser. No. 15/844,469, titled "Compact Mode-Locked Laser Module," filed Dec. 15, 2017, each application of which is incorporated herein by reference.

Figure 30:
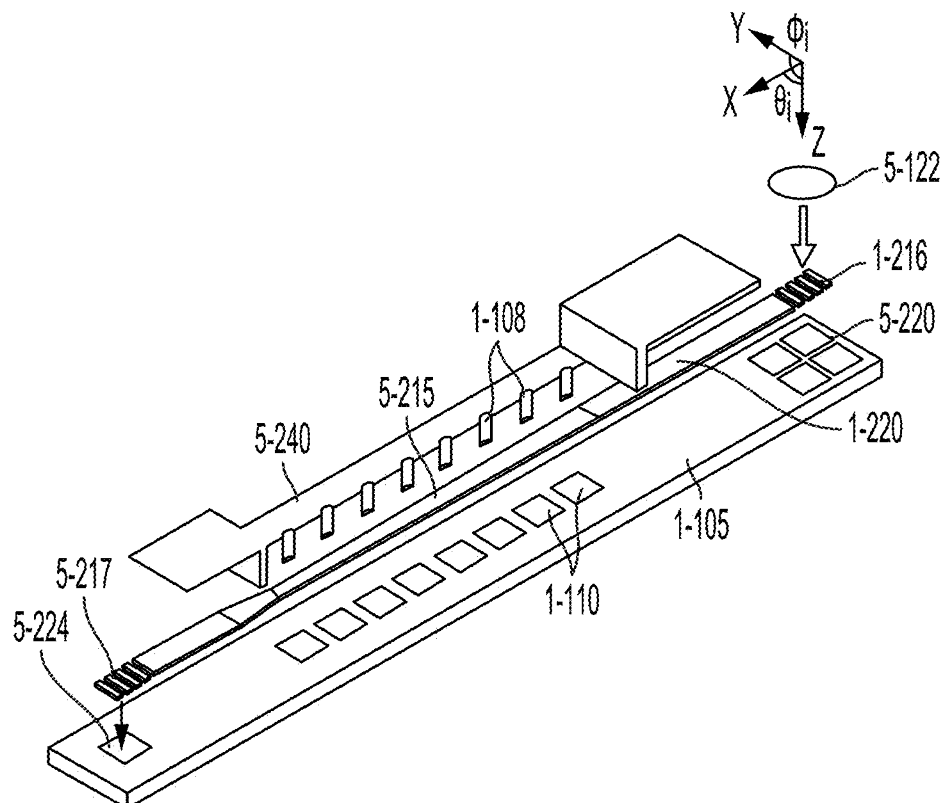
FIG. 30 depicts an example of parallel sample wells that can be excited optically by a pulsed laser via one or more waveguides according to some embodiments.

When the laser 5-113 is mode locked, an intracavity pulse 5-120 can circulate between the end mirror 5-119 and the output coupler 5-111, and a portion of the intracavity pulse can be transmitted through the output coupler 5-111 as an output pulse 5-122. Accordingly, a train of output pulses 5-122, as depicted in the graph of FIG. 30, can be detected at the output coupler as the intracavity pulse 5-120 bounces back-and-forth between the output coupler 5-111 and end mirror 5-119 in the laser cavity.

Figure 29D:
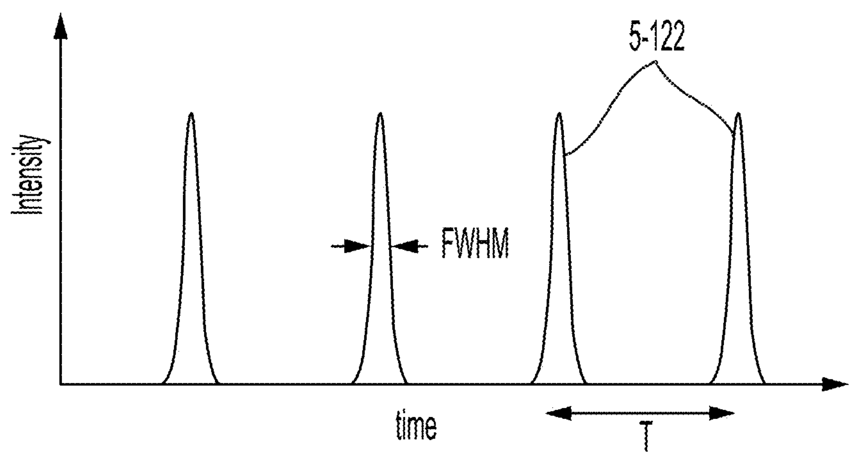
FIG. 29D depicts a train of optical pulses, according to some embodiments.

FIG. 29D depicts temporal intensity profiles of the output pulses 5-122, though the illustration is not to scale. In some embodiments, the peak intensity values of the emitted pulses may be approximately equal, and the profiles may have a Gaussian temporal profile, though other profiles such as a sech2 profile may be possible. In some cases, the pulses may not have symmetric temporal profiles and may have other temporal shapes. The duration of each pulse may be characterized by a full-width-half-maximum (FWHM) value, as indicated in FIG. 29D. According to some embodiments of a mode-locked laser, ultrashort optical pulses can have FWHM values less than 100 picoseconds (ps). In some cases, the FWHM values can be between approximately 5 ps and approximately 30 ps.

The output pulses 5-122 can be separated by regular intervals T. For example, T can be determined by a round-trip travel time between the output coupler 5-111 and cavity end mirror 5-119. According to some embodiments, the pulse-separation interval T can be between about 1 ns and about 30 ns. In some cases, the pulse-separation interval T can be between about 5 ns and about 20 ns, corresponding to a laser-cavity length (an approximate length of the optical axis 5-125 within the laser cavity) between about 0.7 meter and about 3 meters. In embodiments, the pulse-separation interval corresponds to a round trip travel time in the laser cavity, so that a cavity length of 3 meters (round-trip distance of 6 meters) provides a pulse-separation interval T of approximately 20 ns.

According to some embodiments, a desired pulse-separation interval T and laser-cavity length can be determined by a combination of the number of sample wells 1-108 on integrated device 1-102, fluorescent emission characteristics, and the speed of data-handling circuitry for reading data from integrated device 1-102. In embodiments, different fluorophores can be distinguished by their different fluorescent decay rates or characteristic lifetimes. Accordingly, there needs to be a sufficient pulse-separation interval T to collect adequate statistics for the selected fluorophores to distinguish between their different decay rates. Additionally, if the pulse-separation interval T is too short, the data handling circuitry cannot keep up with the large amount of data being collected by the large number of sample wells. Pulse-separation interval T between about 5 ns and about 20 ns is suitable for fluorophores that have decay rates up to about 2 ns and for handling data from between about 60,000 and 10,000,000 sample wells.

According to some implementations, a beam-steering module 5-150 can receive output pulses from the pulsed optical source 5-106 and is configured to adjust at least the position and incident angles of the optical pulses onto an optical coupler (e.g., grating coupler 1-216) of integrated device 1-102. In some cases, the output pulses 5-122 from the pulsed optical source 5-106 can be operated on by a beam-steering module 5-150 to additionally or alternatively change a beam shape and/or beam rotation at an optical coupler on integrated device 1-102. In some implementations, the beam-steering module 5-150 can further provide focusing and/or polarization adjustments of the beam of output pulses onto the optical coupler. One example of a beam-steering module is described in U.S. patent application Ser. No. 15/161,088 titled "Pulsed Laser and Bioanalytic System," filed May 20, 2016, which is incorporated herein by reference. Another example of a beam-steering module is described in a separate U.S. patent application No. 62/435,679, filed Dec. 16, 2016, and titled "Compact Beam Shaping and Steering Assembly," which is incorporated herein by reference.

Referring to FIG. 30, the output pulses 5-122 from a pulsed optical source can be coupled into one or more optical waveguides 1-220 of integrated device 1-102, for example. In some embodiments, the optical pulses can be coupled to one or more waveguides 1-220 via a grating coupler 1-216, though coupling to an end of one or more optical waveguides 1-220 on integrated device 1-102 can be used in some embodiments. According to some embodiments, a quad detector 5-220 can be located on the substrate 1-105 (e.g., a silicon substrate) for aiding in alignment of the beam of optical pulses 5-122 to a grating coupler 1-216. The one or more waveguides 1-220 and sample wells 1-108 can be integrated on the same semiconductor substrate with intervening dielectric layers (e.g., silicon dioxide layers) between the substrate, waveguide 1-220, sample wells 1-108, and photodetectors 1-110.

Each waveguide 1-220 can include a tapered portion 5-215 below the sample wells 1-108 to equalize optical power coupled to the sample wells 1-108 along the waveguide 1-220. The reducing taper can force more optical energy outside the core of the waveguide 1-220, increasing coupling to the sample wells and compensating for optical losses along the waveguide 1-220, including losses for light coupling into the sample wells. A second grating coupler 5-217 can be located at an end of each waveguide to direct optical energy to an auxiliary photodiode 5-224. The auxiliary photodiode 5-224 can detect an amount of power coupled down a waveguide and provide a detected signal to feedback circuitry that controls the beam-steering module 5-150, for example.

The sample wells 1-108 can be aligned with the tapered portion 5-215 of the waveguide and recessed in a tub 5-240. There can be photodetectors 1-110 located on the semiconductor substrate 1-105 for each sample well 1-108. In some embodiments, a semiconductor absorber (shown in FIG. 32 as an optical filter 5-430) may be located between the waveguide and a photodetector 1-110 at each pixel 1-112. A metal coating and/or multilayer coating 1-106 can be formed around the sample wells 1-108 and above the waveguide 1-220 to prevent optical excitation of fluorophores that are not in the sample wells (e.g., dispersed in a solution above the sample wells 1-108). The metal coating and/or multi-layer coating 1-106 may be raised beyond edges of the tub 5-240 to reduce absorptive losses of the optical energy in the waveguide 1-220 at the input and output ends of each waveguide.

There can be a plurality of rows of waveguides 1-220, sample wells 1-108, and time-binning photodetectors 1-110 on integrated device 1-102. For example, there can be 128 rows, each having 512 sample wells 1-108, for a total of 65,536 sample wells 1-108 in some implementations. Other implementations may include fewer or more sample wells 1-108, and may include other layout configurations. Optical power from the pulsed optical source 5-106 can be distributed to the multiple waveguides 1-220 via one or more star couplers or multi-mode interference couplers, or by any other means, located between an optical coupler 5-210 to integrated device 1-102 and the plurality of waveguides 1-220.

Figure 31:
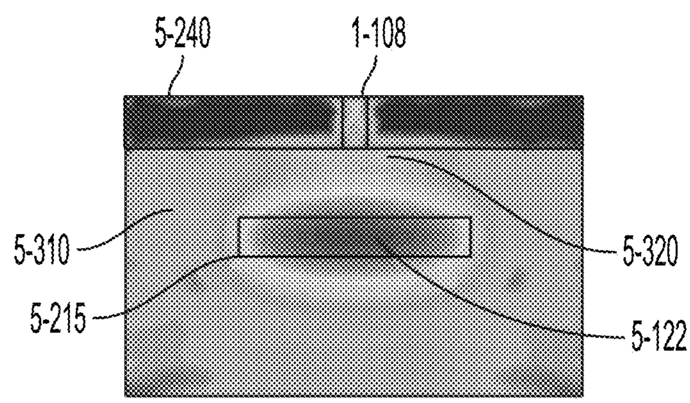
FIG. 31 illustrates optical excitation of a sample well from a waveguide, according to some embodiments.

FIG. 31 illustrates optical energy coupling from an optical pulse 5-122 within a tapered portion 5-215 of waveguide 1-220 to a sample well 1-108. The drawing has been produced from an electromagnetic field simulation of the optical wave that accounts for waveguide dimensions, sample well dimensions, the different materials' optical properties, and the distance of the tapered portion 5-215 of waveguide 1-220 from the sample well 1-108. The waveguide can be formed from silicon nitride in a surrounding medium 5-310 of silicon dioxide, for example. The waveguide 1-220, surrounding medium, and sample well 1-108 can be formed by microfabrication processes described in U.S. application Ser. No. 14/821,688, filed Aug. 7, 2015, titled "Integrated Device for Probing, Detecting and Analyzing Molecules." According to some embodiments, an evanescent optical field 5-320 couples optical energy transported by the waveguide to the sample well 1-108.

Figure 32:
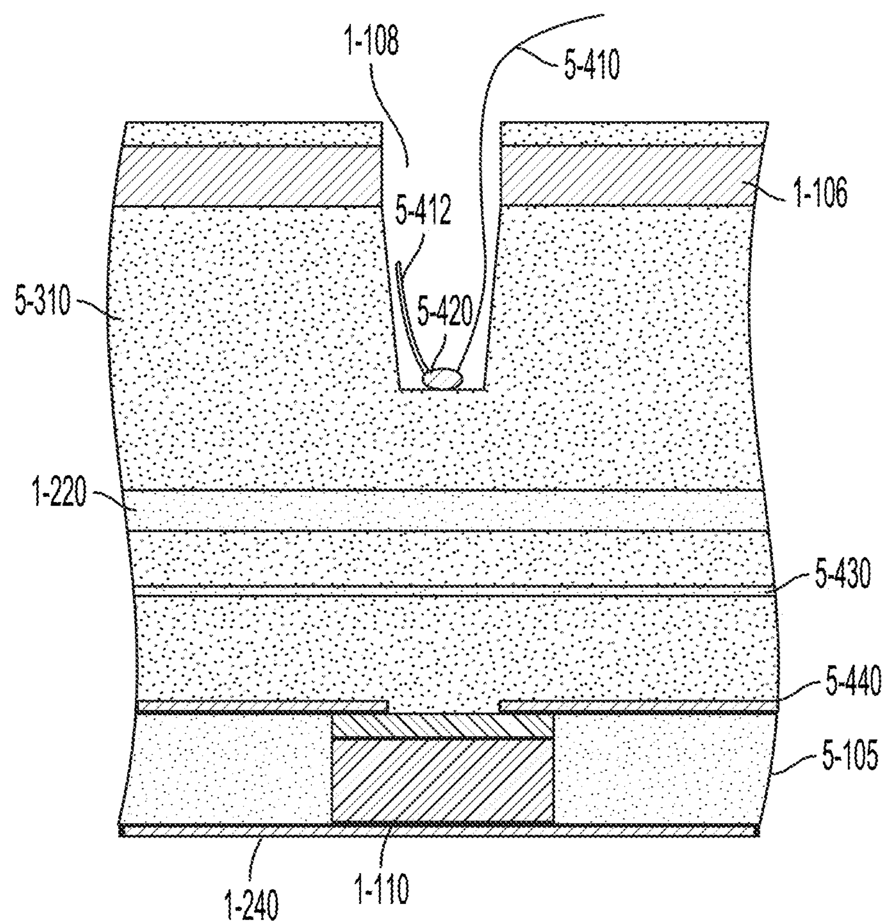
FIG. 32 depicts further details of an integrated sample well, optical waveguide, and time-binning photodetector, according to some embodiments.

A non-limiting example of a biological reaction taking place in a sample well 1-108 is depicted in FIG. 32. The example depicts sequential incorporation of nucleotides or nucleotide analogs into a growing strand that is complementary to a target nucleic acid. The sequential incorporation can take place in a sample well 1-108, and can be detected by an advanced analytic instrument to sequence DNA. The sample well 1-108 can have a depth between about 150 nm and about 250 nm and a diameter between about 80 nm and about 160 nm. A metal shield 5-440 with an aperture can be positioned above a photodetector 1-110 to block incident light from reaching charge storage regions and/or stray light from adjacent sample wells and other unwanted light sources from polluting the photodetector 1-110. According to some embodiments, polymerase 5-420 can be located within the sample well 1-108 (e.g., attached to a base of the chamber). The polymerase can take up a target nucleic acid 5-410 (e.g., a portion of nucleic acid derived from DNA), and sequence a growing strand of complementary nucleic acid to produce a growing strand of DNA 5-412. Nucleotides or nucleotide analogs labeled with different fluorophores can be dispersed in a solution above and within the sample well.

Figure 33:
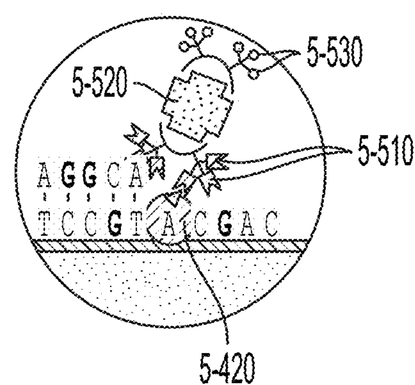
FIG. 33 depicts an example of a biological reaction that can occur within a sample well, according to some embodiments.

When a labeled nucleotide or nucleotide analog 5-510 is incorporated into a growing strand of complementary nucleic acid, as depicted in FIG. 33, one or more attached fluorophores 5-530 can be repeatedly excited by pulses of optical energy coupled into the sample well 1-108 from the waveguide 1-220. In some embodiments, the fluorophore or fluorophores 5-530 can be attached to one or more nucleotides or nucleotide analogs 5-510 with any suitable linker 5-520. An incorporation event may last for a period of time up to about 100 ms. During this time, pulses of fluorescent emission resulting from excitation of the fluorophore(s) by pulses from the mode-locked laser can be detected with a time-binning photodetector 1-110, for example. In some embodiments, each photodetector 1-110 may be coupled to metal lines 1-240 to read out charge carriers for amplification, signal preprocessing, and/or offloading from integrated device 1-102. According to some embodiments, each pixel can include at least one optical filter 5-430 (e.g., a semiconductor absorber) that passes fluorescent emission and reduces transmission of radiation from the excitation pulse. Some implementations may not use the optical filter 5-430. By attaching fluorophores with different emission characteristics (e.g., fluorescent decay rates, intensity, fluorescent wavelength) to the different nucleotides (A, C, G, T), detecting and distinguishing the different emission characteristics while the strand of DNA 5-412 incorporates a nucleic acid and enables determination of the genetic sequence of the growing strand of DNA.

Figure 34:
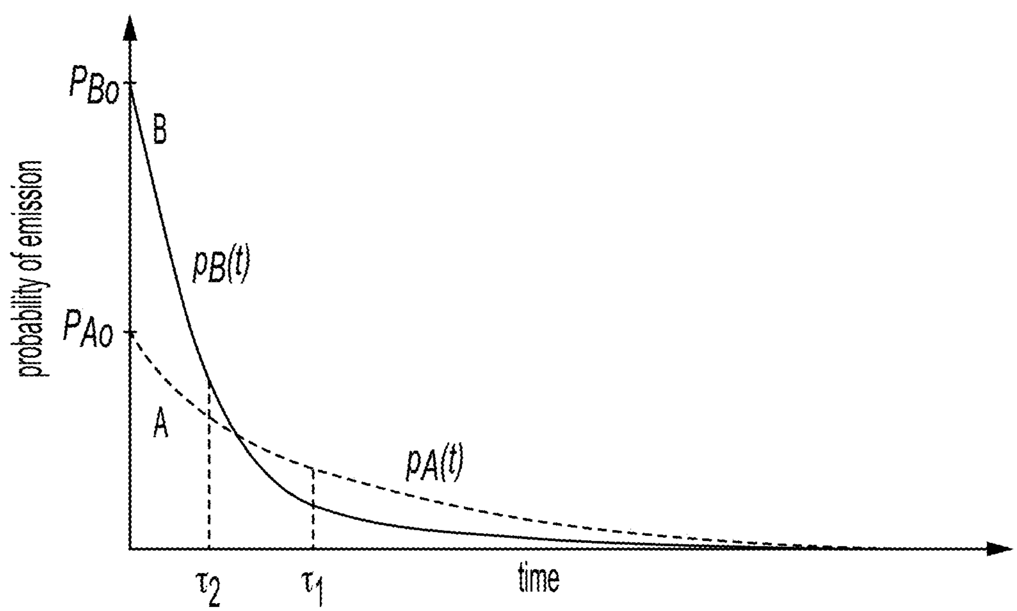
FIG. 34 depicts emission probability curves for two different fluorophores having different decay characteristics according to some embodiments.

According to some embodiments, an advanced analytic instrument 5-100 that is configured to analyze samples based on fluorescent emission characteristics can detect differences in fluorescent lifetimes and/or intensities between different fluorescent molecules, and/or differences between lifetimes and/or intensities of the same fluorescent molecules in different environments. By way of explanation, FIG. 34 plots two different fluorescent emission probability curves (A and B), which can be representative of fluorescent emission from two different fluorescent molecules, for example. With reference to curve A (dashed line), after being excited by a short or ultrashort optical pulse, a probability $p_A(t)$ of a fluorescent emission from a first molecule may decay with time, as depicted. In some cases, the decrease in the probability of a photon being emitted over time can be represented by an exponential decay function $p_A(t)=P_{Ao}*e^{(-t/\tau)}{}_1$, where $P_{Ao}$ is an initial emission probability and $\tau_1$ is a temporal parameter associated with the first fluorescent molecule that characterizes the emission decay probability. $\tau_1$ may be referred to as the "fluorescence lifetime," "emission lifetime," or "lifetime" of the first fluorescent molecule. In some cases, the value of $\tau_1$ can be altered by a local environment of the fluorescent molecule. Other fluorescent molecules can have different emission characteristics than that shown in curve A. For example, another fluorescent molecule can have a decay profile that differs from a single exponential decay, and its lifetime can be characterized by a half-life value or some other metric.

A second fluorescent molecule may have a decay profile $p_B(t)$ that is exponential, but has a measurably different lifetime $\tau_2$, as depicted for curve B in FIG. 34. The initial emission probability for curve B is shown in FIG. 34 as $P_{Bo}$. In the example shown, the lifetime for the second fluorescent molecule of curve B is shorter than the lifetime for curve A, and the probability of emission $p_B(t)$ is higher sooner after excitation of the second molecule than for curve A. Different fluorescent molecules can have lifetimes or half-life values ranging from about 0.1 ns to about 20 ns, in some embodiments.

Differences in fluorescent emission lifetimes can be used to discern between the presence or absence of different fluorescent molecules and/or to discern between different environments or conditions to which a fluorescent molecule is subjected. In some cases, discerning fluorescent molecules based on lifetime (rather than emission wavelength, for example) can simplify aspects of an analytical instrument 5-100. As an example, wavelength-discriminating optics (such as wavelength filters, dedicated detectors for each wavelength, dedicated pulsed optical sources at different wavelengths, and/or diffractive optics) can be reduced in number or eliminated when discerning fluorescent molecules based on lifetime. In some cases, a single pulsed optical source operating at a single characteristic wavelength can be used to excite different fluorescent molecules that emit within a same wavelength region of the optical spectrum but have measurably different lifetimes. An analytic system that uses a single pulsed optical source, rather than multiple sources operating at different wavelengths, to excite and discern different fluorescent molecules emitting in a same wavelength region can be less complex to operate and maintain, more compact, and can be manufactured at lower cost.

Although analytic systems based on fluorescent lifetime analysis can have certain benefits, the amount of information obtained by an analytic system and/or detection accuracy can be increased by allowing for additional detection techniques. For example, some analytic systems 5-160 can additionally be configured to discern one or more properties of a sample based on fluorescent wavelength and/or fluorescent intensity.

Referring again to FIG. 34, according to some embodiments, different fluorescent lifetimes can be distinguished with a photodetector that is configured to time-bin fluorescent emission events following excitation of a fluorescent molecule. The time binning can occur during a single charge-accumulation cycle for the photodetector. A charge-accumulation cycle is an interval between read-out events during which photo-generated carriers are accumulated in bins of the time-binning photodetector. The concept of determining fluorescent lifetime by time-binning of emission events is introduced graphically in FIG. 35. At time $t_e$ just prior to $t_1$, a fluorescent molecule or ensemble of fluorescent molecules of a same type (e.g., the type corresponding to curve B of FIG. 34) is (are) excited by a short or ultrashort optical pulse. For a large ensemble of molecules, the intensity of emission can have a time profile similar to curve B, as depicted in FIG. 34.

Figure 35:
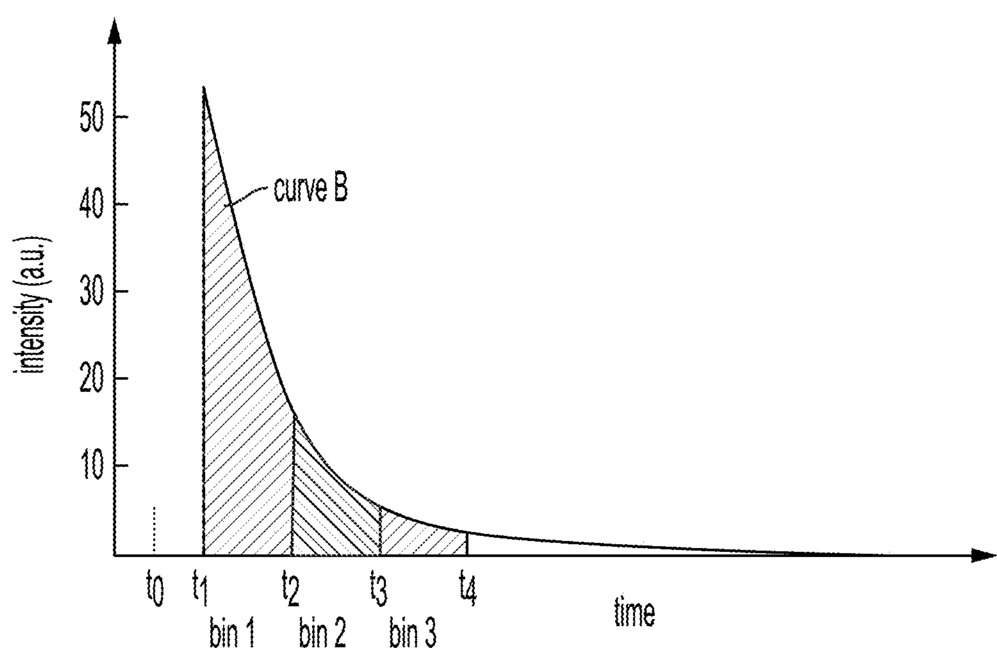
FIG. 35 depicts time-binning detection of fluorescent emission, according to some embodiments.

For a single molecule or a small number of molecules, however, the emission of fluorescent photons occurs according to the statistics of curve B in FIG. 35, for this example. A time-binning photodetector 1-110 can accumulate carriers generated from emission events into discrete time bins (e.g., charge storage regions). Three bins are indicated in FIG. 35, though fewer bins or more bins may be used in embodiments. The bins are temporally resolved with respect to the excitation time $t_e$ of the fluorescent molecule(s). For example, a first bin can accumulate carriers produced during an interval between times $t_1$ and $t_2$, occurring after the excitation event at time $t_e$. A second bin can accumulate carriers produced during an interval between times $t_2$ and $t_3$, and a third bin can accumulate carriers produced during an interval between times $t_3$ and $t_4$. When a large number of emission events are summed, carriers accumulated in the time bins can approximate the decaying intensity curve shown in FIG. 35, and the binned signals can be used to distinguish between different fluorescent molecules or different environments in which a fluorescent molecule is located.

Figure 36:
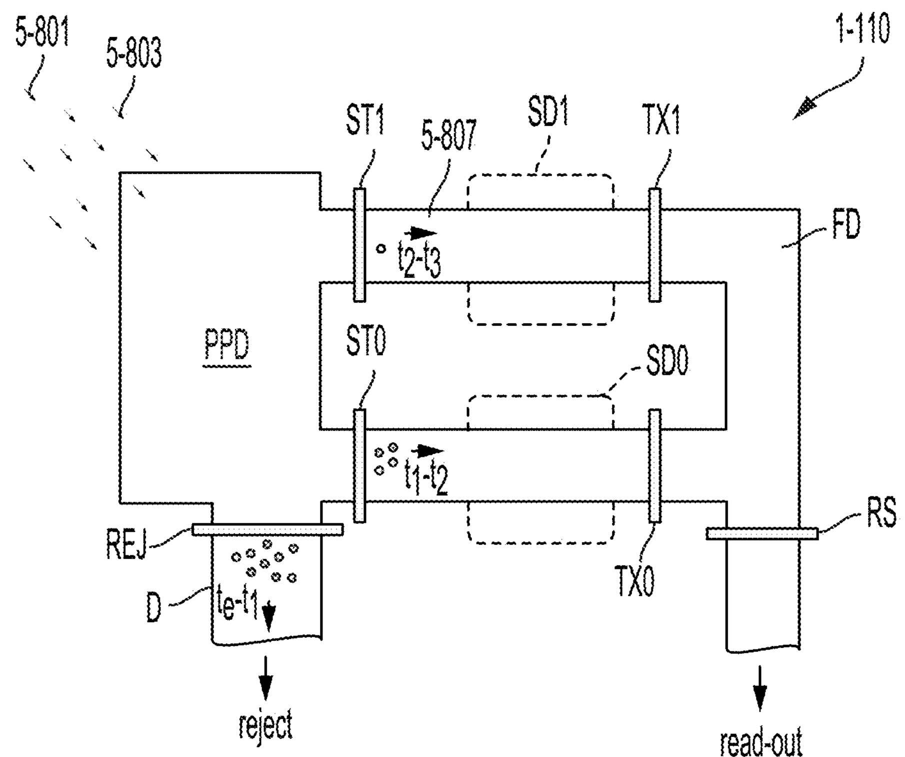
FIG. 36 depicts a time-binning photodetector, according to some embodiments.

For explanation purposes, a non-limiting embodiment of a time-binning photodetector 1-110 is depicted in FIG. 36. A single time-binning photodetector 1-110 can comprise a photodetection region PPD, a drain region D, and a plurality of charge storage regions SD0 and SD1 formed on a semiconductor substrate. Charge transfer channels 5-807 can connect between the photodetection region PPD and charge storage regions SD0 and SD1. In the illustrated example, two charge storage regions SD0 and SD1 are shown, but there may be more or fewer. There can be a readout region FD connected to the charge storage regions SD0 and SD1. The photodetection region PPD, drain region D, charge storage regions SD0, SD1, and readout region FD can be formed by doping the semiconductor locally and/or forming adjacent insulating regions to provide photodetection capability, confinement, and transport of carriers. A time-binning photodetector 1-110 can also include a plurality of transfer gates REJ, ST0, ST1, TX1, TX0, and RS formed on the substrate that are configured to generate electric fields in the device for transporting charge carriers through the device. Examples of suitable photodetector structures are described herein.

In operation, a portion of an excitation pulse 5-122 from a pulsed optical source 5-106 (e.g., a mode-locked laser) is delivered to a sample well 1-108 over the time-binning photodetector 1-110. Initially, some excitation radiation photons 5-801 may arrive at the photodetection region PPD and produce charge carriers (shown as light-shaded circles). There can also be some fluorescent emission photons 5-803 that arrive with the excitation radiation photons 5-801 and produce corresponding charge carriers (shown as dark-shaded circles). Initially, the number of charge carriers produced by the excitation radiation can be too large compared to the number of charge carriers produced by the fluorescent emission. The initial carriers produced during a time interval $t_e$-$t_1$ can be rejected by gating them into drain region D with transfer gate REJ, for example. Multiple drain regions and/or drain gates may be used, such as described herein.

At a later times, mostly fluorescent emission photons 5-803 arrive at photodetection region PPD and produce charge carriers (indicated a dark-shaded circles) that provide useful and detectable signal that is representative of fluorescent emission from the sample well 1-108. According to some detection methods, transfer gate ST0 can be gated at a later time to direct carriers produced at a later time (e.g., during a second time interval $t_1$-$t_2$) to charge storage region SD0. Subsequently, transfer gate ST1 can be gated at a later time (e.g., during a third time interval $t_2$-$t_3$) to direct charge carriers to charge storage region SD1. Charge accumulation can continue in this manner after excitation pulses for a large number of excitation pulses to accumulate an appreciable number of charge carriers and signal level in each charge storage region SD0, SD1. At a later time, the signal can be read out from the charge storage regions SD0, SD1. In some implementations, the time intervals corresponding to each storage region are at the sub-nanosecond time scale, though longer time scales can be used in some embodiments (e.g., in embodiments where fluorophores have longer decay times).

The process of generating and time-binning carriers after an excitation event (e.g., excitation pulse from a pulsed optical source) can occur once after a single excitation pulse or be repeated multiple times after multiple excitation pulses during a single charge-accumulation cycle for the time-binning photodetector 1-110. After charge accumulation is complete, charge carriers can be read out of the storage regions via the readout region D. For example, an appropriate biasing sequence can be applied to electrodes TX0, TX1 and at least to transfer gate RS to remove carriers from the charge storage regions SD0, SD1. The charge accumulation and readout processes can occur in a massively parallel operation on integrated device 1-102 resulting in frames of data.

Although the described example in connection with FIG. 36 includes multiple charge storage regions SD0, SD1, in some cases a single charge storage region may be used instead. In such a case, a single charge storage region can be operated in a variable time-gated manner to look at different time intervals after different excitation events. For example, after pulses in a first series of excitation pulses, transfer gates for the charge storage region can be gated to collect carriers generated during a first time interval (e.g., during the second time interval $t_1$-$t_2$), and the accumulated signal can be read out after a first predetermined number of pulses. After pulses in a subsequent series of excitation pulses at the same sample well 1-108, the same transfer gates for the charge storage region can be gated to collect carriers generated during a different interval (e.g., during the third time interval $t_2$-$t_3$), and the accumulated signal can be read out after a second predetermined number of pulses. Charge carriers could be collected during later time intervals in a similar manner if needed. In this manner, signal levels corresponding to fluorescent emission during different time periods after arrival of an excitation pulse at a sample well 1-108 can be produced using a single charge storage region.

In some embodiments, carriers produced during the second and third time intervals may be collected and stored using sequentially-coupled charge storage regions. For example, charge carriers produced during the time interval $t_1$-$t_2$ may be collected in a first charge storage region over the course of one or more excitation pulses. After the collection period is complete, the collected charge carriers may be transferred to a second charge storage region. Then, over the course of one or more subsequent excitation pulses, charge carriers produced during the time interval $t_2$-$t_3$ may be collected in the first charge storage region. The charge carriers collected during time interval $t_1$-$t_2$ may be read out from the second charge storage region to readout region FD while the charge carriers produced during the time interval $t_2$-$t_3$ are being collected. Alternatively or additionally, the charge carriers produced during the time interval $t_1$-$t_2$ can be transferred to a third charge storage region, and then the charge carriers produced during time interval $t_2$-$t_3$ can be transferred to the second charge storage region. In this case, the charge carriers produced during time intervals $t_1$-$t_2$ and $t_2$-$t_3$ could be read out via the third charge storage region one after another without resetting the voltage of readout region FD in between.

Figure 37A:
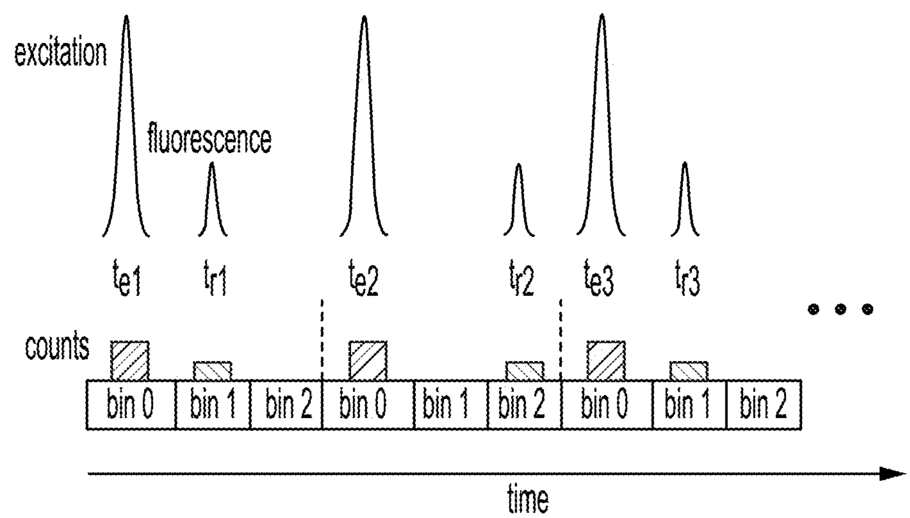
FIG. 37A depicts pulsed excitation and time-binned detection of fluorescent emission from a sample, according to some embodiments.
Figure 37B:
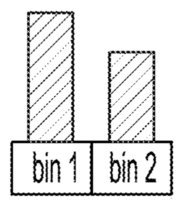
FIG. 37B depicts a histogram of accumulated fluorescent photon counts in various time bins after repeated pulsed excitation of a sample, according to some embodiments.

Regardless of how charge accumulation is carried out for different time intervals after excitation, signals that are read out can provide a histogram of bins that are representative of the fluorescent emission decay characteristics, for example. An example process is illustrated in FIG. 37A and FIG. 37B, for which two charge-storage regions are used to acquire fluorescent emission from the sample wells. The histogram's bins can indicate a number of photons detected during each time interval after excitation of the fluorophore(s) in a sample well 1-108. In some embodiments, signals for the bins will be accumulated following a large number of excitation pulses, as depicted in FIG. 37A. The excitation pulses can occur at times $t_{e1}$, $t_{e2}$, $t_{e3}$, (e.g., up to $t_{eN}$, not shown), which are separated by the pulse interval time T. In some cases, there can be between 105 and 107 excitation pulses 5-122 (or portions thereof) applied to a sample well during an accumulation of signals in the charge storage regions for a single event being observed in the sample well (e.g., a single nucleotide incorporation event in DNA analysis). In some embodiments, one bin (bin 0) can be configured to detect an amplitude of excitation energy delivered with each optical pulse, and may be used as a reference signal (e.g., to normalize data). In other cases, the excitation pulse amplitude may be stable, determined one or more times during signal acquisition, and not determined after each excitation pulse so that there is no bins) signal acquisition after each excitation pulse. In such cases, charge carriers produced by an excitation pulse can be rejected and dumped from the photodetection region PPD as described above in connection with FIG. 36.

In some implementations, only a single photon may be emitted from a fluorophore following an excitation event, as depicted in FIG. 37A. After a first excitation event at time $t_{e1}$, the emitted photon at time $t_{f1}$ may occur within a first time interval (e.g., between times $t_1$ and $t_2$), so that the resulting electron signal is accumulated in the first electron-storage region (contributes to bin 1). In a subsequent excitation event at time $t_{e2}$, the emitted photon at time $t_{f2}$ may occur within a second time interval (e.g., between times $t_2$ and $t_3$), so that the resulting electron signal contributes to bin 2. After a next excitation event at time tea, a photon may emit at a time $t_{f3}$ occurring within the first time interval.

In some implementations, there may not be a fluorescent photon emitted and/or detected after each excitation pulse received at a sample well 1-108. In some cases, there can be as few as one fluorescent photon that is detected at a sample well for every 10,000 excitation pulses delivered to the sample well. One advantage of implementing a mode-locked laser 5-113 as the pulsed excitation source 5-106 is that a mode-locked laser can produce short optical pulses having high intensity and quick turn-off times at high pulse-repetition rates (e.g., between 50 MHz and 250 MHz). With such high pulse-repetition rates, the number of excitation pulses within a 10 millisecond charge-accumulation interval can be 50,000 to 250,000, so that detectable signal can be accumulated.

After a large number of excitation events and carrier accumulations, the carrier-storage regions of the time-binning photodetector 1-110 can be read out to provide a multi-valued signal (e.g., a histogram of two or more values, an N-dimensional vector, etc.) for a sample well. The signal values for each bin can depend upon the decay rate of the fluorophore. For example and referring again to FIG. 35, a fluorophore having a decay curve B will have a higher ratio of signal in bin 1 to bin 2 than a fluorophore having a decay curve A. The values from the bins can be analyzed and compared against calibration values, and/or each other, to determine the particular fluorophore present. For a sequencing application, identifying the fluorophore can determine the nucleotide or nucleotide analog that is being incorporated into a growing strand of DNA, for example. For other applications, identifying the fluorophore can determine an identity of a molecule or specimen of interest, which may be linked to the fluorophore.

Figure 38A:
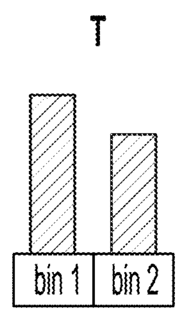
FIG. 38A depicts a histogram corresponding to a T nucleotide or nucleotide analog, according to some embodiments.
Figure 38B:
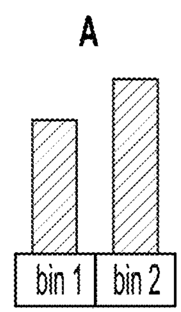
FIG. 38B depicts a histogram corresponding to an A nucleotide or nucleotide analog, according to some embodiments.
Figure 38C:
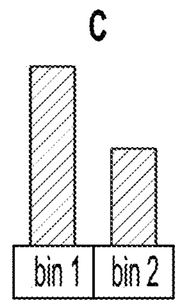
FIG. 38C depicts a histogram corresponding to a C nucleotide or nucleotide analog, according to some embodiments.
Figure 38D:
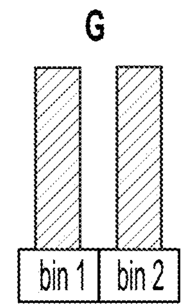
FIG. 38D depicts a histogram corresponding to a G nucleotide or nucleotide analog, according to some embodiments.

To further aid in understanding the signal analysis, the accumulated, multi-bin values can be plotted as a histogram, as depicted in FIG. 37B for example, or can be recorded as a vector or location in N-dimensional space. Calibration runs can be performed separately to acquire calibration values for the multi-valued signals (e.g., calibration histograms) for four different fluorophores linked to the four nucleotides or nucleotide analogs. As an example, the calibration histograms may appear as depicted in FIG. 38A (fluorescent label associated with the T nucleotide), FIG. 38B (fluorescent label associated with the A nucleotide), FIG. 38C (fluorescent label associated with the C nucleotide), and FIG. 38D (fluorescent label associated with the G nucleotide). A comparison of the measured multi-valued signal (corresponding to the histogram of FIG. 37B) to the calibration multi-valued signals can determine the identity "T" (FIG. 38A) of the nucleotide or nucleotide analog being incorporated into the growing strand of DNA.

In some implementations, fluorescent intensity can be used additionally or alternatively to distinguish between different fluorophores. For example, some fluorophores may emit at significantly different intensities or have a significant difference in their probabilities of excitation (e.g., at least a difference of about 35%) even though their decay rates may be similar By referencing binned signals to measured excitation energy and/or other acquired signals, it can be possible to distinguish different fluorophores based on intensity levels.

In some embodiments, different numbers of fluorophores of the same type can be linked to different nucleotides or nucleotide analogs, so that the nucleotides can be identified based on fluorophore intensity. For example, two fluorophores can be linked to a first nucleotide (e.g., "C") or nucleotide analog and four or more fluorophores can be linked to a second nucleotide (e.g., "T") or nucleotide analog. Because of the different numbers of fluorophores, there may be different excitation and fluorophore emission probabilities associated with the different nucleotides. For example, there may be more emission events for the "T" nucleotide or nucleotide analog during a signal accumulation interval, so that the apparent intensity of the bins is significantly higher than for the "C" nucleotide or nucleotide analog.

Distinguishing nucleotides or any other biological or chemical specimens based on fluorophore decay rates and/or fluorophore intensities enables a simplification of the optical excitation and detection systems in an analytical instrument 5-100. For example, optical excitation can be performed with a single-wavelength source (e.g., a source producing one characteristic wavelength rather than multiple sources or a source operating at multiple different characteristic wavelengths). Additionally, wavelength-discriminating optics and filters may not be needed in the detection system to distinguish between fluorophores of different wavelengths. Also, a single photodetector can be used for each sample well to detect emission from different fluorophores.

The phrase "characteristic wavelength" or "wavelength" is used to refer to a central or predominant wavelength within a limited bandwidth of radiation (e.g., a central or peak wavelength within a 20 nm bandwidth output by a pulsed optical source). In some cases, "characteristic wavelength" or "wavelength" may be used to refer to a peak wavelength within a total bandwidth of radiation output by a source.

Fluorophores having emission wavelengths in a range between about 560 nm and about 900 nm can provide adequate amounts of fluorescence to be detected by a time-binning photodetector (which can be fabricated on a silicon wafer using CMOS processes). These fluorophores can be linked to biological molecules of interest, such as nucleotides or nucleotide analogs for genetic sequencing applications. Fluorescent emission in this wavelength range can be detected with higher responsivity in a silicon-based photodetector than fluorescence at longer wavelengths. Additionally, fluorophores and associated linkers in this wavelength range may not interfere with incorporation of the nucleotides or nucleotide analogs into growing strands of DNA. In some implementations, fluorophores having emission wavelengths in a range between about 560 nm and about 660 nm can be optically excited with a single-wavelength source. An example fluorophore in this range is Alexa Fluor 647, available from Thermo Fisher Scientific Inc. of Waltham, Massachusetts. Excitation energy at shorter wavelengths (e.g., between about 500 nm and about 650 nm) may be used to excite fluorophores that emit at wavelengths between about 560 nm and about 900 nm. In some embodiments, the time-binning photodetectors can efficiently detect longer-wavelength emission from the sample wells, e.g., by incorporating other materials, such as Ge, into the photodetectors' active regions.

X. Protein Sequencing Applications

Some aspects of the present disclosure may be useful for protein sequencing. For example, some aspects of the present disclosure are useful for determining amino acid sequence information from polypeptides (e.g., for sequencing one or more polypeptides). In some embodiments, amino acid sequence information can be determined for single polypeptide molecules. In some embodiments, one or more amino acids of a polypeptide are labeled (e.g., directly or indirectly) and the relative positions of the labeled amino acids in the polypeptide are determined. In some embodiments, the relative positions of amino acids in a protein are determined using a series of amino acid labeling and cleavage steps.

In some embodiments, the identity of a terminal amino acid (e.g., an N-terminal or a C-terminal amino acid) is assessed, after which the terminal amino acid is removed and the identity of the next amino acid at the terminus is assessed, and this process is repeated until a plurality of successive amino acids in the polypeptide are assessed. In some embodiments, assessing the identity of an amino acid comprises determining the type of amino acid that is present. In some embodiments, determining the type of amino acid comprises determining the actual amino acid identity, for example by determining which of the naturally-occurring 20 amino acids is the terminal amino acid is (e.g., using a recognition molecule that is specific for an individual terminal amino acid). However, in some embodiments assessing the identity of a terminal amino acid type can comprise determining a subset of potential amino acids that can be present at the terminus of the polypeptide. In some embodiments, this can be accomplished by determining that an amino acid is not one or more specific amino acids (and therefore could be any of the other amino acids). In some embodiments, this can be accomplished by determining which of a specified subset of amino acids (e.g., based on size, charge, hydrophobicity, binding properties) could be at the terminus of the polypeptide (e.g., using a recognition molecule that binds to a specified subset of two or more terminal amino acids).

Amino acids of a polypeptide can be indirectly labeled, for example, using amino acid recognition molecules that selectively bind one or more types of amino acids on the polypeptide. Amino acids of a polypeptide can be directly labeled, for example, by selectively modifying one or more types of amino acid side chains on the polypeptide with uniquely identifiable labels. Methods of selective labeling of amino acid side chains and details relating to the preparation and analysis of labeled polypeptides are known in the art (see, e.g., Swaminathan, et al. PLoS Comput Biol. 2015, 11(2): e1004080). Accordingly, in some embodiments, the one or more types of amino acids are identified by detecting binding of one or more amino acid recognition molecules that selectively bind the one or more types of amino acids. In some embodiments, the one or more types of amino acids are identified by detecting labeled polypeptide.

In some embodiments, the relative position of labeled amino acids in a protein can be determined without removing amino acids from the protein but by translocating a labeled protein through a pore (e.g., a protein channel) and detecting a signal (e.g., a Förster resonance energy transfer (FRET) signal) from the labeled amino acid(s) during translocation through the pore in order to determine the relative position of the labeled amino acids in the protein molecule.

As used herein, sequencing a polypeptide refers to determining sequence information for a polypeptide. In some embodiments, this can involve determining the identity of each sequential amino acid for a portion (or all) of the polypeptide. However, in some embodiments, this can involve assessing the identity of a subset of amino acids within the polypeptide (e.g., and determining the relative position of one or more amino acid types without determining the identity of each amino acid in the polypeptide). However, in some embodiments amino acid content information can be obtained from a polypeptide without directly determining the relative position of different types of amino acids in the polypeptide. The amino acid content alone may be used to infer the identity of the polypeptide that is present (e.g., by comparing the amino acid content to a database of polypeptide information and determining which polypeptide(s) have the same amino acid content).

In some embodiments, sequence information for a plurality of polypeptide products obtained from a longer polypeptide or protein (e.g., via enzymatic and/or chemical cleavage) can be analyzed to reconstruct or infer the sequence of the longer polypeptide or protein. Accordingly, some embodiments provide compositions and methods for sequencing a polypeptide by sequencing a plurality of fragments of the polypeptide. In some embodiments, sequencing a polypeptide comprises combining sequence information for a plurality of polypeptide fragments to identify and/or determine a sequence for the polypeptide. In some embodiments, combining sequence information may be performed by computer hardware and software. The methods described herein may allow for a set of related polypeptides, such as an entire proteome of an organism, to be sequenced. In some embodiments, a plurality of single molecule sequencing reactions may be performed in parallel (e.g., on a single integrated device). For example, in some embodiments, a plurality of single molecule sequencing reactions are each performed in separate sample wells on a single integrated device.

In some embodiments, methods provided herein may be used for the sequencing and identification of an individual protein in a sample comprising a complex mixture of proteins. Some embodiments provide methods of uniquely identifying an individual protein in a complex mixture of proteins. In some embodiments, an individual protein is detected in a mixed sample by determining a partial amino acid sequence of the protein. In some embodiments, the partial amino acid sequence of the protein is within a contiguous stretch of approximately 5 to 50 amino acids.

Without wishing to be bound by any particular theory, it is believed that most human proteins can be identified using incomplete sequence information with reference to proteomic databases. For example, simple modeling of the human proteome has shown that approximately 98% of proteins can be uniquely identified by detecting just four types of amino acids within a stretch of 6 to 40 amino acids (see, e.g., Swaminathan, et al. PLoS Comput Biol. 2015, 11(2): e1004080; and Yao, et al. Phys. Biol. 2015, 12(5): 055003). Therefore, a complex mixture of proteins can be degraded (e.g., chemically degraded, enzymatically degraded) into short polypeptide fragments of approximately 6 to 40 amino acids, and sequencing of this polypeptide library would reveal the identity and abundance of each of the proteins present in the original complex mixture. Compositions and methods for selective amino acid labeling and identifying polypeptides by determining partial sequence information are described in in detail in U.S. patent application Ser. No. 15/510,962, filed Sep. 15, 2015, titled "SINGLE MOLECULE PEPTIDE SEQUENCING," which is incorporated by reference in its entirety.

Sequencing in accordance with some embodiments can involve immobilizing a polypeptide on a surface of a substrate or solid support, such as an integrated device. In some embodiments, a polypeptide can be immobilized on a surface of a sample well (e.g., on a bottom surface of a sample well) on a substrate. In some embodiments, a first terminus of a polypeptide is immobilized to a surface, and the other terminus is subjected to a sequencing reaction as described herein. For example, in some embodiments, a polypeptide is immobilized to a surface through a C-terminal end, and terminal amino acid recognition and degradation proceeds from an N-terminal end of the polypeptide toward the C-terminal end. In some embodiments, the N-terminal amino acid of the polypeptide is immobilized (e.g., attached to the surface). In some embodiments, the C-terminal amino acid of the polypeptide is immobilized (e.g., attached to the surface). In some embodiments, one or more non-terminal amino acids are immobilized (e.g., attached to the surface). The immobilized amino acid(s) can be attached using any suitable covalent or non-covalent linkage, for example as described herein. In some embodiments, a plurality of polypeptides are attached to a plurality of sample wells (e.g., with one polypeptide attached to a surface, for example a bottom surface, of each sample well), for example in an array of sample wells on a substrate.

Figure 39:
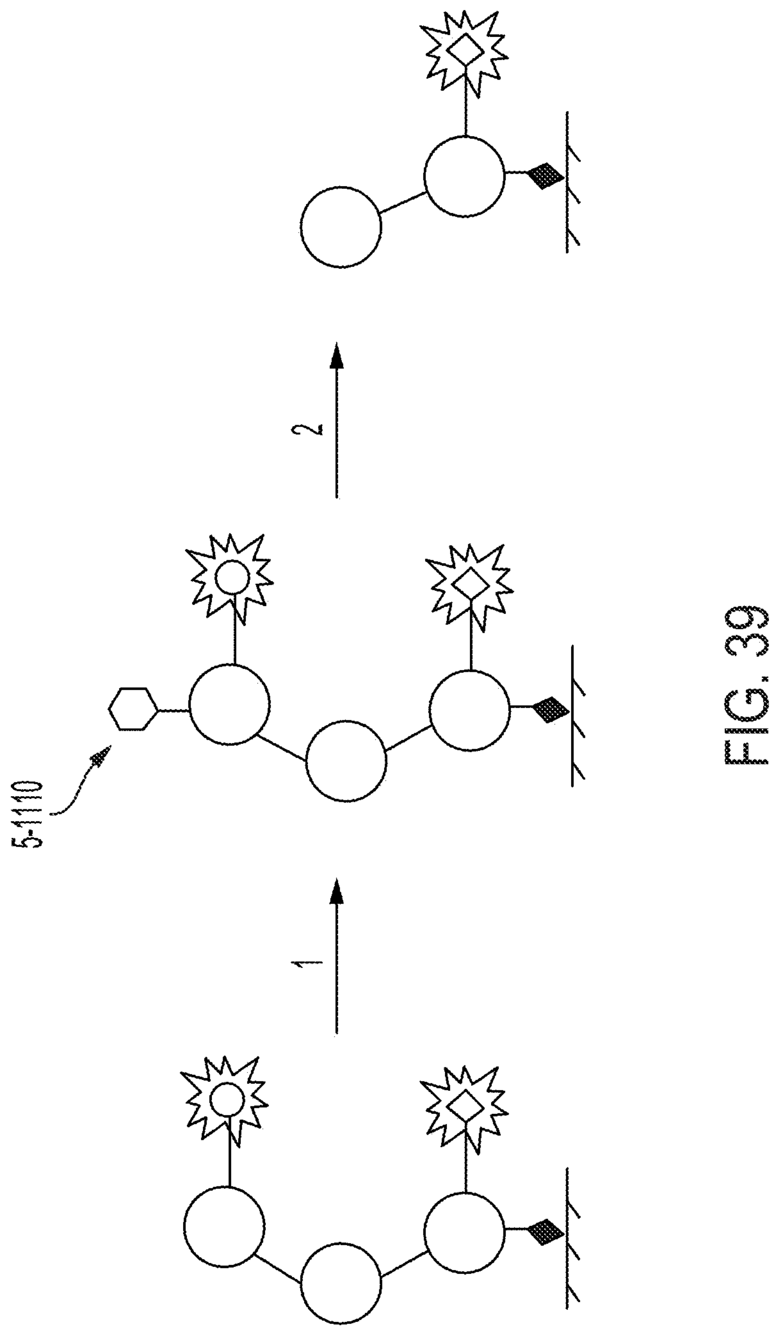
FIG. 39 is a flow diagram illustrating a method of sequencing a labeled polypeptide by Edman degradation according to some embodiments.

Some aspects of the present disclosure provide a method of sequencing a polypeptide by detecting luminescence of a labeled polypeptide which is subjected to repeated cycles of terminal amino acid modification and cleavage. For example, FIG. 39 shows a method of sequencing a labeled polypeptide by Edman degradation in accordance with some embodiments. In some embodiments, the method generally proceeds as described herein for other methods of sequencing by Edman degradation. For example, in some embodiments, steps (1) and (2) shown in FIG. 39 may be performed as described elsewhere herein for terminal amino acid modification and terminal amino acid cleavage, respectively, in an Edman degradation reaction.

As shown in the example depicted in FIG. 39, in some embodiments, the method comprises a step of (1) modifying the terminal amino acid of a labeled polypeptide. As described elsewhere herein, in some embodiments, modifying comprises contacting the terminal amino acid with an isothiocyanate (e.g., PITC) to form an isothiocyanate-modified terminal amino acid. In some embodiments, an isothiocyanate modification 5-1110 converts the terminal amino acid to a form that is more susceptible to removal by a cleaving reagent (e.g., a chemical or enzymatic cleaving reagent, as described herein). Accordingly, in some embodiments, the method comprises a step of (2) removing the modified terminal amino acid using chemical or enzymatic means detailed elsewhere herein for Edman degradation.

In some embodiments, the method comprises repeating steps (1) through (2) for a plurality of cycles, during which luminescence of the labeled polypeptide is detected, and cleavage events corresponding to the removal of a labeled amino acid from the terminus may be detected as a decrease in detected signal. In some embodiments, no change in signal following step (2) as shown in FIG. 39 identifies an amino acid of unknown type. Accordingly, in some embodiments, partial sequence information may be determined by evaluating a signal detected following step (2) during each sequential round by assigning an amino acid type by a determined identity based on a change in detected signal or identifying an amino acid type as unknown based on no change in a detected signal.

Figure 40:
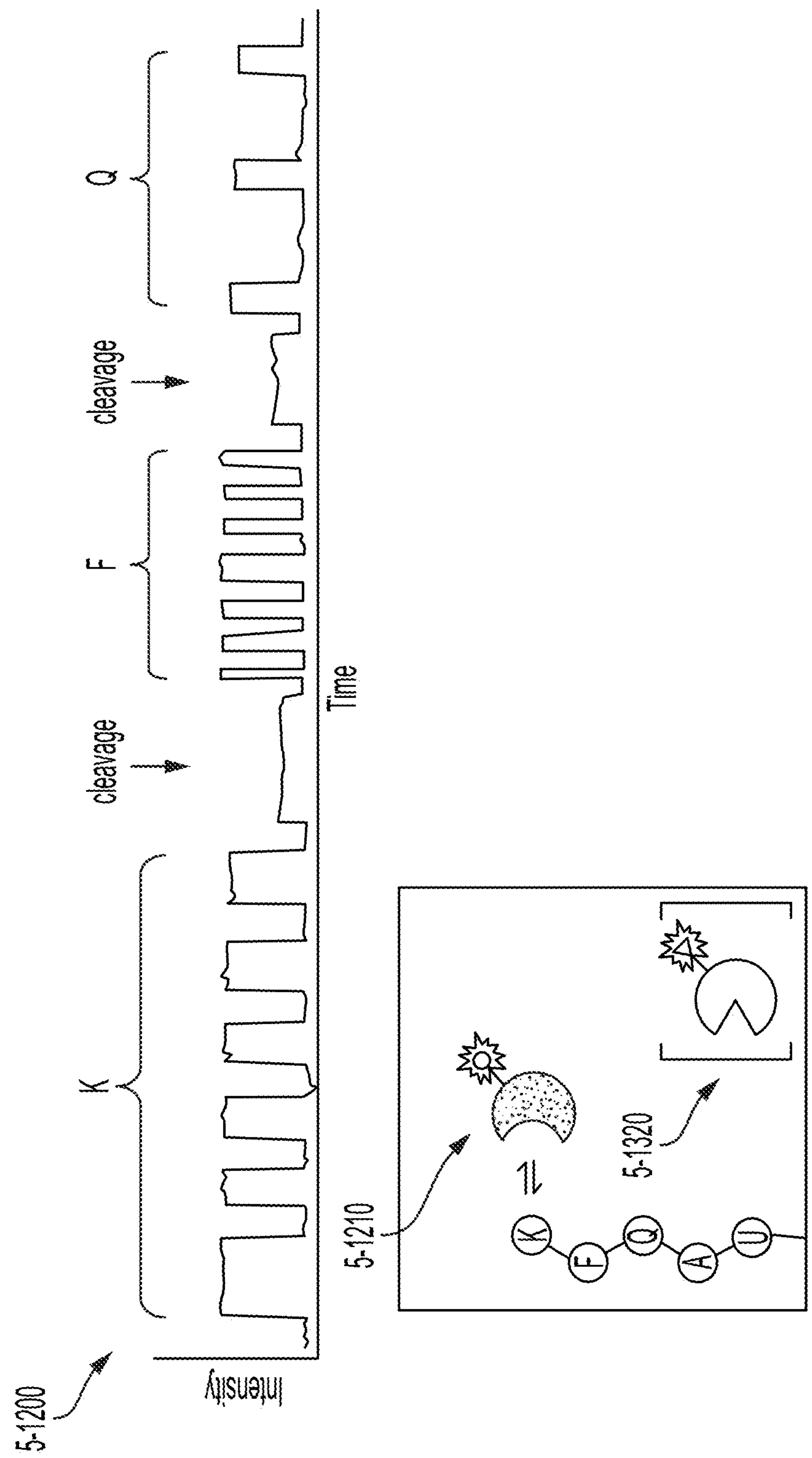
FIG. 40 includes a flow diagram illustrating a method of sequencing in which discrete binding events give rise to signal pulses of a signal output, and a graph illustrating the signal output according to some embodiments.

Some aspects of the present disclosure provide methods of polypeptide sequencing in real-time by evaluating binding interactions of terminal amino acids with labeled amino acid recognition molecules and a labeled cleaving reagent (e.g., a labeled exopeptidase). FIG. 40 shows an example of a method of sequencing in which discrete binding events give rise to signal pulses of a signal output 5-1200. The inset panel of FIG. 40 illustrates a general scheme of real-time sequencing by this approach. As shown, a labeled amino acid recognition molecule 5-1210 selectively binds to and dissociates from a terminal amino acid (shown here as lysine), which gives rise to a series of pulses in signal output 5-1200 which may be used to identify the terminal amino acid. In some embodiments, the series of pulses provide a pulsing pattern which may be diagnostic of the identity of the corresponding terminal amino acid.

Without wishing to be bound by theory, labeled amino acid recognition molecule 5-1210 selectively binds according to a binding affinity (KD) defined by an association rate of binding (kon) and a dissociation rate of binding (koff). The rate constants koff and kon are the critical determinants of pulse duration (e.g., the time corresponding to a detectable binding event) and interpulse duration (e.g., the time between detectable binding events), respectively. In some embodiments, these rates can be engineered to achieve pulse durations and pulse rates that give the best sequencing accuracy.

As shown in the inset panel, a sequencing reaction mixture further comprises a labeled cleaving reagent 5-1220 comprising a detectable label that is different than that of labeled amino acid recognition molecule 5-1210. In some embodiments, labeled cleaving reagent 5-1220 is present in the mixture at a concentration that is less than that of labeled amino acid recognition molecule 5-1210. In some embodiments, labeled cleaving reagent 5-1220 displays broad specificity such that it cleaves most or all types of terminal amino acids.

As illustrated by the progress of signal output 5-1200, in some embodiments, terminal amino acid cleavage by labeled cleaving reagent 5-1220 gives rise to a uniquely identifiable signal pulse, and these events occur with lower frequency than the binding pulses of a labeled amino acid recognition molecule 5-1210. In this way, amino acids of a polypeptide can be counted and/or identified in a real-time sequencing process. As further illustrated in signal output 5-1200, in some embodiments, a labeled amino acid recognition molecule 5-1210 is engineered to bind more than one type of amino acid with different binding properties corresponding to each type, which produces uniquely identifiable pulsing patterns. In some embodiments, a plurality of labeled amino acid recognition molecules may be used, each with a diagnostic pulsing pattern which may be used to identify a corresponding terminal amino acid.

Having thus described several aspects and embodiments of the technology of the present disclosure, it is to be appreciated that various alterations, modifications, and improvements will readily occur to those of ordinary skill in the art. Such alterations, modifications, and improvements are intended to be within the spirit and scope of the technology described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

In the drawings, as well as in the specification above, directional references (e.g., "top" or "bottom") should not be construed as limiting illustrated embodiments to a particular illumination configuration, as such directional references are intended merely as an aid to the reader viewing the drawings and/or understanding how one view of one embodiment relates to and/or differs from another view of the same or a similar embodiment. For instance, "top" should not necessarily be construed as meaning "front" (e.g., as in front side illumination) and "bottom" should not necessarily be construed as meaning "back" or "rear" (e.g., as in backside illumination).

The terms "substantially," "approximately," and "about" may be used to mean within ±20% of a target value in some embodiments, within ±10% of a target value in some embodiments, within ±5% of a target value in some embodiments, and yet within ±2% of a target value in some embodiments. The terms "substantially," "approximately," and "about" may include the target value.

What is claimed is:

1. An integrated circuit, comprising:

a substrate comprising:

a photodetection region configured to:

receive, in a first direction, at a first face of the photodetection region, incident photons;

generate, in response to receiving the incident photons, charge carriers; and induce an intrinsic electric field having a substantial vector component in each of:

the first direction;

a second direction substantially perpendicular to the first direction; and a third direction substantially perpendicular to each of the first direction and the second direction;

a first charge storage region positioned proximate a second face of the photodetection region that is opposite the first face in the first direction;

a first charge transfer path configured to electrically couple the photodetection region to the first charge storage region;

a second charge storage region positioned proximate the second face of the photodetection region; and a second charge transfer path configured to electrically couple the photodetection region to the second charge storage region, and the second charge transfer path bypassing the first charge storage region.

2. The integrated circuit of claim 1, further comprising:

a first transfer gate, wherein:

the first charge transfer path comprises a first channel configured to, when biased to a conductive state, transfer, from the photodetection region to the first charge storage region, charge carriers; and the first transfer gate is configured to bias the first channel with a first control signal to transfer charge carriers from the photodetection region to the first charge storage region; and a second transfer gate, wherein:

the second charge transfer path comprises a second channel configured to, when biased to a conductive state, transfer, from the photodetection region to the second charge storage region, bypassing the first charge storage region, charge carriers; and the second transfer gate is configured to bias the second channel with a second control signal to transfer charge carriers from the photodetection region to the second charge storage region.

3. The integrated circuit of claim 1, further comprising:

a readout region;

a third charge transfer path configured to electrically couple the first charge storage region to the readout region; and a fourth charge transfer path configured to electrically couple the second charge storage region to the readout region.

4. The integrated circuit of claim 1, further comprising:

a drain region positioned proximate the second face of the photodetection region; and a third charge transfer path configured to electrically couple the photodetection region to the drain region, and the third charge transfer path bypassing the first and second charge storage regions.

5. The integrated circuit of claim 1, wherein the photodetection region comprises:

a first sub-region having a first intrinsic electric potential level; and a second sub-region that at least partially surrounds the first sub-region in the first, second, and third directions, the second sub-region having a second intrinsic electric potential level that is different from the first intrinsic electric potential level.

6. The integrated circuit of claim 5, wherein the photodetection region comprises at least three sub-regions nested at least partially within one another, the at least three sub-regions having dopant concentrations that increase from the first sub-region to an outermost sub-region.

7. A system, comprising:

an integrated circuit, comprising:

a substrate, comprising:

a photodetection region configured to:

receive, at a first side of the integrated circuit, incident photons;

generate, in response to receiving the incident photons, first and second charge carriers; and induce an intrinsic electric field having a substantial vector component in each of:

a first direction;

a second direction substantially perpendicular to the first direction; and a third direction substantially perpendicular to each of the first direction and the second direction;

a first charge storage region configured to receive, from the photodetection region, the first charge carriers; and a second charge storage region configured to receive, from the photodetection region, the second charge carriers; and a control circuit electrically coupled to a second side of the integrated circuit, the control circuit configured to, in response to a single excitation of a sample:

control a first charge carrier transfer from the photodetection region to the first charge storage region; and control a second charge carrier transfer from the photodetection region to the second charge storage region.

8. The system of claim 7, wherein:

the integrated circuit comprises:

a first transfer gate configured to transfer, from the photodetection region to the first charge storage region, the first charge carriers; and a second transfer gate configured to transfer, from the photodetection region to the second charge storage region, the second charge carriers; and the control circuit is configured to, in response to the single excitation of the sample:

control the first transfer gate to transfer the first charge carriers; and control the second transfer gate to transfer the second charge carriers.

9. The system of claim 7, wherein the control circuit is configured to:

control the first charge carrier transfer to occur at a first time following the single excitation of the sample; and control the second charge carrier transfer to occur at a second time following the first time.

10. The system of claim 7, wherein the control circuit is further configured to, in response to a second excitation of the sample:

control a third charge carrier transfer from the photodetection region to the first charge storage region, wherein charge carriers transferred during the first and third charge carrier transfers are aggregated in the first charge storage region; and control a fourth charge carrier transfer from the photodetection region to the second charge storage region, wherein charge carriers transferred during the second and fourth charge carrier transfers are aggregated in the second charge storage region.

11. The system of claim 7, further comprising:

a first charge transfer path configured to electrically couple the photodetection region to the first charge storage region; and a second charge transfer path configured to electrically couple the photodetection region to the second charge storage region, and the second charge transfer path bypassing the first charge storage region.

12. The system of claim 7, wherein the photodetection region comprises:

a first sub-region having a first intrinsic electric potential level; and a second sub-region that at least partially surrounds the first sub-region in the first, second, and third directions, the second sub-region having a second intrinsic electric potential level that is different from the first intrinsic electric potential level.

13. The system of claim 12, wherein the photodetection region comprises at least three sub-regions nested at least partially within one another, the at least three sub-regions having dopant concentrations that increase from the first sub-region to an outermost sub-region.

14. A method, comprising:

receiving, in a photodetection region at a first side of an integrated circuit, in response to a single excitation of a sample, incident photons;

generating, in the photodetection region in response to receiving the incident photons, first and second charge carriers;

inducing, in the photodetection region, an intrinsic electric field having a substantial vector component in each of:

a first direction;

a second direction; and a third direction; and using a control circuit electrically coupled to a second side of the integrated circuit:

controlling, from the photodetection region to a first charge storage region, a first charge carrier transfer of the first charge carriers; and controlling, from the photodetection region to a second charge storage region, a second charge carrier transfer of the second charge carriers, wherein the integrated circuit comprises a substrate comprising the photodetection region, the first charge storage region, and the second charge storage region.

15. The method of claim 14, wherein:

controlling the first charge carrier transfer comprises using a first transfer gate of the integrated circuit; and controlling the second charge carrier transfer comprises using a second transfer gate of the integrated circuit.

16. The method of claim 14, wherein:

the first charge carrier transfer occurs at a first time following the single excitation of the sample; and the second charge carrier transfer occurs at a second time following the first time.

17. The method of claim 14, further comprising, using the control circuit, in response to a second excitation of the sample:

controlling a third charge carrier transfer from the photodetection region to the first charge storage region, wherein charge carriers transferred during the first and third charge carrier transfers are aggregated in the first charge storage region; and controlling a fourth charge carrier transfer from the photodetection region to the second charge storage region, wherein charge carriers transferred during the second and fourth charge carrier transfers are aggregated in the second charge storage region.

18. The method of claim 14, wherein:

controlling the first charge carrier transfer comprises transferring, along a first charge transfer path, from the photodetection region to the first charge storage region, the first charge carriers; and controlling the second charge carrier transfer comprises transferring, along a second charge transfer path that bypasses the first charge storage region, from the photodetection region to the second charge storage region, the second charge carriers.

19. The integrated circuit of claim 1, wherein the intrinsic electric field is configured to direct the charge carriers to a focal volume positioned proximate the second face of the photodetection region and between the first charge transfer path and the second charge transfer path.

20. The system of claim 7, wherein:

the first side of the integrated circuit and the second side of the integrated circuit are separated from one another in, substantially, the first direction; and the intrinsic electric field is configured to direct the first charge carriers and the second charge carriers to a focal volume positioned proximate the second side of the integrated circuit and between the first charge storage region and the second charge storage region.

* * * * *